(12) United States Patent
Yashima et al.

(10) Patent No.: US 8,409,893 B2
(45) Date of Patent: Apr. 2, 2013

(54) SEMICONDUCTOR LIGHT-EMITTING ELEMENT, FABRICATION METHOD THEREOF, CONVEX PART FORMED ON BACKING, AND CONVEX PART FORMATION METHOD FOR BACKING

(75) Inventors: Kiyotaka Yashima, Miyagi (JP); Yoshinari Kiwaki, Miyagi (JP); Kamada Michiru, Miyagi (JP); Sachio Karino, Miyagi (JP); Hironobu Narui, Kanagawa (JP); Nobukata Okano, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/356,202

(22) Filed: Jan. 23, 2012

(65) Prior Publication Data

US 2012/0122257 A1 May 17, 2012

Related U.S. Application Data

(62) Division of application No. 12/461,409, filed on Aug. 11, 2009, now Pat. No. 8,138,002.

(30) Foreign Application Priority Data

Aug. 21, 2008 (JP) .................. P2008-212683
Sep. 19, 2008 (JP) .................. P2008-240629

(51) Int. Cl.
*H01L 21/00* (2006.01)
(52) U.S. Cl. ............... 438/40; 438/39; 438/41; 438/43; 438/745; 438/749; 257/E21.219; 257/E21.001
(58) Field of Classification Search ............. 438/39–44, 438/749–751; 257/E21.001, E21.219
See application file for complete search history.

(56) References Cited

U.S. PATENT DOCUMENTS

| | | |
|---|---|---|
| 5,255,280 A | 10/1993 | Harui et al. |
| 6,284,670 B1 | 9/2001 | Abe et al. |
| 7,560,733 B2 | 7/2009 | Jeong |
| 2004/0121500 A1 | 6/2004 | Ketelsen et al. |
| 2007/0020954 A1 | 1/2007 | Nomaguchi et al. |
| 2007/0099324 A1 | 5/2007 | Iino et al. |

(Continued)

FOREIGN PATENT DOCUMENTS

| | | |
|---|---|---|
| JP | 2990837 | 10/1999 |
| JP | 2000-021785 A | 1/2000 |

(Continued)

OTHER PUBLICATIONS

Japanese Office Action issued Jul. 13, 2010 for corresponding Japanese Application No. 2008-240629.

(Continued)

*Primary Examiner* — Angel Roman
(74) *Attorney, Agent, or Firm* — Rader, Fishman & Grauer PLLC

(57) ABSTRACT

A convex part formation method of forming a convex part in parallel with a <110> direction of a backing on the backing having a {100} face as the top surface thereof, includes: (a) forming a mask layer in parallel with the <110> direction on the backing; (b) etch the backing so as to form a convex-part upper layer whose sectional shape on a cutting plane corresponding to a {110} face is an isosceles trapezoid, the base of which is longer than the upper side thereof, and the side surface of which has an inclination of $\theta_U$; and (c) further etching the backing so as to form a convex-part lower layer whose sectional shape on the cutting plane corresponding to the {110} face is an isosceles trapezoid, the base of which is longer than the upper side thereof, and the side surface of which has an inclination of $\theta_D$ (where $\theta_D \neq \theta_U$).

15 Claims, 24 Drawing Sheets

U.S. PATENT DOCUMENTS

2008/0303042 A1 12/2008 Minato et al.
2009/0147814 A1 6/2009 Hosoi et al.

FOREIGN PATENT DOCUMENTS

| JP | 2001-332530 | | 11/2001 |
| JP | 2002-314200 | A | 10/2002 |
| JP | 3399018 | | 2/2003 |
| JP | 2007-088503 | A | 4/2007 |

OTHER PUBLICATIONS

Japanese Office Action issued Oct. 9, 2012 for corresponding Japanese Application No. 2008-212683.

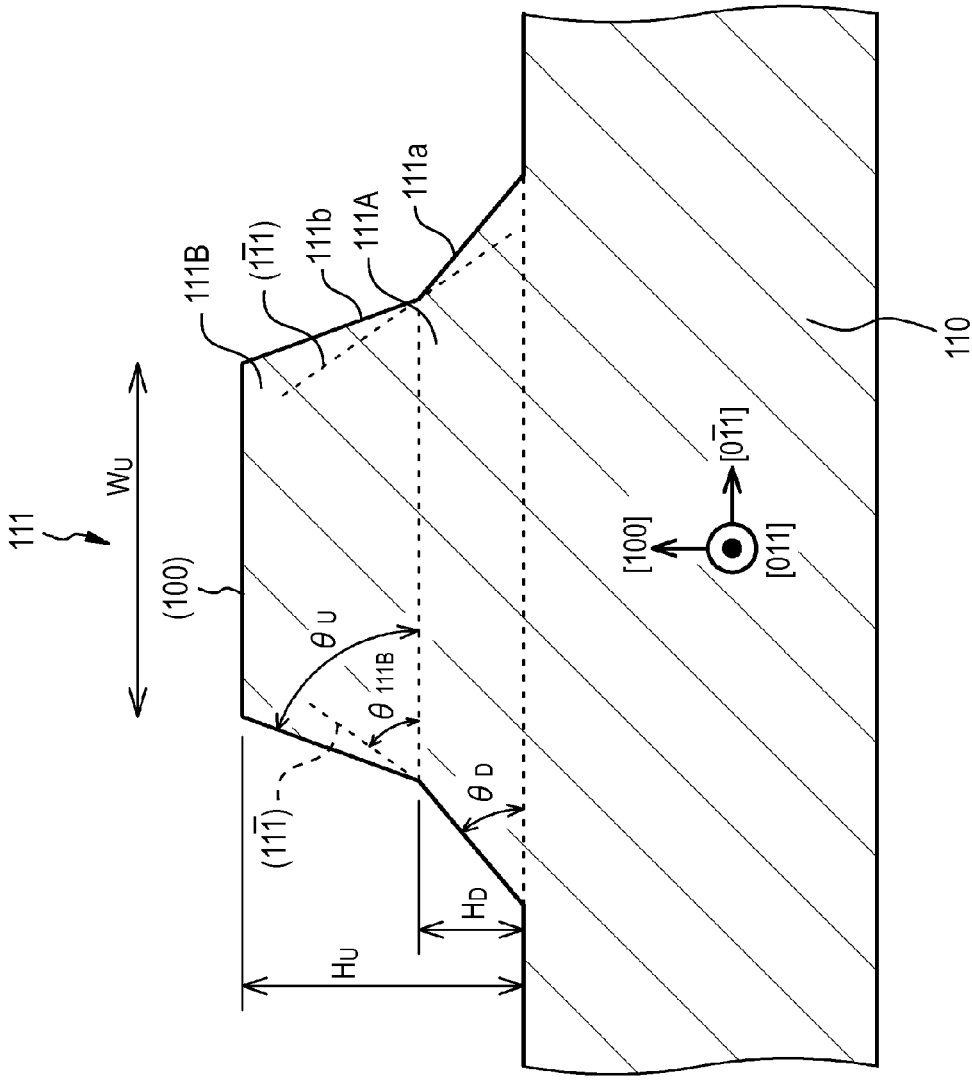

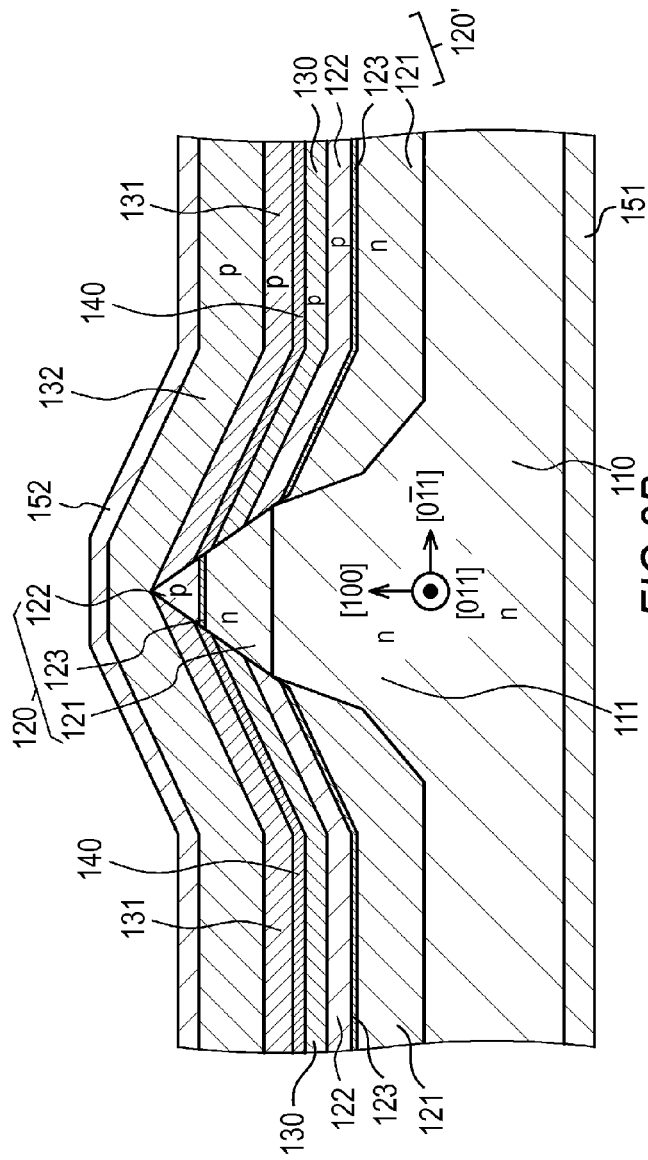
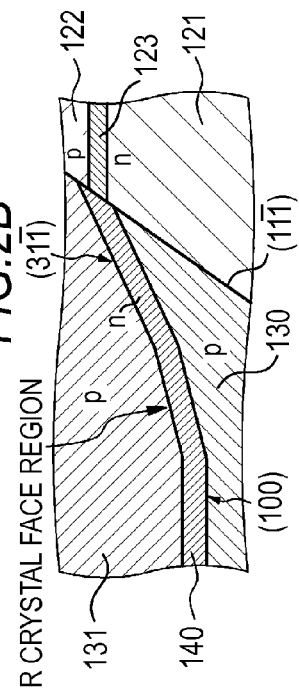
FIG.2A
FIG.2B

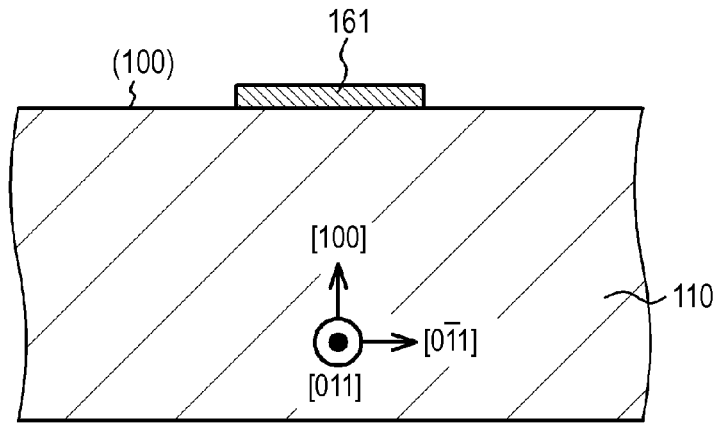
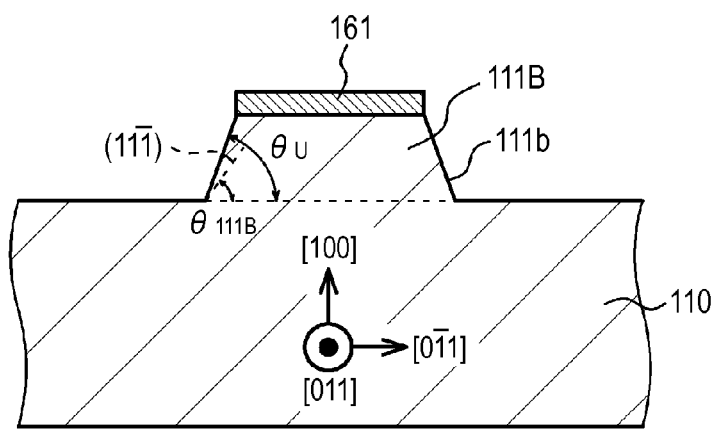
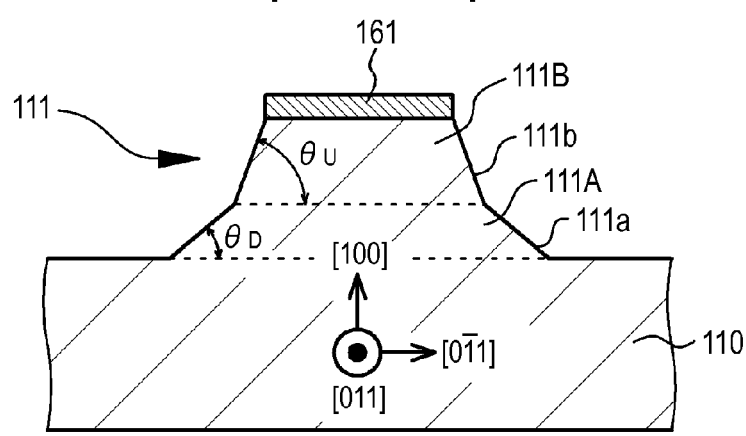

[STEP 110]

[STEP 110] (CONTINUATION)

[STEP 110] (CONTINUATION)

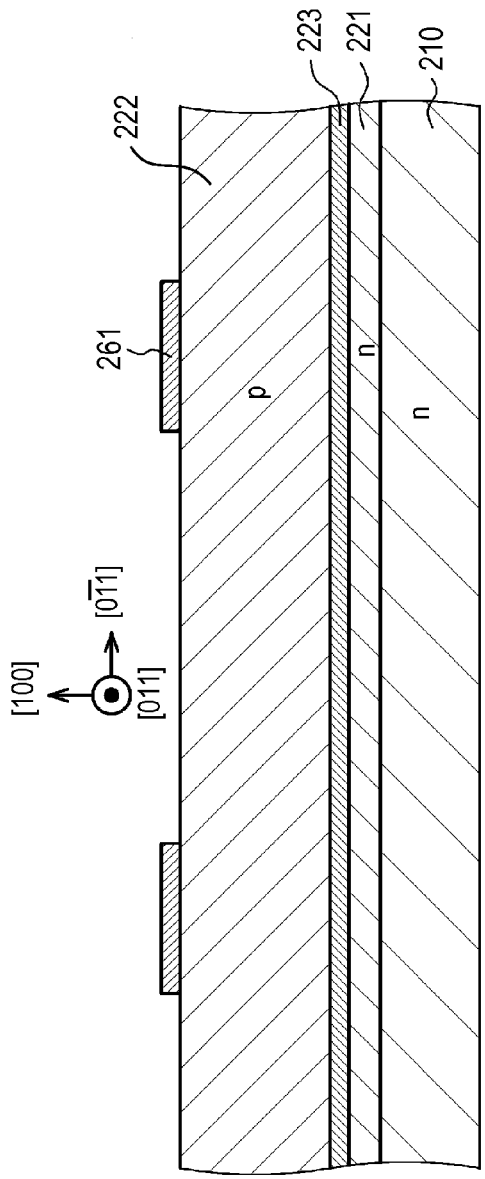
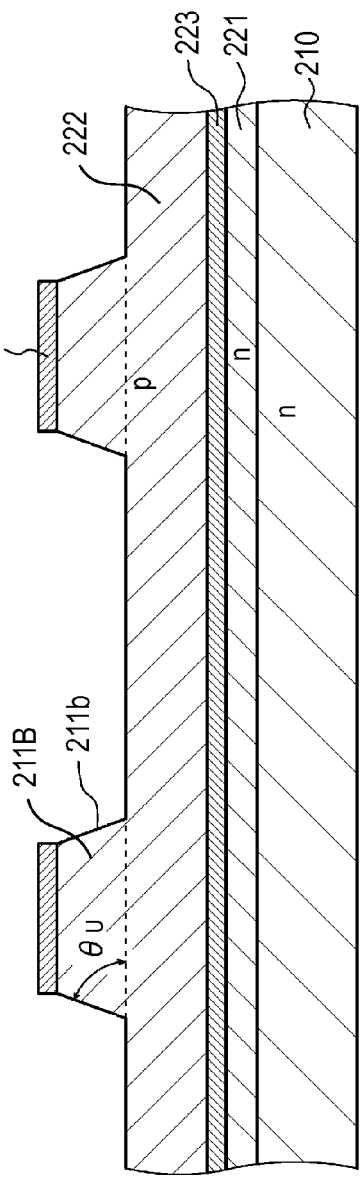

[SUB-STEP 210C]

SEMICONDUCTOR LIGHT-EMITTING ELEMENT, FABRICATION METHOD THEREOF, CONVEX PART FORMED ON BACKING, AND CONVEX PART FORMATION METHOD FOR BACKING

CROSS REFERENCES TO RELATED APPLICATIONS

This is a Divisional Application of U.S. patent application Ser. No.: 12/461,409, filed Aug. 11, 2009, which in turn claims priority from Japanese Application Nos.: 2008-212683, filed Aug. 21, 2008 and 2008-240629, filed Sep. 19, 2008. The entire contents of which are incorporated herein by reference.

BACKGROUND OF THE INVENTION

1. Field of the Invention

The present invention relates to a semiconductor light-emitting element, a fabrication method thereof, a convex part formed on a backing, and a convex part formation method for the backing.

2. Description of the Related Art

As a semiconductor laser characterized by a low threshold current $I_{th}$, a semiconductor laser having a separated double-heterojunction (SDH) structure and being cable to be formed in the course of one epitaxial growth process (hereinafter, referred to as an SDH semiconductor laser) is known owing to, for example, U.S. Pat. No. 2,990,837 (patent document 1).

As for the SDH semiconductor laser, first, a convex part that extends in the direction of a {110} A face is formed on an element fabrication substrate having a {110} face as the principal surface thereof. When crystal growth is induced on the principal surface of the element fabrication substrate, a light-emitting portion is formed on the {100} face that is the top surface of the convex part while having compound semiconductor layers accumulated thereon. The light-emitting portion has such a structure that a first compound semiconductor layer exhibiting a first conductivity type, an active layer, and a second compound semiconductor layer exhibiting a second conductivity type are sequentially accumulated. Assuming that the light-emitting portion is cut along a virtual plane (equivalent to the {110} face) in a direction perpendicular to the direction in which the convex part extends, the sectional shape is, for example, an isosceles triangle. The flank (slope) of the light-emitting portion is formed with a {111} B face. In general, according to the metal organic chemical vapor deposition (MOCVD) method (which may be referred to as the metal organic vapor phase epitaxy (MOVPE) method), the {111} B face is known as a non-growth face, though it may not be under a special condition for crystal growth. Therefore, as long as the SDH semiconductor laser is concerned, once the light-emitting portion whose flank is the {111} B face is formed, even if MOCVD is continued, the crystal growth of the light-emitting portion is retained in a self-growth suspended stage. Herein, the inclination ($\theta_{111B}$) of the {111} B face is 54.7°.

Incidentally, in this specification, the notation (hkl) denotes a crystal face. Herein, a negative integer is written with a minus sign like (hk-l) but not written with a bar like (hk l̄). In addition, the notation of [hkl] denotes a direction. Herein, a negative integer is written with a minus sign like [hk-l] but not written with a bar like [hk l̄].

On part of the principal surface of the element fabrication substrate except the convex part (for convenience' sake, referred to as a concave-part surface) which has the {100} face, since a non-growth surface does not exist, if MOCVD is continued, compound semiconductor layers that crystallographically grow from the concave-part surface will soon fully bury the light-emitting portion whose self-growth is suspended. The compound semiconductor layers having crystallographically grown from the concave-part surface are structured to have a current block layer position adjustment layer, a current block layer, and a buried layer sequentially formed on the second compound semiconductor layer. Herein, at an intermediate step before the compound semiconductor layers that crystallographically grow from the concave-part surface bury the light-emitting portion (in particular, when the compound semiconductor layer reaches the vicinity of the side surface of the active layer included in the light-emitting portion), if the current block layer is formed by controlling the thickness of the current block layer position adjustment layer, a structure in which a current can be injected into the active layer alone of the light-emitting portion can be realized.

As mentioned above, in the SDH semiconductor laser, the compound semiconductor layers can be formed in the course of one crystal growth process. In addition, if a material whose energy band gap is larger than that of the active layer, that is, a material whose refractive index is low is selected as a material to be made into the compound semiconductor layers that up and down sandwich the active layer within the light-emitting portion (first and second compound semiconductor layers) or a material to be made into the current block layer, buried layer, or the current block layer position adjustment layer located outside the light-emitting portion, the active layer can be fully enclosed by the compound semiconductor layer that is preferred for light confinement. Eventually, a shape of a beam emitted from the semiconductor layer having the end surface of the convex part as a light emitting surface thereof can be approached to a real circle. In other words, $\theta//$ will be approximately equal to $\theta\perp$ in a far-field pattern (FFP).

Otherwise or for example, depending on a lens coupling efficiency, the shape of a beam to be emitted from the semiconductor laser is requested to be elliptic. In this case, for example, a so-called flare stripe structure having the width near the end surface of the convex part expanded is adopted (refer to, for example, U.S. Pat. No. 3,399,018 (patent document 2)), whereby the $\theta//$ value in the FFP can be controlled to be small. In addition, the adoption of the flare stripe structure makes it possible to achieve a high-power light output.

SUMMARY OF THE INVENTION

As mentioned above, in the SDH semiconductor laser, first, the convex part that extends in the direction of the {110} A face is formed on an element fabrication substrate having a {100} face as the principal surface thereof (see FIG. 21A). Therefore, the size of the light-emitting portion is restricted by the width ($W_P$) of the convex part. In contrast, the width ($W_A$) of the active layer is determined based on the specifications for the SDH semiconductor laser. Therefore, assuming that the width ($W_P$) of the convex part is narrow, when the active layer having a desired width ($W_A$) is formed, the distance ($H_I$) from the active layer to the convex part is short (see FIG. 21B). Herein, $H_I$, $W_P$, and $W_A$ have the relationship of $H_I = \{(W_P - W_A)/2\} \times \tan(\theta_{111B})$. When the distance ($H_I$) from the active layer to the convex part is short, light generated in the active layer is absorbed by the element fabrication substrate having the convex part formed thereon. The effect of light confinement is imperfectly exerted. Eventually, light emission efficiency (a slope efficiency expressed by a quotient of a light power by an injected current) is degraded. In an ongoing situation, for example, when the width of the active layer $W_A$ is set to 1.2 μm, the minimum value of the distance ($H_1$) is approximately 1.4 μm.

The height ($H_2$) of the light-emitting portion is restricted by the width ($W_P$) of the convex part. Herein, $H_2$ and $W_P$ have the relationship of $H_2=(W_P/2)\times\tan(\theta_{111B})$. As shown in FIG. 22A, assuming that the SDH semiconductor laser is fabricated using the convex part whose height ($H_0$) is low, whose width ($W_P$) is narrow, and which has a so-called low aspect ratio, there may be no room for formation of the current block layer on the side surface of the active layer.

When an attempt is made to integrate SDH semiconductor lasers at a high density, that is, when the number of SDH semiconductor lasers per unit area is increased, or in other words, when an attempt is made to reduce, as shown in FIG. 23A, a formation pitch $PT_1$ between SDH semiconductor lasers into a formation pitch $PT_2$, the size of the light-emitting portion (for example, the width $W_A$) has to be diminished. In this case, for retaining the width of the active layer at a certain value, the distance from the active layer to the convex part should be, as shown in FIG. 23B, shortened from the value $H_1$ to a value $H_1'$. This poses the aforesaid problem. Otherwise, when the distance from the active layer to the convex part is sufficiently preserved for fear light may be absorbed by the element fabrication substrate having the convex part formed thereof, the height of the convex part should be, as shown in FIG. 23C, reduced from a value $H_0$ to a value $H_0'$. This also poses the aforesaid problem.

The above problems can be solved as long as the height ($H_0$) of the convex part can be set to an arbitrary value. However, it is quite hard to form a high convex part while the flank of the convex part retained on the {111} B face, that is, it is quite hard to deeply etch the element fabrication substrate while retaining the flank of the convex part on the {111} B face. In order to resolve the hardness, a technology for forming the convex part using two wet-etching methods is disclosed in, for example, JP-A-2001-332530 (patent document 3). The technology is very useful. However, since the convex part is formed using two wet-etching methods, an etching process is time-consuming. Therefore, there is a demand for a technology of forming a high convex part in the course of a simple process. In addition, it is highly requested to reduce a variance in a dimension of the convex part, which extends in the direction of the {110} A face, on one element fabrication substrate (a variance in the width of the convex part ($W_P$) or the height thereof ($H_0$), or an intra-surface variance in a ratio of the height of the convex part ($H_0$) to the width of the convex part ($W_P$)), as greatly as possible. In particular, the wider the design specification for the width of the convex part ($W_P$) is, or, the larger the design specification for the height of the convex part ($H_0$) is, the more complex an etching technology for retaining the ratio of the width of the convex part ($W_P$) to the height thereof ($H_0$) at a certain value within the element fabrication substrate is. When the variance in a dimension of any of layers included in the convex part takes place, a variance is produced in the size of the light-emitting portion. This leads to a variance in the shape of a laser beam to be emitted from the SDH semiconductor laser, in the θ// value in the FFP, or in the threshold current characterizing the SDH semiconductor laser.

In a semiconductor light-emitting element having a light-emitting portion that includes a first compound semiconductor layer, an active layer, and a second compound semiconductor layer whose top surface is a {100} face, a convex part extending in parallel with a <110> direction need be formed on part of the second compound semiconductor layer in the thickness direction thereof. Even in fabrication of a buried hetero-structure laser, a surface-emission laser (vertical resonator laser, VCSEL), a heterojunction bipolar transistor (HET), a photodiode (PD), or a solar cell, a high convex part (or a deep concave part or element isolation region) may have to be formed on the principal surface of an element fabrication substrate. For the semiconductor light-emitting element or other various elements, there is a demand for the technology for forming a high convex part (or a deep concave part or element isolation region) in the course of a simple process. It is highly requested to reduce a variance in a dimension of each of layers included in the convex part within one element fabrication substrate (an intra-surface variance) as greatly as possible.

Accordingly, first, there is a need for a method of forming a high convex part on a backing in the course of a simple process while ensuring great design freedom but causing only a little intra-surface variance, a convex part formed on a backing according to the method, a semiconductor light-emitting element fabrication method to which the method is applied, and a semiconductor light-emitting element fabricated according to the semiconductor light-emitting element fabrication method. Secondly, there is a need for a semiconductor light-emitting element fabrication method that includes a method of forming a high convex part on an element fabrication substrate in the course of a simple process while, while ensuring great design freedom but causing only a little intra-surface variance, and that does not allow light, which is generated in an active layer, to be absorbed by the element fabrication substrate.

According to an embodiment of the present invention, first, there is provided a convex part formation method for a backing, that is, a convex part formation method of forming a convex part, which extends in parallel with a <110> direction, on a backing having a {100} face as the top surface thereof. The method includes the steps of:

(a) forming a mask layer, which extends in parallel with the <110> direction, on the backing;

(b) etching the backing according to a wet etching method that employs an etching solution using the mask layer as an etching mask so as to form a convex-part upper layer whose sectional shape on a cutting plane corresponding to a {110} face is an isosceles trapezoid, the base of which is longer than the upper side thereof, and the side surface of which has an inclination of $\theta_U$; and (c) further etching the backing according to the wet etching method at a different temperature of the etching solution and using the mask layer and convex-part upper layer as an etching mask so as to form a convex-part lower layer whose sectional shape on the cutting plane corresponding to the {110} face is an isosceles trapezoid, the base of which is longer than the upper side thereof, and the side surface of which has an inclination of $\theta_D$ ($\theta_D \neq \theta_U$).

According to the convex part formation method in accordance with the embodiment of the present invention, the base of the sectional shape of the convex-part upper layer cut on the {110} face corresponds to the upper side of the sectional shape of the convex-part lower layer cut on the {110} face. Assuming that $\theta_{111B}$ denotes the inclination of the flank of the convex part that is a (111) B face, $\theta_D \leq \theta_{111B} \leq \theta_U$ (where $\theta_D \neq \theta_U$) is satisfied. In this case, preferably, the temperature of the etching solution employed at step (b) is higher than the temperature thereof employed at step (c). To what extent the temperature of the etching solution should be raised depends on the etching solution to be employed and a material to be etched, and may therefore be determined by conducting various tests. The same applies to a description to be made below.

According to the convex part formation method in accordance with the embodiment of the present invention, the base of the sectional shape of the convex-part upper layer cut on the {110} face corresponds to the upper side of the sectional shape of the convex-part lower layer cut on the {110} face. Assuming that $\theta_{111B}$ denotes the inclination of the flank of the convex part which is the (111) B face, $\theta_U \leq \theta_{111B} \leq \theta_D$ (where $\theta_D \neq \theta_U$) is satisfied. In this case, preferably, the temperature of the etching solution employed at step (b) should be lower than the temperature thereof employed at step (c). Incidentally, to what extent the temperature of the etching solution should be lowered depends on the etching solution to be employed and a material to be etched, and may therefore be determined by conducting various tests. The same applies to a description to be made later.

According to the first embodiment of the present invention, there is provided a semiconductor light-emitting element fabrication method including the steps of:

(A) forming a convex part, which extends in parallel with a <110> direction of an element fabrication substrate, on the principal surface of the element fabrication substrate having a {100} face as the principal surface thereof;

(B) forming a light-emitting portion, which has a first compound semiconductor layer exhibiting a first conductivity type, an active layer, and a second compound semiconductor layer exhibiting a second conductivity type sequentially accumulated, on the top surface of the convex part, and concurrently forming a laminated structure, which has the first compound semiconductor layer exhibiting the first conductivity type, the active layer, and the second compound semiconductor layer exhibiting the second conductivity type sequentially accumulated, on part of the principal surface of the element fabrication substrate on which the convex part is not formed; and (C) forming a current block layer, which shields at least the side surface of the active layer included in the light-emitting portion.

The step (A) includes the sub-steps of:

(a) forming a mask layer, which extends in parallel with the <110> direction, on the principal surface of the element fabrication substrate;

(b) etching the principal surface of the element fabrication substrate according to a wet etching method that employs an etching solution using the mask layer as an etching mask, and forming a convex-part upper layer whose sectional shape on a cutting plane corresponding to a {110} face is an isosceles trapezoid, the base of which is longer than the upper side thereof, and the side surface of which has an inclination of $\theta_U$; and (c) etching the principal surface of the element fabrication substrate according to the wet etching method at a different temperature of the etching solution and using the mask layer and the side surface of the convex-part upper layer as an etching mask so as to form a convex-part lower layer whose sectional shape on the cutting plane corresponding to the {110} face is an isosceles trapezoid, the base of is longer than the upper side thereof, and the side surface of which has an inclination of $\theta_D$ (where $\theta_D \neq \theta_U$).

In the semiconductor light-emitting element fabrication method in accordance with the first embodiment of the present invention, the base of the sectional shape of the convex-part upper layer cut on the {110} face corresponds to the upper side of the sectional shape of the convex-part lower layer cut on the {110} face. Assuming that $\theta_{111B}$ denotes the inclination of the flank of the convex part which is the (111) B face, $\theta_D \leq \theta_{111B} \leq \theta_U$ (where $\theta_D \neq \theta_U$) is satisfied. In this case, preferably, the temperature of the etching solution employed at the step (b) should be lower than the temperature thereof employed at the step (c).

In the semiconductor light-emitting element fabrication method in accordance with the first embodiment of the present invention encompassing the aforesaid preferred embodiment or constitution, or in a semiconductor light-emitting element in accordance with the first embodiment of the present invention to be described later, assuming that $H_U$ denotes the thickness of the convex-part upper layer and $H_D$ denotes the thickness of the convex-part lower layer, $H_U/(H_U+H_D) \geq 0.5$, or more preferably, $H_U/(H_U+H_D) \geq 0.7$ should preferably be satisfied.

Further, in the semiconductor light-emitting element fabrication method in accordance with the first embodiment of the present invention encompassing the aforesaid preferred embodiment or constitution, or in the semiconductor light-emitting element in accordance with the first embodiment of the present invention to be described later, assuming that $H_U$ denotes the thickness of the convex-part upper layer, $H_D$ denotes the thickness of the convex-part lower layer, and $W_U$ denotes the width of the convex-part upper layer, $(H_U+H_D)/W_U \geq 0.4$, or more preferably, $(H_U+H_D)/W_U \geq 0.9$ should be satisfied.

According to the second embodiment of the present invention, there is provided a semiconductor light-emitting element fabrication method including a step of forming a convex part, which extends in parallel with a <110> direction, on part of a second compound semiconductor layer in the thickness direction thereof in a semiconductor light-emitting element including a light-emitting portion that includes a first compound semiconductor layer, an active layer, and the second compound semiconductor layer whose top surface is a {100} face.

The convex part formation step includes the sub-steps of:

(a) forming a mask layer, which extends in parallel with the <110> direction, on the top surface of the second compound semiconductor layer;

(b) etching part of the second compound semiconductor layer in the thickness direction thereof according to a wet etching method, which employs an etching solution, using the mask layer as an etching mask so as to form a convex-part upper layer whose sectional shape on a cutting plane corresponding to a {110} face is an isosceles trapezoid, the base of which is longer than the upper side thereof, and the side surface of which has an inclination of $\theta_U$; and (c) further etching part of the second compound semiconductor layer in the thickness direction thereof according to the wet etching method at a different temperature of the etching solution, and using the mask layer and the side surface of the convex-part upper layer as an etching mask so as to form a convex-part lower layer whose sectional shape on the cutting plane corresponding to the {110} face is an isosceles trapezoid, the base of which is longer than the upper side thereof, and the side surface of which has an inclination of $\theta_D$ (where $\theta_D \neq \theta_U$).

In the semiconductor light-emitting element fabrication method in accordance with the second embodiment of the present invention, the base of the sectional shape of the convex-part upper layer cut on the {110} face corresponds to the upper side of the sectional shape of the convex-part lower layer cut on the {110} face. Assuming that $\theta_{111B}$ denotes the inclination of the flank of the convex part which is a (111) B face, $\theta_D \leq \theta_{111B} \leq \theta_U$ (where $\theta_D \neq \theta_U$) is satisfied. In this case, the temperature of the etching solution employed at the step (b) should preferably be higher than the temperature thereof employed at the step (c).

In the semiconductor light-emitting element fabrication method in accordance with the second embodiment of the present invention, the base of the sectional shape of the convex-part upper layer cut on the {110} face corresponds to the upper side of the sectional shape of the convex-part lower layer cut on the {110} face. Assuming that $\theta_{111B}$ denotes the inclination of the flank of the convex part which is the (111) B face, $\theta_U \leq \theta_{111B} \leq \theta_D$ (where $\theta_D \neq \theta_U$) is satisfied. In this case, the temperature of the etching solution employed at step (b) should preferably be lower than the temperature thereof employed at step (c).

In the semiconductor light-emitting element fabrication method in accordance with the second embodiment of the present invention, the second compound semiconductor layer may have a multilayer structure including three or more layers. A convex part may be formed with the upper layer, and the intermediate layer may be functioned as an etching stopper layer to be used to form the convex part according to the wet etching method.

According to the first embodiment of the present invention, there is provided a convex part formed on the backing, that is, a convex part which is formed on the backing having a {100} face as a top surface thereof and which is extended in parallel with a <110> direction of the backing.

The convex part has a two-layer structure including a convex-part lower layer and a convex-part upper layer.

The sectional shape of the convex-part upper layer cut on a {110} face is an isosceles trapezoid whose base is longer than the upper side thereof.

The sectional shape of the convex-part lower layer cut on the {110} face is an isosceles trapezoid whose base is longer than the upper side thereof.

The base of the sectional shape of the convex-part upper layer cut on the {110} face corresponds to the upper side of the sectional shape of the convex-part lower layer cut on the {110} face.

Assuming that $\theta_U$ denotes the inclination of the side surface of the convex-part upper layer, $\theta_D$ denotes the inclination of the side surface of the convex-part lower layer, and $\theta_{111B}$ denotes the inclination of the flank of the convex part which is a (111) B face, $\theta_D \leq \theta_{111B} \leq \theta_U$ (where $\theta_D \neq \theta_U$) is satisfied.

According to the second embodiment of the present invention, there is provided a convex part formed on the backing, that is, a convex part which is formed on the backing having a {100} face as a top surface thereof and which is extended in parallel with a <110> direction of the backing.

The convex part has a two-layer structure including a convex-part lower layer and a convex-part upper layer.

The sectional shape of the convex-part upper layer cut on a {110} face is an isosceles trapezoid whose base is longer than the upper side thereof.

The sectional shape of the convex-part lower layer cut on the {110} face is an isosceles trapezoid whose base is longer than the upper side thereof.

The base of the sectional shape of the convex-part upper layer cut on the {110} face corresponds to the upper side of the sectional shape of the convex-part lower layer cut on the {110} face.

Assuming that $\theta_U$ denotes the inclination of the side surface of the convex-part upper layer, $\theta_D$ denotes the inclination of the side surface of the convex-part lower layer, and $\theta_{111B}$ denotes the inclination of the flank of the convex part which is a (111) B face, $\theta_U \leq \theta_{111B} \leq \theta_D$ (where $\theta_D \neq \theta_U$) is satisfied.

According to the first embodiment of the present invention, there is provided a semiconductor light-emitting element including:

(a) a convex part that is formed on the principal surface of an element fabrication substrate having a {100} face as the principal surface thereof and that is extended in parallel with a <110> direction of the element fabrication substrate;

(b) a light-emitting portion that has a first compound semiconductor layer exhibiting a first conductivity type, an active layer, and a second compound semiconductor layer exhibiting a second conductivity type sequentially accumulated and that is formed on the top surfaces of the convex part;

(c) a laminated structure that is formed on part of the principal surface of the element fabrication substrate on which the convex part is not formed and that has the first compound semiconductor layer exhibiting the first conductivity type, the active layer, and the second compound semiconductor layer exhibiting the second conductivity type sequentially accumulated; and a current block layer that is formed on the laminated structure and that shields at least the side surface of the active layer included in the light-emitting portion.

The convex part has a two-layer structure including a convex-part lower layer and a convex-part upper layer.

The sectional shape of the convex-part upper layer cut on a {110} face is an isosceles trapezoid whose base is longer than the upper side.

The sectional shape of the convex-part lower layer cut on the {110} face is an isosceles trapezoid whose base is longer than the upper side thereof.

The base of the sectional shape of the convex-part upper layer cut on the {110} face corresponds to the upper side of the sectional shape of the convex-part lower layer cut on the {110} face.

Assuming that $\theta_U$ denotes the inclination of the side surface of the convex-part upper layer, $\theta_D$ denotes the inclination of the side surface of the convex-part lower layer, and $\theta_{111B}$ denotes the inclination of the flank of the convex part which is a (111) B face, $\theta_D \leq \theta_{111B} \leq \theta_U$ (where $\theta_D \neq \theta_U$) is satisfied.

According to a second embodiment of the present invention, there is provided a semiconductor light-emitting element that includes a light-emitting portion formed with a first compound semiconductor layer, an active layer, and a second compound semiconductor layer whose top surface is a {100} face, and that has a convex part, which extends in parallel with a <110> direction, formed on the second compound semiconductor layer.

The convex part has a two-layer structure including a convex-part lower layer and a convex-part upper layer.

The sectional shape of the convex-part upper layer cut on a {110} face is an isosceles trapezoid whose base is longer than the upper side thereof.

The sectional shape of the convex-part lower layer cut on the {110} face is an isosceles trapezoid whose base is longer than the upper side thereof.

The base of the sectional shape of the convex-part upper layer cut on the {110} face corresponds to the upper side of the sectional shape of the convex-part lower layer cut on the {110} face.

Assuming that $\theta_U$ denotes the inclination of the side surface of the convex-part upper layer, $\theta_D$ denotes the inclination of the side surface of the convex-part lower layer, and $\theta_{111B}$ denotes the inclination of the flank of the convex part which is a (111) B face, $\theta_D \leq \theta_{111B} \leq \theta_U$ (where $\theta_D \neq \theta_U$) is satisfied.

According to a third embodiment of the present invention, there is provided a semiconductor light-emitting element that includes a light-emitting portion formed with a first compound semiconductor layer, an active layer, and a second compound semiconductor layer whose top surface is a {100} face, and that has a convex part, which extends in parallel with a <110> direction, formed on the second compound semiconductor layer.

The convex part has a two-layer structure including a convex-part lower layer and a convex-part upper layer.

The sectional shape of the convex-part upper layer cut on a {110} face is an isosceles trapezoid whose base is longer than the upper side thereof.

The sectional shape of the convex-part lower layer cut on the {110} face is an isosceles trapezoid whose base is longer than the upper side thereof.

The base of the sectional shape of the convex-part upper layer cut on the {110} face corresponds to the upper side of the sectional shape of the convex-part lower layer cut on the {110} face.

Assuming that $\theta_U$ denotes the inclination of the side surface of the convex-part upper layer, $\theta_D$ denotes the inclination of the side surface of the convex-part lower layer, and $\theta_{111B}$ denotes the inclination of the flank of the convex part which is a (111) B face, $\theta_U \leq \theta_{111B} \leq \theta_D$ (where $\theta_D \neq \theta_U$) is satisfied.

According to the third embodiment of the present invention, there is provided a semiconductor light-emitting element fabrication method including the steps of:

(A) forming a convex part, which extends in parallel with a <110> direction of an element fabrication substrate, on the principal surface of the element fabrication substrate that is a {100} face;

(B) forming a light-emitting portion, which has a first component semiconductor layer exhibiting a first conductivity type, an active layer, and a second compound semiconductor layer exhibiting a second conductivity type sequentially accumulated, on the top surface of the convex part, and concurrently forming a laminated structure, which has the first component semiconductor layer exhibiting the first conductivity type, the active layer, and the second compound semiconductor layer exhibiting the second conductivity type sequentially accumulated, on part of the principal surface of the element fabrication substrate on which the convex part is not formed;

(C) forming a current block layer, which shields at least part of the side surface of the active layer included in the light-emitting portion, on the laminated structure;

(D) forming a contact layer on the entire surface of the current block layer, and forming a second electrode on the contact layer;

(E) bonding the element fabrication substrate to a supporting substrate with the second electrode between them, and removing the element fabrication substrate; and (F) forming a first electrode electrically connected to the first compound semiconductor layer.

The step (A) includes the sub-steps of:

(a) forming a mask layer, which extends in parallel with the <110> direction, on the principal surface of the element fabrication substrate;

(b) etching the principal surface of the element fabrication substrate according to a wet etching method, which employs an etching solution, using the mask layer as an etching mask so as to form a convex-part upper layer whose sectional shape on a cutting plane corresponding to a {110} face is an isosceles trapezoid, the base of which is longer than the upper side thereof, and the side surface of which has an inclination of $\theta_U$; and (c) further etching the principal surface of the element fabrication substrate according to a wet etching method at a different temperature of the etching solution and using the mask layer and the side surface of the convex-part upper layer as an etching mask so as to form a convex-part lower layer whose sectional shape on the cutting plane corresponding to the {110} face is an isosceles trapezoid, the base of which is longer than the upper side thereof, and the side surface of which has an inclination of $\theta_D$ (where $\theta_D \neq \theta_U$).

In the semiconductor light-emitting element fabrication method in accordance with the third embodiment of the present invention, the base of the sectional shape of the convex-part upper layer cut on the {110} face corresponds to the upper side of the sectional shape of the convex-part lower layer cut on the {110} face. Assuming that $\theta_{111B}$ denotes the inclination of the flank of the convex part which is a (111) B face, $\theta_D \leq \theta_{111B} \leq \theta_U$ (where $\theta_D \neq \theta_U$) is satisfied. In this case, the temperature of the etching solution employed at step (b) should preferably be lower than the temperature of the etching solution employed at step (c). Incidentally, to what extent the temperature should be raised depends on the etching solution to be employed and a material to be etched, and may therefore be appropriately determined by conducting various tests.

In the semiconductor light-emitting element fabrication method in accordance with the third embodiment of the present invention encompassing the aforesaid preferred embodiment or constitution, assuming that $H_U$ denotes the thickness of the convex-part upper layer and $H_D$ denotes the thickness of the convex-part lower layer, $H_U/(H_U+H_D) \leq 0.5$, or more preferably, $H_U/(H_U+H_D) \leq 0.7$ is satisfied.

In the semiconductor light-emitting element fabrication method in accordance with the third embodiment of the present invention encompassing the aforesaid various preferred embodiments or constitutions, assuming that $H_U$ denotes the thickness of the convex-part upper layer, $H_D$ denotes the thickness of the convex-part lower layer, and $W_U$ denotes the width of the convex-part upper layer, $(H_U+H_D)/W_U \geq 0.4$, or more preferably, $(H_U+H_D)/W_U \geq 0.9$ is satisfied.

In the semiconductor light-emitting element fabrication method in accordance with the third embodiment of the present invention encompassing the aforesaid various preferred embodiments or constitutions, step (A) may be succeeded by a step of forming an etching stopper layer on the entire surface of the element fabrication substrate. Since the flank of the convex part is not a non-growth surface, the etching stopper layer is formed on the flank of the convex part. The etching stopper layer may be removed after the element fabrication substrate is removed. As long as light generated in the active layer is not absorbed, the etching stopper layer may be left intact. In the latter case, the etching stopper layer may be formed with a compound semiconductor layer characterized by a wider energy band gap than the active layer that is included in the light-emitting portion and that generates light, for example, an aluminum gallium arsenide (AlGaAs) layer. The first electrode may be formed at least on part of the etching stopper layer. Otherwise, the etching stopper layer may be left intake by a desired thickness, and the first electrode may be formed on the contact layer (for example, a gallium arsenide (GaAs) contact layer) formed on the left etching stopper layer. The etching stopper layer may be formed with a single layer or may be formed with a laminated structure that is realized by repeating a cyclic structure of an aluminum arsenide (AlAs) layer and the GaAs layer or of the AlGaAs layer and GaAs layer. When the formation is adopted, if the element fabrication substrate is removed, although at least part of the etching stopper layer is left intact or the etching stopper layer is left intact by a certain thickness, while absorption of light generated in the active layer included in the light-emitting portion is suppressed, the first electrode can be formed on the first compound semiconductor layer with the contact layer between them. Eventually, an excellent electric characteristic can be provided. For a semiconductor light-emitting element that has antimony (Sb) or bismuth (Bi) contained in the active layer, an etching stopper layer containing aluminum antimony (AlSb) or aluminum bismuth (AlBi) may be employed. Therefore, the etching stopper layer formed with a laminated structure including the AlAs layer may be realized with a laminated structure having the AlAs layer replaced with the AlSb layer or AlBi layer or a laminated structure having at least one of AlSb and AlBi contained in the AlAs layer.

The semiconductor light-emitting element in accordance with the second or third embodiment of the present invention may be designed so that light will be emitted from the active layer by feeding a current from the convex part through the remaining part of the second compound semiconductor layer and active layer to the first compound semiconductor layer. Otherwise, the semiconductor light-emitting element may be designed so that the convex part will be equivalent to a region in which a current is constricted, that is, a region in which a current does not conduct, and light will be emitted from the active layer by feeding a current from a third compound semiconductor layer, which is formed between the convex parts, through the remaining part of the second compound semiconductor layer and the active layer to the first compound semiconductor layer. As a semiconductor light-emitting element designed to have the former form, an inverted-self-aligned-narrow stripe (ISAN) semiconductor layer can be introduced. As a semiconductor light-emitting element designed to have the latter form, a self-aligned-narrow stripe semiconductor layer can be introduced.

In the convex part formation method according to the embodiment of the present invention, the semiconductor light-emitting element fabrication method according to the first embodiment of the present invention, the semiconductor light-emitting element fabrication method according to the second embodiment of the present invention, the semiconductor light-emitting element fabrication method according to the third embodiment of the present invention, the convex part formed on the backing according to the first embodiment of the present invention, the convex part formed on the backing according to the second embodiment of the present invention, the semiconductor light-emitting element according to the first embodiment of the present invention, the semiconductor light-emitting element according to the second embodiment of the present invention, or the semiconductor light-emitting element according to the third embodiment of the present invention (hereinafter, the embodiments may be generically referred to as the embodiment of the present invention), when it says that $\theta_D \leq \theta_{111B} \leq \theta_U$ (where $\theta_D \neq \theta_U$) is satisfied, it means in practice that any of three conditions of $\theta_D < \theta_{111B} < \theta_U$, $\theta_D = \theta_{111B} < \theta_U$, and $\theta_D \leq \theta_{111B} = \theta_U$ is satisfied. Herein, the $\theta_{111B}$ value is in practice 54.7°. In the case of $\theta_{111B} < \theta_U$, the $\theta_U$ value may range from 56° to 64°. In the case of $\theta_D < \theta_{111B}$, the $\theta_D$ value may range from 46° to 54°.

When it says that $\theta_U \leq \theta_{111B} \leq \theta_D$ (where $\theta_D \neq \theta_U$) is satisfied, it means in practice that any of three conditions of $\theta_U < \theta_{111B} < \theta_D$, $\theta_U = \theta_{111B} < \theta_D$, and $\theta_U \leq \theta_{111B} = \theta_D$ is satisfied. In the case of $\theta_{111B} < \theta_D$, the $\theta_D$ value may range from 56° to 64°. In the case of $\theta_U < \theta_{111B}$, the $\theta_U$ value may range from 46° to 54°.

The value of the thickness $H_U$ of the convex-part upper layer and the value of the thickness $H_D$ of the convex-part lower layer should in practice satisfy, in addition to the aforesaid $H_U/(H_U+H_D) \geq 0.5$, 0.1 µm $\leq H_U \leq 6$ µm and 0.1 µm $\leq H_D \leq 3$ µm, more preferably, 0.1 µm $\leq H_D \leq 6$ µm and 0.1 µm $\leq W_U \leq 2.5$ µm, or still more preferably, 0.1 µm $\leq H_D \leq 3$ µm and 0.1 µm $\leq W_U \leq 2.5$ µm. Further, the values should satisfy, in addition to the aforesaid $H_U/(H_U+H_D) \geq 0.7$, 0.1 µm $\leq H_U 6$ µm and 0.1 µm $\leq H_D \leq 3$ µm, more preferably, 0.1 µm $\leq H_D \leq 6$ µm and 0.1 µm $\leq W_U \leq 2.5$ µm, or still more preferably, 0.1 µm $\leq H_D \leq 3$ µm and 0.1 µm $\leq W_U \leq 2.5$ µm.

The convex part is, as a whole, extended in parallel with the <110> direction of the backing or element fabrication substrate. The thickness direction of the convex part is parallel with the <110> direction of the backing or element fabrication substrate, and the top surface of the convex part is a {100} face that is the principal surface of the backing or element fabrication substrate. Assuming that the direction in which the convex part extends is an X direction and the thickness direction of the convex part is a Z direction, the width direction of the convex part is equivalent to a Y direction. The convex part is not limited to the two-layer construction including the upper layer and lower layer but may have three or more layers. In this case, the inclination $\theta_M$ of the side surface of a layer (for convenience' sake, referred to as the M-th layer) included in the convex part is different from the inclination $\theta_{(M+1)}$ of the side surface of the (M−1)-th layer and the inclination $\theta_{(M+1)}$ of the side surface of the (M+1)-th layer. The side surface (inclined surface) of the M-th layer, the side surface (inclined surface) of the (M−1)-th layer, the side surface (inclined surface) of the (M−2)-th layer, etc., and the side surface (inclined surface of the (M−n)-th layer where M>n is established and M and n denote integers equal to or larger than 1) as well as the mask layer (first etching mask) all function as an etching mask. The side surface of the M-the layer having the inclination $\theta_M$ is thus formed. In a description to be made later, part of the principal surface of the element fabrication substrate on which the convex part is not formed may be referred to as a concave-part surface.

Generally, the upper side of a trapezoid is parallel with the base (lower side) thereof. According to the embodiment of the present invention, the upper side and base (lower side) may not be fully parallel with each other due to a condition for formation of the convex part. Such a shape is also encompassed in the "trapezoid." In addition, the lengths along two slopes of the flank of the convex part may not be fully identical to each other due to the condition for formation of the convex part. Such a shape shall also be encompassed in an "isosceles trapezoid." In the semiconductor light-emitting element or the fabrication method thereof according to the first embodiment of the present invention, or the semiconductor light-emitting element fabrication method according to the third embodiment of the present invention, the sectional shape of the light-emitting portion cut on the {110} face is an isosceles triangle. However, the sectional shape may not be an exactly isosceles triangle due to a condition for formation of the light-emitting portion.

According to the embodiment of the present invention, as the element fabrication substrate, a gallium nitride (GaN) substrate, a gallium arsenide (GaAs) substrate, a gallium phosphorus (GaP) substrate, an aluminum nitride (AlN) substrate, an aluminum phosphorus (AlP) substrate, an indium nitride (InN) substrate, an indium phosphorus (InP) substrate, an aluminum gallium indium nitride (AlGaInN) substrate, an aluminum gallium nitride (AlGaN) substrate, an aluminum indium nitride (AlInN) substrate, a gallium indium nitride (GaInN) substrate, an aluminum gallium indium phosphorous (AlGaInP) substrate, an aluminum gallium phosphorous (AlGaP) substrate, an aluminum indium phosphorous (AlInP) substrate, a gallium indium phosphorous (GaInP) substrate, a zinc sulfide (ZnS) substrate, a sapphire substrate, a silicon carbide (SiC) substrate, an alumina substrate, a zinc oxide (ZnO) substrate, a lithium magnesium oxide (LiMgO) substrate, a lithium gallium dioxide (LiGaO$_2$) substrate, a magnesium aluminum spinel ($MgAl_2O_4$) substrate, a silicon (Si) substrate, or a germanium (Ge) substrate can be cited. Further, any of these substrates having a buffer layer or an intermediate layer formed on the face (principal surface) thereof may be adopted as the element fabrication substrate. As the principal surface of the substrate, a plane containing a crystal orientation called a so-called A plane, B plane, C plane, R plane, M plane, N plane, or S plane, or a plane deviated in a specific direction from any of these planes may be adopted, though it depends on a crystal structure (for example, a cubic system or a hexagonal system). In the semiconductor light-emitting element or fabrication method thereof according to the first embodiment of the present invention, or the semiconductor light-emitting element fabrication method according to the third embodiment of the present invention, a substrate having the crystal structure of a zinc sulfide (zinc blende) or a substrate having a crystal film formed thereon should preferably be adopted. As an atom contained in the substrate having the crystal structure of a zinc blende, at least arsenide (As), antimony (Sb), or bismuth (Bi) can be cited. On a substrate that contains the atom of As, Sb, or Bi as an additive or a crystal, a convex part having a specific slope, which results from etching, as a flank thereof can be readily formed. Even when a crystal containing the atom of As, Sb, or Bi as an additive or a mixed crystal is re-grown on the convex part formed by performing etching, a non-growth surface such as a {111} B face having a group-V trimmer formed is likely to appear as an outermost layer of the substrate. Even in the embodiment of the present invention, the nature of the substrate is actively utilized in order to fabricate an SDH semiconductor laser. In the semiconductor light-emitting element or fabrication method thereof according to the first embodiment of the present invention, even when the material such as As, Sb, or Bi is adopted as a component element of a substrate having convex parts, or even when a crystal containing the material of As, Sb, or Bi as a component element is re-grown on the convex part, if designing (processing) is performed in order to suppress optical absorption by a substrate, which exhibits high optical absorbency, according to the wavelength of emitted light, high performance and uniformity that are the properties of a semiconductor light-emitting element can be attained. In the embodiment of the present invention, the {100} face is used as the principal surface of an element fabrication substrate. The principal surface encompasses a surface displaced by an off angle that may be 0° and a surface displaced by the off angle±5°. As the backing, the principal surface of the element fabrication substrate or the second compound semiconductor layer may be adopted.

For various compound semiconductor layers including an active layer, for example, GaN-system compound semiconductors (including an AlGaN mixed crystal, an AlGaInN mixed crystal, and a GaInN mixed crystal), GaInNAs-system compound semiconductors (including a GaInAs mixed crystal or a GaNAs mixed crystal), AlGaInP-system compound semiconductors, AlAs-system compound semiconductors, AlGaInAs-system compound semiconductors, AlGaAs-system compound semiconductors, GaInAs-system compound semiconductors, GaInAsP-system compound semiconductors, GaInP-system compound semiconductors, GaP-system compound semiconductors, InP-system compound semiconductors, InN-system compound semiconductors, and AlN-system compound semiconductors may be employed. As an n-type impurity to be added to a compound semiconductor layer, for example, silicon (Si), sulfide (S), selenium (Se), tellurium (Te), or tin (Sn) is cited. As a p-type impurity, carbon (C), zinc (Zn), magnesium (Mg), beryllium (Be), cadmium (Cd), calcium (Ca), or barium (Ba) is cited. The active layer may be formed with a single compound semiconductor layer or may have a single quantum well (QW) structure or a multiple quantum well (MQW) structure. As a method of forming various compound semiconductor layers including the active layer, a metalorganic chemical vapor deposition (MOCVD or MOVPE) method, a metalorganic molecular beam epitaxy (MOMBE) method, a hydride vapor phase epitaxy (HVPE) method in which halogen contributes to transport or reaction, or a plasma assisted physical vapor phase epitaxy (PPD) method may be adopted. The first conductivity type may be the n-type conductivity and the second conductivity type may be the p-type conductivity. Alternatively, the first conductivity type may be the p-type conductivity and the second conductivity type may be the n-type conductivity.

As a material to be made into the mask layer, a semiconductor oxide such as silicon dioxide ($SiO_2$), silicon nitride (SiN), or SiON, a metal or a high-melting point metal such as titanium (Ti), tungsten (W), nickel (Ni), gold (Au), or platinum (Pt), an alloy prepared with a mixture of these metals in an appropriate composition (for example, TiW, TiWCr, TiWNi, NiCr, TiNiCr, or an alloy made up of any of these alloys and gold (Au) or an alloy made up of any of these alloys and platinum (Pt)), a high-melting point metal (alloy) oxide, a high-melting point metal (alloy) nitride, a multilayer film produced by combining these different metals or alloys, an alloy oxide, and an alloy nitride, or a resist material may be adopted. As a method of forming the mask layer, a physical vapor phase deposition (PVD) method such as sputtering, a chemical vapor phase deposition (CVD) method, or a combination of a coating method and a lithographic technology or an etching technology may be adopted. For removal of the mask layer, a wet etching method, a dry etching method, or a resist stripping technology may be adopted depending on a material to be made into the mask layer. The mask layer may be one-dimensionally disposed like a belt or may be two-dimensionally disposed to be dotted or scattered in the form of a curved shape (circle or ellipse) or a polygonal shape (triangle, square, or hexagon). The mask layer may or may not be finally removed except the mask layer employed in the semiconductor light-emitting element fabrication method according to the third embodiment of the present invention. In the latter case, when the mask layer is left intact, the mask layer may be used as a mask layer for selective growth or a metal electrode layer to fabricate a light-emitting element represented by a semiconductor laser (LD) or a light-emitting diode (LED). Otherwise, the mask layer may be used as one of the components of the light-emitting element.

As the etching solution, a so-called citric acid/hydrogen peroxide water that is a mixture of citric acid and hydrogen peroxide water may be adopted. Acidum tartaricum, acetic acid, oxalic acid, formic acid, succinic acid, malic acid, adipic acid, or any other calboxylic acid may be substituted for citric acid. The etching solution may be replaced with another between formation of the convex-part upper layer and formation of the convex-part lower layer. Cleansing of an etched material with water may be performed between the formations. Otherwise, the formation of the convex-part upper layer and the formation of the convex-part lower layer may be performed using different etching apparatuses.

As a method of bonding the element fabrication substrate and supporting substrate with the second electrode between them, a metal-metal bonding method may be adopted. In this case, a semiconductor substrate or an insulating substrate having a conducting material layer (circuits may be formed in the conducting material layer) for metal-metal bonding as a face thereof may be adopted as the supporting substrate.

Herein, the insulating substrate refers to a substrate whose face is covered with an insulating material such as a resin, a resist, or a dielectric, or a substrate made of an insulating material such as a resin, a resist, or a dielectric. In consideration of the ease in forming chips after bonding or in dicing a wafer after bonding, adoption of a semiconductor substrate as the supporting substrate is preferred. For example, a GaAs substrate, a Ge substrate, a Si substrate, a SiC substrate, a GaP substrate, or an InP substrate may be adopted. Depending on specifications, a semiconductor substrate exhibiting n-type conductivity, a semiconductor substrate exhibiting p-type conductivity, or a semiconductor substrate exhibiting semi-insulation should be used for respective purposes. If an emphasis is put on heat dissipation, for example, a glass epoxy printed substrate, a metal-core substrate, or a ceramic substrate may be adopted. Otherwise, the substrate may be bonded directly to or mounted on a lead frame. As a material to be made into the conducting material layer, gold (Au), silver (Ag), titanium (Ti), tungsten (W), chromium (Cr), indium (In), aluminum (Al), boron (B), gallium (Ga), zinc (Zn), tin (Sn), or magnesium (Mg) are cited. Otherwise, an alloy of these metals may be adopted. Further, a metal oxide or nitride of any of these metals may be adopted. As the conducting material layer, a single-layer structure or laminated structure made of any of these materials may be adopted. Further, as a method of bonding the element fabrication substrate and supporting substrate with the second electrode between them, aside from the aforesaid metal-metal bonding method, a metal-dielectric bonding method, a metal-semiconductor bonding method, or a semiconductor-semiconductor bonding method may be adopted. The element fabrication substrate and supporting substrate may be bonded using an adhesive. The supporting substrate may be finally removed. As a method of removing the element fabrication substrate, a wet etching method or a dry etching method may be adopted.

In the semiconductor light-emitting element according to the embodiment of the present invention, the first compound semiconductor layer is electrically connected to the first electrode, and the second compound semiconductor layer is electrically connected to the second electrode. The first electrode may be formed on the first compound semiconductor layer or may be connected to the first compound semiconductor layer with a conducting element fabrication substrate between them. The second compound semiconductor layer may be formed on the top surface of the second compound semiconductor layer or may be connected to the second compound semiconductor layer with a conducting material layer between them. In the semiconductor light-emitting element fabricated according to the semiconductor light-emitting element fabrication method in accordance with the third embodiment of the present invention, the first compound semiconductor layer is electrically connected to the first electrode, and the second compound semiconductor layer is electrically connected to the second electrode. The first electrode may be formed on the first compound semiconductor layer or may be connected to the first compound semiconductor layer with the conducting material layer between them. The second compound semiconductor layer may be formed on the top surface of the second compound semiconductor layer or may be connected to the second compound semiconductor layer with the conducting material layer between them.

When the first conductivity type is n-type conductivity and the second conductivity type is p-type conductivity, the first electrode is an n-type side electrode and the second electrode is a p-type side electrode. When the first conductivity type is p-type conductivity and the second conductivity type is n-type conductivity, the first electrode is a p-type side electrode and the second electrode is an n-type side electrode. As the p-type side electrode, Au/AuZn, Au/Pt/Ti (/Au)/AuZn, Au/Pt/TiW(/Ti) (/Au)/AuZn, Au/AuPd, Au/Pt/Ti (/Au)/AuPd, Au/Pt/TiW(/Ti) (/Au)/AuPd, Au/Pt/Ti, Au/Pt/TiW(/Ti), or Au/Pt/TiW/Pd/TiW(/Ti) may be adopted. As the n-type side electrode, Au/Ni/AuGe, Au/Pt/Ti (/Au)/Ni/AuGe, or Au/Pt/TiW(/Ti)/Ni/AuGe may be adopted. Otherwise, an electrode structure having an Al layer, a Pd layer, or an Ag layer inserted as an interface between the metallic layers or inserted to the lowermost layer may be adopted. The composition of an alloy to be made into the n-type side electrode or p-type side electrode may be appropriately determined based on the material of the backing of the electrode for fear the backing may be damaged. A layer of a material written to be succeeded by a slash/is located to be electrically separated from the active layer. The first electrode may be made of a transparent conducting material such as ITO, IZO, ZnO:Al, or ZnO:B. Assuming that a layer made of the transparent conducting material is adopted as a current diffusion layer and the first electrode is realized with the n-type side electrode, the metal laminated structure described to be adopted in a case where the first electrode is realized with the p-type side electrode may be used in combination.

The first or second electrode or a second-electrode extension may be provided with a contact portion (pad portion) formed with a multilayer metal layer having a laminated construction of [an adhesive layer (Ti or Cr layer)]/[a barrier metal layer (Pt layer, Ni layer, TiW layer, or Mo layer)]/[a metal layer compatible with mounting (for example, an Au layer)], such as, a Ti layer/a Pt layer/an Au layer. The first electrode, the second electrode including the second-electrode extension, and the contact portion (pad portion) may be formed according to, for example, any of various PVD methods such as a vacuum evaporation method or a sputtering method, any of various chemical vapor-phase deposition (CVD) methods, or a plating method.

As the semiconductor light-emitting element according to the embodiment of the present invention, an edge-emission semiconductor laser (LD) or a light-emitting diode (LED) is cited. More practically, as the semiconductor light-emitting element in accordance with the first embodiment of the present invention or as the semiconductor light-emitting element produced according to the semiconductor light-emitting element fabrication method in accordance with the first embodiment, an SDH semiconductor laser is cited. As the semiconductor light-emitting element in accordance with the second or third embodiment of the present invention or as the semiconductor light-emitting element produced according to the semiconductor light-emitting element fabrication method in accordance with the second embodiment of the present invention, the aforesaid SAN semiconductor layer or ISAN semiconductor layer is cited. As the semiconductor light-emitting element produced according to the semiconductor light-emitting element fabrication method in accordance with the third embodiment of the present invention, the SDH semiconductor laser is cited. The convex part formed on the backing according to the first or second embodiment of the present invention or the convex-part formation method according to the embodiment of the present invention can be applied to, for example, a buried heterostructure laser and a fabrication method thereof, a surface-emission laser element and a fabrication method thereof, a heterojunction bipolar transistor and a fabrication method thereof, a photodiode and a fabrication method thereof, or a solar cell and a fabrication method thereof. The convex-part formation method in accordance with the embodiment of the present invention can be applied to all fabrication methods or fabrication technologies that need a high etching control technology for control of the width and height of the convex part made of a semiconductor material.

According to the embodiment of the present invention, since a convex part having at least two layers of the convex-part upper layer and convex-part lower layer is formed, the freedom in designing the height of the convex part (an etching depth in a backing or an element fabrication substrate) or the width of the top surface of the convex part can be improved, and the freedom in designing a semiconductor light-emitting element can be improved. As a result, the semiconductor light-emitting element that meets various specifications and requests can be provided. When one etching solution is employed, the convex part having at least the two layers of the convex-part upper layer and convex-part lower layer can be formed merely by changing the temperature of the etching solution. Therefore, the convex part having a large height can be formed by following simple steps. The side surface of the convex-part upper layer can be said to be a crystal face effective in stabilizing wet etching. The side surfaces of the mask layer and convex-part upper layer may be used as an etching mask. Therefore, a variance in a dimension of any of the layers included in the convex part within one element fabrication substrate (intra-surface variance) can be minimized. As a result, a semiconductor light-emitting element or any other various elements having homogeneous properties can be fabricated.

In the semiconductor light-emitting element fabrication method according to the third embodiment of the present invention, since the element fabrication substrate is removed, light generated in the active layer will not be absorbed by the element fabrication substrate. As a result, occurrence of a problem that light-emitting efficiency is degraded can be prevented, and high-density integration of semiconductor light-emitting elements can be achieved. Further, since the element fabrication substrate is removed, a series resistance of a semiconductor light-emitting element can be reduced.

BRIEF DESCRIPTION OF THE DRAWINGS

FIG. 1 is a partial sectional view illustratively showing a convex part in accordance with an example 1;

FIG. 2A and FIG. 2B are partial sectional views illustratively showing an SDH semiconductor laser that is a semiconductor light-emitting element in accordance with the example 1;

FIG. 3A to FIG. 3C are partial sectional views illustratively showing an element fabrication substrate so as to explain a semiconductor light-emitting element fabrication method in accordance with the example 1;

FIG. 9A and FIG. 9B are partial sectional views illustratively showing an element fabrication substrate so as to explain a semiconductor light-emitting element fabrication method in accordance with the example 2;

DETAILED DESCRIPTION OF THE INVENTION

Figure 4A:
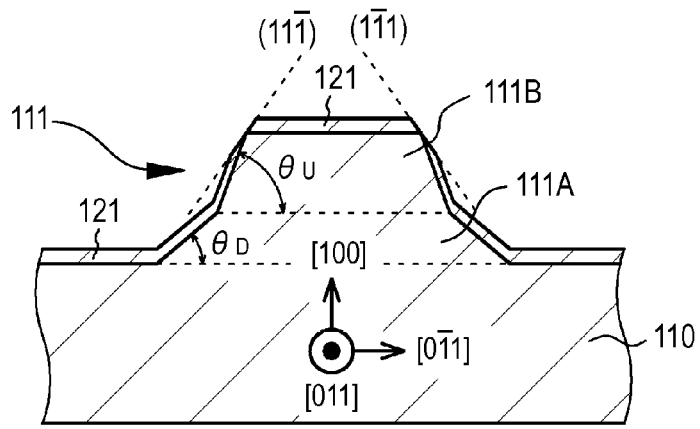
FIG. 4A to FIG. 4C are partial sectional views illustratively showing an element fabrication substrate so as to present a process, in the course of which a laminated structure crystallographically grows, within fabrication of the semiconductor light-emitting element in accordance with the example 1.

Referring to the drawings, the present invention will be described below in relation to examples.

Example 1

An example 1 relates to a convex part formation method in accordance with the embodiment of the present invention, a convex part formed on a backing according to the first embodiment of the present invention, and a semiconductor light-emitting element and a fabrication method thereof in accordance with the first embodiment of the present invention.

As shown in the illustrative partial sectional view of FIG. 1, a convex part 111 is formed on a backing whose top surface is a {100} face (or more particularly, a (100) face) (the same applies to a description to be made below), and extended in parallel with a <110> direction of the backing. In the example 1, the backing is an element fabrication substrate 110, and the convex part 111 in accordance with the example 1 formed on the element fabrication substrate 110 is formed on the principal surface of the element fabrication substrate 110 having the {100} face as the principal surface thereof, and extended in parallel with the <110> direction of the element fabrication substrate 110. The convex part has a two-layer structure including a convex-part lower layer 111A and a convex-part upper layer 111B.

A semiconductor light-emitting element in accordance with the example 1 is a semiconductor laser, more particularly, an SDH semiconductor laser. The semiconductor light-emitting element includes, as shown in the illustrative partial sectional view of FIG. 2A:

(a) a convex part (projection) 111 that is formed on the principal surface of the element fabrication substrate 110 having the {100} face as the principal surface thereof, and extended in parallel with the <110> direction of the element fabrication substrate 110 (more particularly, for example, a direction) (the same applies to a description to be made below);

(b) a light-emitting portion 120 formed on the top surface of the convex part 111 by sequentially accumulating a first compound semiconductor layer 121 exhibiting a first conductivity type (in the example 1, more particularly, n-type conductivity), an active layer 123, and a second compound semiconductor layer 122 exhibiting a second conductivity type (in the example 1, more particularly, p-type conductivity); and (c) a laminated structure 120' that is formed on part of the principal surface of the element fabrication substrate 110 on which the convex part is not formed (which may be called a concave-part surface or bared surface of the element fabrication substrate 110) and that has the first compound semiconductor layer 121 exhibiting the first conductivity type (n-type conductivity), the active layer 123, and the second compound semiconductor layer 122 exhibiting the second conductivity type (p-type conductivity) sequentially accumulated; and a current block layer 140 that is formed on the laminated structure 120' and shields at least the side surface of the active layer 123 included in the light-emitting portion 120. The convex part 111 has a two-layer structure including the convex-part lower layer 111A and convex-part upper layer 111B.

In the example 1, the sectional shape of the convex-part upper layer 111B cut on a {110} face (more particularly, a (011) face) (the same applies to a description to be made later) is an isosceles trapezoid whose base is longer than the upper side thereof. The sectional shape of the convex-part lower layer 111A cut on the {110} face is an isosceles trapezoid whose base is longer than the upper side thereof. The base of the sectional shape of the convex-part upper layer 111B cut on the {110} face corresponds to the upper side of the sectional shape of the convex-part lower layer 111A cut on the {110} face.

In the example 1, assuming that $\theta_U$ denotes the inclination of the side surface 111b of the convex-part upper layer 111B, $\theta_D$ denotes the inclination of the side surface 111a of the convex-part lower layer 111A, and $\theta_{111B}$ denotes the inclination of the flank of the convex part corresponding to a {111} B face, $\theta_D \neq \theta_U$, or more particularly, $\theta_D < \theta_{111B} \theta_U$ (where $\theta_D \neq \theta_U$) is satisfied. More particularly, $\theta_D < \theta_{111B} < \theta_U$ is satisfied. Still more particularly, in the example 1, $\theta_{111B}$ equals 54.7°, $\theta_D$ equals 50°, and $\theta_U$ equals 60°.

In the example 1, assuming that $H_U$ denotes the thickness of the convex-part upper layer 111B, $H_D$ denotes the thickness of the convex-part lower layer 111A, and $W_U$ denotes the width of the convex-part upper layer 111B, $H_U/(H_U+H_D) \geq 0.5$ and $(H_U+H_D)/W_U \geq 0.4$ are satisfied. More particularly, $H_U$ equals 2 μm, $H_D$ equals 2 μm, and $W_U$ equals 4 μm.

In the semiconductor light-emitting element according to the example 1, the first compound semiconductor layer 121, active layer 123, and second compound semiconductor layer 122A are sequentially formed on the top surface of the convex-part upper layer 111B. A second compound semiconductor layer 122B is further formed on the second compound semiconductor layer 122A, whereby the apex of the convex part is formed. The sectional shape of the light-emitting portion 120, which includes the second compound semiconductor layer 122B and is cut on the {110} face is an isosceles triangle. The flank of the light-emitting portion 120 is constructed with a {111} B face (more particularly, a (11-1) B face and a (1-11) B face). By changing the compositions of the second compound semiconductor layer 122A and second compound semiconductor layer 122B respectively, the light-emitting portion 120 whose sectional shape is an isosceles triangle can be accurately formed. In general, according to the MOCVD method (may be called the MOVPE method), the {111} B face is known as a non-growth face covered with an arsenide (As) trimmer except that it is under a special condition for crystal growth. Therefore, in the case of the SDH semiconductor laser, once the light-emitting portion 120 whose slope (flank) corresponds to the {111} B face is formed, even when MOCVD is continued thereafter, the crystal growth of the light-emitting portion 120 is retained in a self-growth suspended stage. The angle $\theta_{111B}$ of the {111} B face is 54.7°.

On the {100} face corresponding to the concave-part surface of the element fabrication substrate 110 ((100) face in the drawing), the laminated structure 120' having the same structure as the light-emitting portion 120, a current block layer position adjustment layer 130 (substantially, an extension of the second compound semiconductor layer 122), a current block layer 140, and a buried layer (embedding clad layer) 131 are sequentially formed. The entire surface of the element fabrication substrate 110 is covered with a contact (cap) layer 132 made of GaAs exhibiting the second conductivity type. In the example 1, the element fabrication substrate 110 including the convex part 111 is made of n-GaAs. Further, a first electrode 151 electrically connected to the first compound semiconductor layer 121 (specifically, the first electrode 151 formed on the back of the element fabrication substrate 110 exhibiting conductivity) is made of Ti/TiW/Pt/Au. A second electrode 152 electrically connected to the second compound semiconductor layer 122 (specifically, a second electrode 152 formed above the second compound semiconductor layer 122, or more specifically, on the contact layer (cap layer) 132) is made of Au/Ni/AuGe or Au/AuZn.

Table 1 lists the compositions of the compound semiconductor layers included in the light-emitting portion 120 and laminated structure 120'. Incidentally, "Zn, Mg, C" signifies that zinc (Zn), magnesium (Mg), or carbon (C) may be added as an impurity.

TABLE 1

(Construction of the light-emitting portion)
Second compound semiconductor layer 122B:

p-$Al_{0.47}Ga_{0.53}As$:Zn,Mg,C
Second compound semiconductor layer 122A:

p-$Al_{0.4}Ga_{0.6}As$:Zn,Mg,C
Active layer 123: active layer-A
First compound semiconductor layer 121:

n-$Al_{0.4}Ga_{0.6}As$:Si
(Construction of a current block portion)

Buried layer 131: p-$Al_{0.47}Ga_{0.53}As$:Zn,Mg,C
Current block layer 140: n-$Al_{0.47}Ga_{0.53}As$:Si
Current block layer position adjustment layer 130:

p-$Al_{0.47}Ga_{0.53}As$:Zn,Mg,C
(Active layer-A)

Confinement layer: p-$Al_{0.3}Ga_{0.7}As$:Zn,Mg,C
Confinement layer: i-$Al_{0.3}Ga_{0.7}As$
Multiple quantum well structure:

i-$Al_{0.1}Ga_{0.9}As$ (well layer), i-$Al_{0.3}Ga_{0.7}As$
(barrier layer), and i-$Al_{0.1}Ga_{0.9}As$ (well layer)
Confinement layer: i-$Al_{0.3}Ga_{0.7}As$
Confinement layer: n-$Al_{0.3}Ga_{0.7}As$:Si The compound semiconductor layer forming part of the current block layer 140 includes, as shown in FIG. 2B, a {311} B crystal face region extended from the flank of the light-emitting portion 120 (more specifically, (31-1) B and (3-11) B faces), a {100} crystal face region extended along the principal surface of the element fabrication substrate 110, and a {h11} B crystal face region interposed between the {311} B crystal face region and {100} crystal face region (more specifically, {h1-1} B and {h-11} B faces where h denotes an integer equal to or larger than 4). Incidentally, the {h11} B crystal face region (where h denotes an integer equal to or larger than 4) may be, for convenience' sake, referred to as a high-order crystal face region.

In the semiconductor light-emitting element according to the example 1, the active layer 123 formed on the convex part 111 has the lateral directions (side surface) thereof enclosed with the current block layer 140 whose refractive index is lower than that of the active layer 123, and has the up-and-down directions thereof enclosed with the first compound semiconductor layer 121 and second compound semiconductor layers 122A and 122B whose refractive indices are lower than that of the active layer 123. Therefore, a perfect light confinement structure is constructed in the up-and-down directions and lateral directions of the active layer 123. Above the concave-part surface of the element fabrication substrate 110, a so-called thyristor structure that is a p-n-p-n structure (p-type buried layer 131—n-type current block layer 140—p-type current block layer position adjustment layer 130—n-type first compound semiconductor layer 121) is formed near the side surface of the active layer 123. Therefore, flow of a current on the concave-part surface of the element fabrication substrate is hindered. Eventually, a current is concentrated on the active layer 123, whereby a low-threshold current can be attained.

A convex-part formation method in accordance with the example 1 for forming the convex part, which extends in parallel with the <110> direction of the backing, on the backing that has the {100} face as the top surface thereof, and the semiconductor light-emitting element and fabrication method thereof in accordance with the example 1 will be described below.

[Step 100]

To begin with, the convex part 111 extending in parallel with the <110> direction of the element fabrication substrate 110 is formed on the principal surface of the element fabrication substrate 110 having the {100} face as the principal surface thereof. Hereinafter, step 100 will be described to fall into sub-steps 100A to 100C.

[Sub-step 100A]

First, a mask layer 161 extending in parallel with the <110> direction is formed on the principal surface of the element fabrication substrate 110. Otherwise, the mask layer 161 extending in parallel with the <110> direction is formed on the backing. Specifically, in the example 1, after the mask layer 161 made of $SiO_2$ is formed on the principal surface of the element fabrication substrate 110 (backing) according to the CVD method, the mask layer 161 extending in parallel with the <110> direction (more particularly, a [011] A direction) is formed on the principal surface of the element fabrication substrate 110 having the {100} surface as the principal surface thereof (see FIG. 3A).

[Sub-step 100B]

Thereafter, the mask layer 161 is used as an etching mask to etch the principal surface of the element fabrication substrate 110 (bared part of the principal surface of the element fabrication substrate 110) according to a wet etching method that employs an etching solution. Citric acid/hydrogen peroxide water containing citric acid, pure water, and hydrogen peroxide water at a volume ratio of 3:2:2 is adopted as the etching solution, and wet etching is performed with the etching solution held at the temperature ranging from 6° C. to 9° C. As a result, as shown in FIG. 3B, the convex-part upper layer 111B whose sectional shape on the cutting plane corresponding to the {110} face is an isosceles trapezoid, the base of which is longer than the upper side thereof, and the side surface 111b of which has an inclination of $\theta_U$ is formed.

[Sub-step 100C]

Thereafter, the temperature of the etching solution is changed, and the mask layer 161 and the side surface 111b of the convex-part upper layer 111B are used as an etching mask to etch the principal surface of the element fabrication substrate (backing) according to a wet etching method. Specifically, citric acid/hydrogen peroxide water having the aforesaid composition is used to perform wet etching with the etching solution set to the temperature ranging from 2° C. to 5° C. Incidentally, the side surface 111b of the convex-part upper layer 111B obtained at sub-step 100B corresponds to a crystal face effective in stabilizing wet etching. The mask layer 161 and the side surface 111b of the convex-part upper layer 111B can be used as an etching mask to perform wet etching. At sub-step 100C, the side surface 111b of the convex-part upper layer 111B is not etched. Thus, the convex-part lower layer 111A whose sectional shape on a cutting plane corresponding to a {110} face is an isosceles trapezoid, the base of which is longer than the upper side, and the side surface 111a of which has an inclination of $\theta_D$ (where $\theta_D \neq \theta_U$) can be formed (see FIG. 3C). Since the temperature of the etching solution employed at sub-step 100B is higher than the temperature thereof employed at sub-step 100C, $\theta_D < \theta_{111B} < \theta_U$ is established. Thus, the convex part 111 that extends in a [011]A direction, has a desired top-surface width and an overall height, and has a double trapezoidal shape is formed. The width direction of the convex part 111 is parallel with a [0-11]B direction.

[Step 110]

After the mask layer 161 is removed according to the wet etching method, a light-emitting portion 120 that has a first compound semiconductor layer 121 exhibiting a first conductivity type, an active layer 123, and a second compound semiconductor layer 122 exhibiting a second conductivity type sequentially accumulated is formed on the top surface of the convex part 111. Concurrently, on part of the principal surface of the element fabrication substrate 110 on which the convex part 111 is not formed (concave-part surface or bared surface), a laminated structure 120' that has the first compound semiconductor layer 121 exhibiting the first conductivity type, the active layer 123, and the second compound semiconductor layer 122 exhibiting the second conductivity type sequentially accumulated is formed.

To be more specific, the compound semiconductor layers are formed according to the MOCVD method. According to the MOCVD method, for example, trimethylaluminum (TMAl) or triethylaluminum (TEAl) is adopted as an aluminum (Al) source raw-material gas. Trimethylgallium (TMGa) or triethylgallium (TEGa) is adopted as a gallium (Ga) source raw-material gas, and tertiary-butyl arsine (TBAs) or arsenic hydride ($AsH_3$) is adopted as an arsenic (As) source raw-material gas. As a gas for doping an n-type impurity, disilane ($Si_2H_6$), monosilane ($SiH_4$), trimethyltin (TMSn), hydrogen sulfide ($H_2S$), hydrogen selenide ($H_2Se$), or hydrogen telluride ($H_2Te$) may be adopted. As a gas for doping a p-type impurity, for example, trimethylzinc (TmZn), triethylzinc (TEZn), bis (cyclopentadienyl) magnesium ($Cp_2Mg$), bis (ethyl-cyclopentadienyl) magnesium ($EtCp_2Mg$), bis (iso-prophyl-cyclopentadienyl) magnesium (i-$PrCp_2Mg$), bis (methyl-cyclopentadienyl) magnesium ($MeCp_2Mg$), trimethylmangan (TMMn), carbon tetrachloride ($CCl_4$), carbon tetrabromide ($CBr_4$), or carbon tetraiodide ($CI_4$) may be adopted. As mentioned above, according to the MOCVD method, any of these group-III gases, group-V gases, and impurity gases is introduced into a reaction chamber, thermally decomposed and reacted within a temperature range from 600° C. to 900° C. in order to induce crystal growth. Eventually, the first compound semiconductor layer 121, active layer 123, and second compound semiconductor layers 122A and 122B are epitaxially grown on the top surface of the convex-part upper layer 111B, on the flank of the convex part 111, and on the concave-part surface of the element fabrication substrate 110.

Figure 4B:
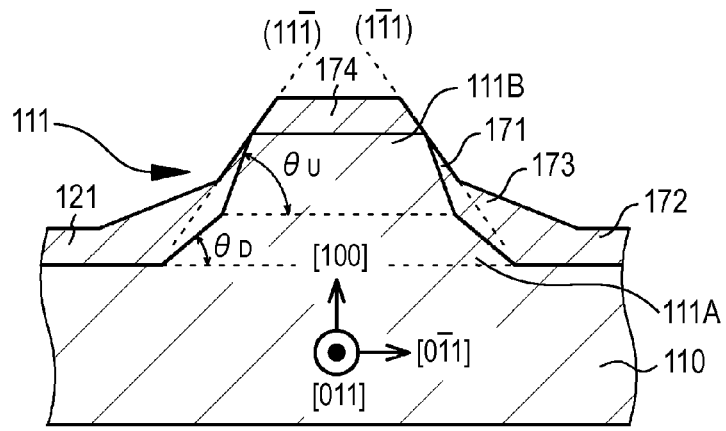
Figure 4C:
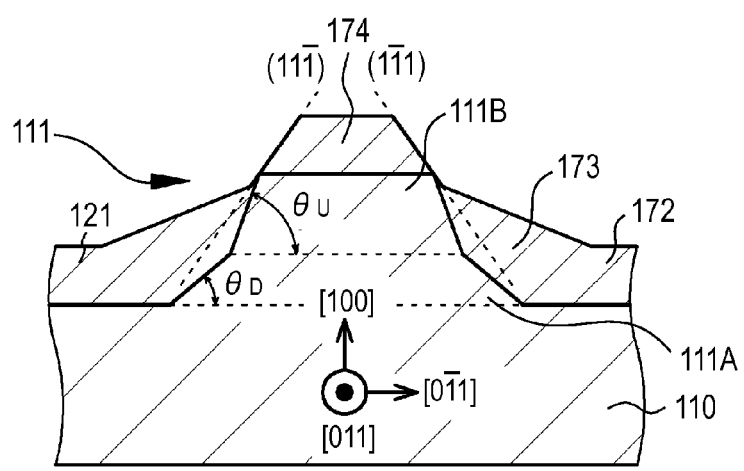

The flank of the convex part 111 is not a {111} B face but is a crystal growth face. Therefore, the first compound semiconductor layer 121, active layer 123, and second compound semiconductor layers 122A and 122B sequentially crystallographically grow. In other words, as illustratively shown in FIG. 4A to FIG. 4C, the side surfaces 111b and 111a constituting the flank of the convex part 111 is not the {111} B non-growth faces, both the side surfaces 111b and 111a crystallographically grow during crystal growth of the flank. In particularly, as shown in FIG. 4A to FIG. 4C, when the side surface 111b meeting $\theta_{111b} \leq \theta_U$ crystallographically grows, the crystal growth makes progress with the inclination ($\theta_U$) retained. At this time, the crystal growth continues while the {111} B non-growth face is produced on the side surface (see FIG. 4A). On the side surface 111a that is the other side surface included in the flank, if $\theta_D \leq \theta_{111B}$ is satisfied, since the {111} B non-growth face is not produced, the side surface 111a crystallographically grows while keeping the inclination ($\theta_D$).

In reality, when the crystal growth of the side surface 111b and the crystal growth of the side surface 111a make progress simultaneously, the side surface 111b having the inclination $\theta_U$ crystallographically grows and has the {111} B non-growth face produced thereon at the same time. Therefore, since the side surface 111b is sandwiched between the {111} B non-growth face and the crystallographically growing side surface 111a, the area occupied by the side surface 111b having the inclination $\theta_U$ gradually decreases or may disappear. Namely, the side surface 111b may be covered with another crystal face. This state shall be, for convenience' sake, called a disappearance pattern I. Before the side surface 11b having the inclination $\theta_U$ disappears, the side surface 11a may be covered with a newly grown {311} B face (equivalent to a compound semiconductor layer 173). The side surface 111a may then disappear. The area occupied by the side surface 111b having the inclination $\theta_U$ may gradually decrease and disappear along with the crystal growth of the {311} B faces (compound semiconductor layer 173) and the crystal growth of the {111} B non-growth face. This state shall be, for convenience' sake, called a disappearance pattern 2. As mentioned above, at the time point when either the side surface 111b having the inclination $\theta_U$ or the side surface 111a disappears first, the flank is formed with the side surface 111a having the inclination $\theta_D$ and the {111} B non-growth face. Otherwise, the flank is formed with the {311} B face (compound semiconductor layer 173) and the side surface 111b having the inclination $\theta_U$. This state is equivalent to an intermediate state between the states shown in FIG. 4A and FIG. 4B, though it is not shown.

Thereafter, in the case of the disappearance pattern I, the remaining side surface 111a keeps crystallographically growing while retaining the inclination $\theta_D$ thereof as if it buries the {111} B non-growth face produced during the crystal growth of the side surface 111b, and gradually occupies the {111} B non-growth face. However, the side surface 111a that crystallographically grows while retaining the inclination $\theta_D$ thereof is rapidly caught up with by the crystal growth of the {311} B face generated at the lowermost end (compound semiconductor layer 173). Therefore, finally, the flank of the convex part is formed with the {311} B face and {111} B non-growth face. In contrast, in the case of the disappearance pattern 2, the remaining side surface 111b crystallographically grows while retaining the inclination $\theta_U$ thereof. However, since the side surface 111b is sandwiched between the {111} B non-growth face produced along with the crystal growth of the side surface 111b and the {311} B growth face causing the side surface 111a to disappear, the side surface 11b loses the occupied area and disappears. Finally, the flank of the convex part is therefore formed with the {311} B face and {111} B non-growth face. FIG. 4B shows the final form attained in the case of the disappearance pattern 1 or 2. The compound semiconductor layer 173 having the {311} B face bared as the outermost surface thereof is shown to lie on the interface between the compound semiconductor layer 171 and compound semiconductor layer 172. In contrast, the top surface of the convex-part upper layer 111B and the concave-part surface of the element fabrication substrate 110 are {100} faces. Therefore, generation or disappearance of a special crystal face will not occur on the top surface of the convex-part upper layer 111B and the concave-part surface of the element fabrication substrate 110. The compound semiconductor layers are merely sequentially accumulated.

After formation of the light-emitting portion 120 and laminated structure 120' is initiated, crystal growth of a compound semiconductor layer begins concurrently at three major positions, that is, on the compound semiconductor layer on the flank of the convex parts 111, on the compound semiconductor layer on the top surface of the convex-part upper layer 111B, and on the compound semiconductor layer on the concave-part surface of the element fabrication substrate 110. Finally, as mentioned above, the compound semiconductor layer 171 whose surface is constructed with a {111} B face is formed on the flank of the convex part 111 along with the crystal growth of the compound semiconductor layer on the flank of the convex part 111. The compound semiconductor layer 172 whose surface is constructed with a {100} face is formed on the concave-part surface of the element fabrication substrate 110. On the top surface of the convex-part upper layer 111B, a compound semiconductor layer 174 whose surface is constructed with the {100} face is formed along with formation of a {111} B non-growth face. The formation of the {111} B non-growth face is, as mentioned above, independent of the crystal growth of the side surface 111$b$ accompanied by formation of the {111} B non-growth face, and takes place at a different position.

Figure 5:
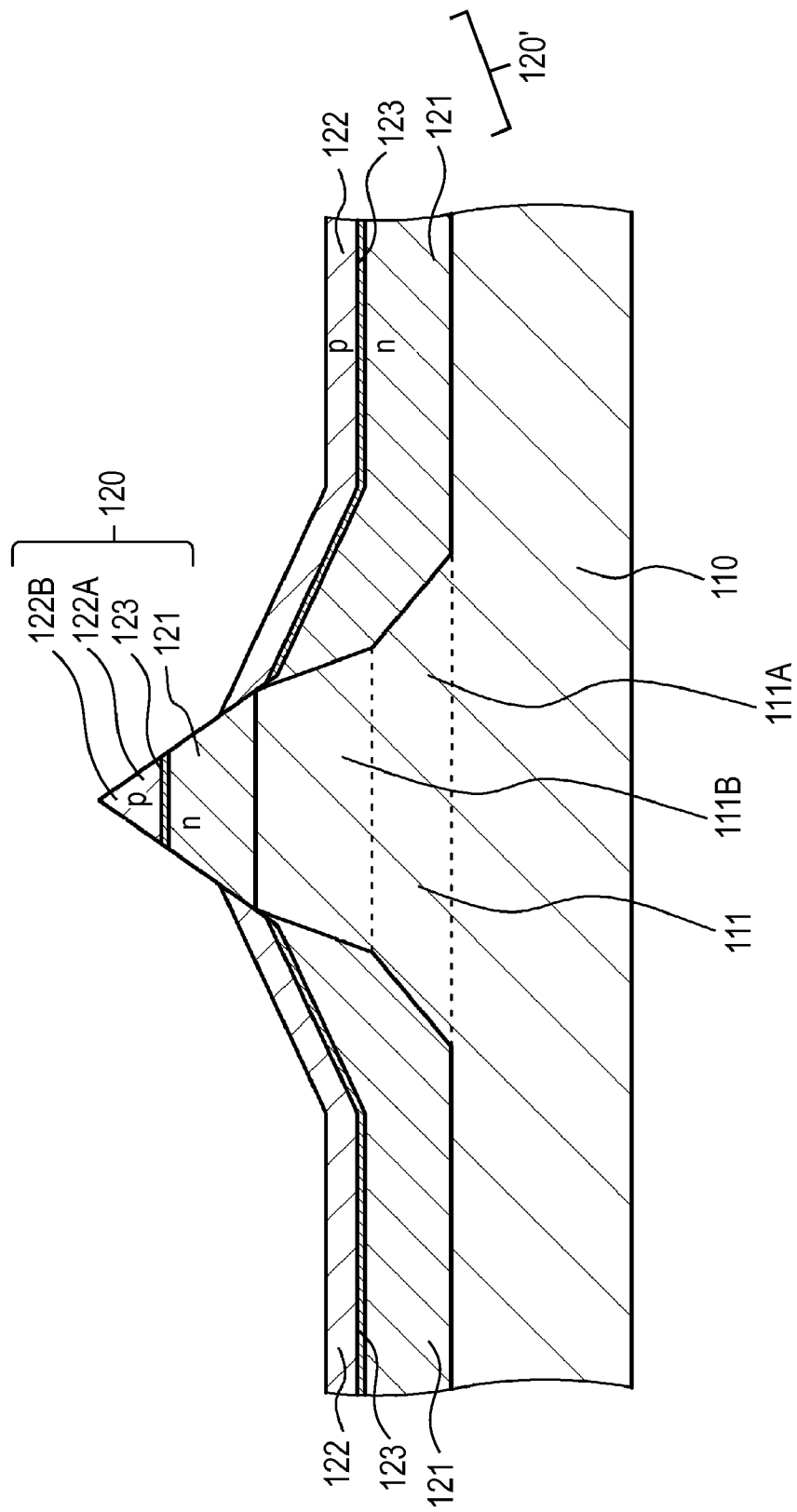
FIG. 5 is a partial sectional view illustratively showing the element fabrication substrate, which is observed at a step succeeding the step of FIG. 4C, so as to explain the semiconductor light-emitting element fabrication method in accordance with the example 1.

As shown in FIG. 4C, finally, all the crystal growths around the convex part 111, that is, the crystal growths at three positions, that is, on the compound semiconductor layer 172, on the compound semiconductor layer 173, and on the compound semiconductor layer 174 make progress. As a result, since the {111} B face is a non-growth face, the first compound semiconductor layer 121, active layer 123, and second compound semiconductor layers 122A and 122B are formed (accumulated) while being isolated from the region above the convex part 111 and the region on the concave-part surface of the element fabrication substrate 110. Thus, a structure shown in FIG. 5 ensues. As long as the ratio of the width $W_U$ of the top surface of the convex part 111 to the height $(H_U+H_D)$ of the convex part 111 is appropriately determined, when the light-emitting portion whose sectional shape is an isosceles triangle has been completed, the position (height) of the second compound semiconductor layer 122 becomes, as shown in FIG. 5, lower than the position (height) of the active layer 123. As a result, a current block layer can be reliably formed on the side surface of the active layer 123. Eventually, a current path can be concentrated on the active layer. As long as the ratio of the height $H_U$ to the height $H_D$ in the height $(H_U+H_D)$ is appropriately determined, the timing at which the two side surfaces 111$b$ and 111$a$ disappear may come earlier or the order in which the side surfaces 111$b$ and 111$a$ disappear may be controllable. Assuming that the timing of causing the side surface 111$a$, which crystallographically grows with the inclination $\theta_D$ thereof retained, to disappear lags, and the side surface 111$a$ remains as it is, if the crystal growths of the other surfaces continue, although the side surface 111$a$ may finally disappear, a plane having the inclination $\theta_D$ may be interposed in the form of spikes between the current block layer 140 and the side surface of the active layer 123. If such a structure is formed, a current leakage ensues. Therefore, the ratio of the height $H_U$ to the height $H_D$ in the height $(H_U+H_D)$ plays a pivotal role in preventing the current leakage. Once the thicknesses of the first compound semiconductor layer 121, active layer 123, and second compound semiconductor layers 122A and 122B on the top surface of the convex part 111 are appropriately determined, the laminated structure of the light-emitting portion 120 whose section has two sides thereof defined with {111} B non-growth faces and is shaped like an isosceles triangle can be produced on the convex part 111.

[Step 120]

Figure 6:
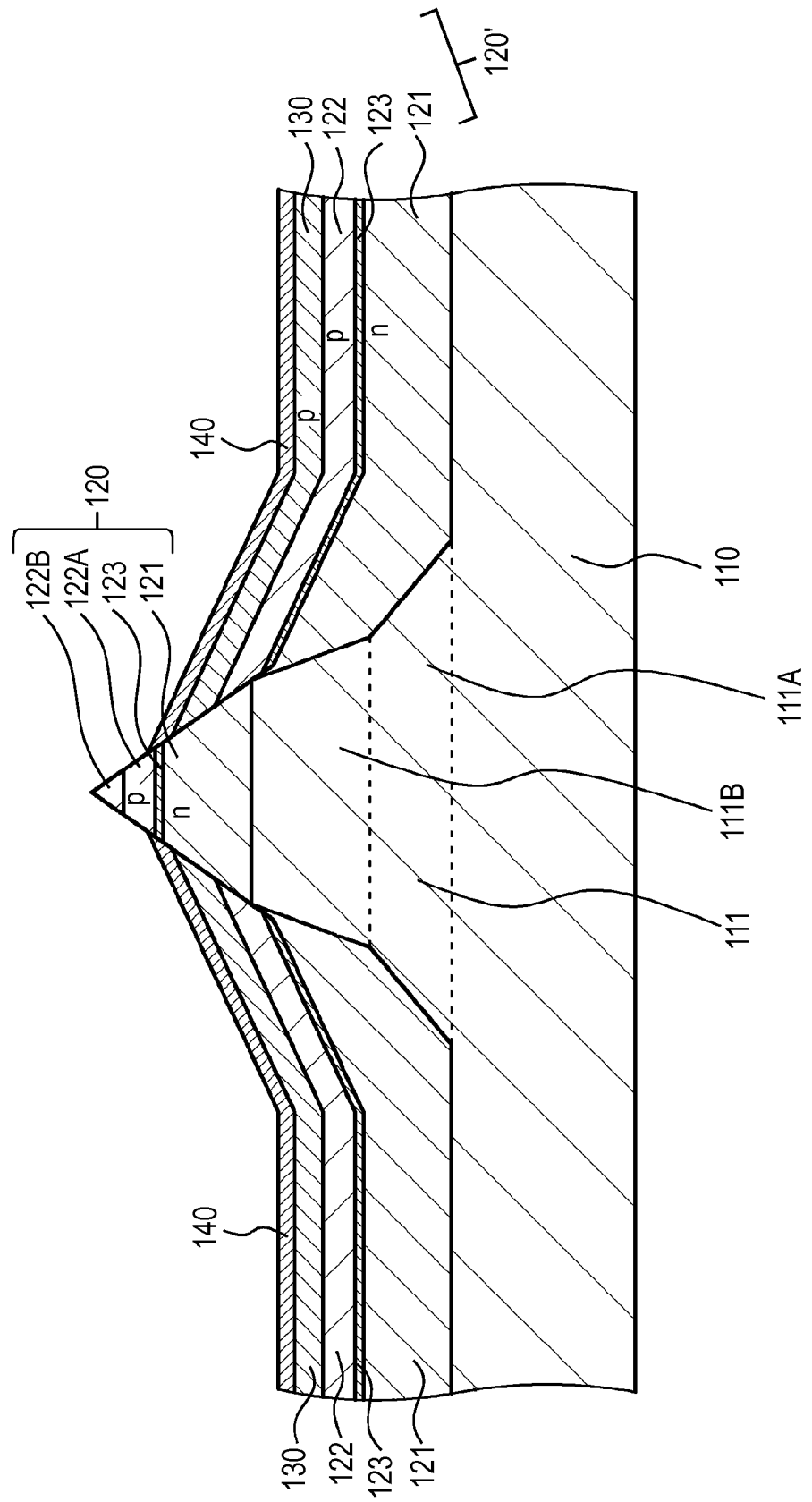
FIG. 6 is a partial sectional view illustratively showing an element fabrication substrate, which is observed at a step succeeding the step of FIG. 6, so as to explain the semiconductor light-emitting element fabrication method in accordance with the example 1.

Thereafter, the current block layer 140 that shields at least the side surface of the active layer 123 included in the light-emitting portion 120 is formed on the laminated structure 120'. Specifically, successively to the formation of the second compound semiconductor layer 122B, the current block layer position adjustment layer 130 is formed on the entire surface of the second compound semiconductor layer 122B according to the MOCVD method. Further, for example, the current block layer 140 is formed according to the MOCVD method (see FIG. 6). The current block layer 140 does not crystallographically grow on a {111} B face. In addition, the current block layer 140 is formed so that the end surface of the current block layer 140 will shield at least the side surface of the active layer 123. The construction or structure can be realized by appropriately determining the width $W_U$ of the top surface of the convex-part upper layer 111B, the height $(H_U+H_D)$ of the convex part 111, and the thickness of the current block layer position adjustment layer 130. An effect to be exerted this time is as described above.

[Step 130]

Thereafter, the buried layer 131 and contact layer (cap layer) 132 are sequentially formed on the entire surface of the current block layer 140 according to the MOCVD method. If MOCVD continues, the buried layer 131 made of a compound semiconductor that crystallographically grows above the convex-part surface of the element fabrication substrate 110 will fully bury the light-emitting portion 120 whose self-growth is suspended. Thereafter, the second electrode 152 is formed on the contact layer 132 according to a vacuum evaporation method. After the element fabrication substrate 110 has the back side thereof wrapped to have an appropriate thickness, the first electrode 151 is formed according to the vacuum evaporation method.

[Step 150]

Thereafter, semiconductor light-emitting elements are separated from one another. Thus, the semiconductor light-emitting element in accordance with the present example is fabricated. The semiconductor light-emitting elements may be separated from one another one by one. Alternatively, the semiconductor light-emitting elements may be grouped in units of multiple elements (for example, in fours, eights, sixteens, thirty-twos, or sixty-fours), and the groups may be separated from one another.

In the example 1, the convex part 111 is formed in order to form the light-emitting portion 120. The convex part 111 has a two-layer structure including the convex-part upper layer 111B and convex-part lower layer 111A. The width $W_U$ of the top surface of the convex-part upper layer 111B, the height $H_U$ of the convex-part upper layer 111B, and the height $H_D$ of the convex-part lower layer 111A can be set to an appropriate combination of values selected from among a variety of sets of values. Therefore, the light-emitting portion can be designed so that when the active layer 123 having a desired width is formed above the narrow convex part 111, the distance from the active layer 123 to the convex part 111 will be long. Light generated by the active layer 123 will therefore not be absorbed by the convex part 111. As a result, occurrence of a problem that light-emitting efficiency is degraded can be suppressed. As mentioned above, the height (size) of the light-emitting portion 20 is restricted by the width $W_U$ of the convex-part upper layer 111B. An aspect ratio {(H$_U$+H$_D$)/W$_U$}, that is, the ratio of the height (H$_U$+H$_D$) from the concave-part surface of the element fabrication substrate 110 to the top surface of the convex part 111 to the width W$_U$ of the top surface can be adjusted to fall within a desired range of aspect ratios by controlling wet etching of the element fabrication substrate 110. In other words, although the aspect ratio (for example, a quotient of the height by the width) of the convex part 111 with respect to the desired width of the active layer 123 has to be confined to a certain range, the freedom in designing the aspect ratio is high. Therefore, when the aspect ratio is optimized, the problem that the current block layer 140 may not be formed on the side surface of the active layer 123 can be suppressed. In the past, the aspect ratio of a concavo-convex substrate obtained by etching the element fabrication substrate 110 (etching whose control fluctuates) has varied within the element fabrication substrate in terms of the width or height of the convex part. This results in a problem that the current block layer is not formed on the side surface of the active layer, which is included in the light-emitting portion formed on the top surface of the convex part, in a region on part of the element fabrication substrate. However, in the example 1, a desired aspect ratio of the convex part 111 can be attained in relation to a desired width of the active layer 123 by controlling wet etching to be performed on the element fabrication substrate 110. The intra-surface uniformity in the concavo-convex structure within the element fabrication substrate can be drastically improved. Further, even when a formation pitch for the convex part 111 is reduced in order to attain high-density integration, the distance from the active layer 123 to the convex part 111 can be optimized for fear light generated by the active layer 123 may be absorbed by the convex part 111. A problem that light-emitting efficiency is degraded can be suppressed. The aspect ratio of the convex part 111 can be controlled into a desired range of aspect ratios. Therefore, occurrence of the problem that the current block layer 140 may not be formed on the side surface of the active layer 123 can be suppressed. As a result, high-density integration of semiconductor light-emitting elements can be attained.

Example 2

The example 2 relates to a variant of the convex part formation method in accordance with the embodiment of the present invention, a variant of the convex part formed on a backing according to the first embodiment of the present invention, a semiconductor light-emitting element in accordance with the second embodiment of the present invention, and a semiconductor light-emitting element fabrication method in accordance with the second embodiment of the present invention.

Figure 7:
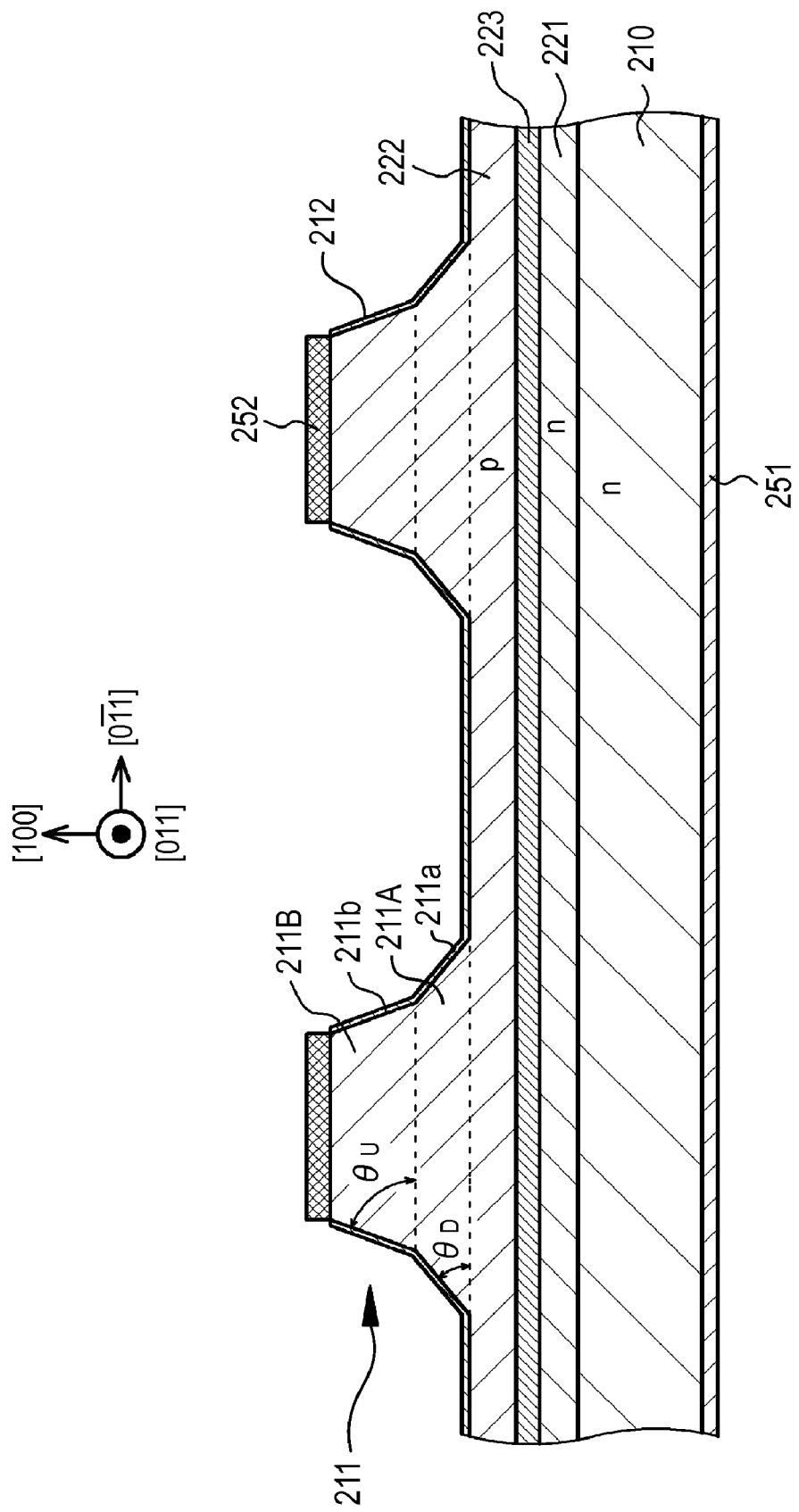
FIG. 7 is a partial sectional view illustratively showing an ISAN semiconductor laser that is a semiconductor light-emitting element in accordance with an example 2.

As shown in an illustrative partial sectional view of FIG. 7, a convex part 211 in accordance with the example 2 formed on a second compound semiconductor layer 222 that is a backing is a convex part that is formed on the backing (second compound semiconductor layer 222) whose top surface is a {100} face, and that is extended in parallel with a <110> direction of the backing (second compound semiconductor layer 222). The convex part 211 has a two-layer structure including a convex-part lower layer 211A and a convex-part upper layer 211B.

A semiconductor light-emitting element in accordance with the example 2 is formed with a semiconductor laser, or more particularly, an ISAN semiconductor laser. As shown in the illustrative partial sectional view of FIG. 7, the semiconductor light-emitting element includes a light-emitting portion 220 that is formed with a first compound semiconductor layer 221, an active layer 223, and a second compound semiconductor layer 222 whose top surface is a {100} face. A convex part 211 extending in parallel with a <110> direction is formed on the second compound semiconductor layer 222. The convex part 211 has a two-layer structure including a convex-part lower layer 211A and a convex-part upper layer 211B.

In the example 2, the sectional shape of the convex-part upper layer 211B cut on a {110} face is an isosceles trapezoid whose base is longer than the upper side. The sectional shape of the convex-part lower layer 211A cut on the {110} face is an isosceles trapezoid whose base is longer than the upper side. The base of the sectional shape of the convex-part upper layer 211B cut on the {110} face corresponds to the upper side of the sectional shape of the convex-part lower layer 211A cut on the {110} face.

In the example 2, assuming that $\theta_U$ denotes the inclination of the side surface 211b of the convex-part upper layer 211B, $\theta_D$ denotes the inclination of the side surface 211a of the convex-part lower layer 211A, and $\theta_{111B}$ denotes the inclination of the flank of the convex part corresponding to a (111)B face, $\theta_D \neq \theta_U$, or specifically, $\theta_D \leq \theta_{111B} \leq \theta_U$ (where $\theta_D \neq \theta_U$) is satisfied. More specifically, $\theta_D < \theta_{111B} < \theta_U$ is satisfied. Still more specifically, even in the example 2, $\theta_{111B}$ equals 54.7°, $\theta_D$ equals 50°, and $\theta_U$ equals 60°.

The design concept for the case of an ISAN semiconductor laser is different from that for the case of an SDH semiconductor laser. Therefore, the roles to be filled by side surfaces are completely different between the cases. No strict restriction is imposed on such a condition as H$_U$/(H$_U$+H$_D$) or (H$_U$+H$_D$)/W$_U$. However, a design for effectively constricting a current is important. Specifically, shortening the base of the convex-part lower layer 211A and approaching it to the active layer 223 may be a pivotal point for suppressing a diffusing current. For example, FIG. 7 shows an ISAN semiconductor layer in which an entire concave part (including the side surfaces 211b and 211a) is insulated in order to constrict a current. In order to realize a structure that is more effective than light confinement control based on the above structure, a concave part is not covered with an insulating layer 212. Instead, as shown in an illustrative partial sectional view of FIG. 8, the concave part is buried by a laminated structure that includes an n-type compound semiconductor layer whose lattice constants are likely to match with those of the backing of the concave part and whose refractive index is lower than that of the material made into the active layer 223, a p-type compound semiconductor layer, the n-type compound semiconductor layer, the p-type compound semiconductor layer, etc. (hereinafter may be called a junction-type compound semiconductor layer laminated structure). As for a junction-type compound semiconductor layer laminated structure 270, a repetition frequency of accumulation of compound semiconductor layers having an n-p junction between them may be at least one or more. An example shown in FIG. 8 has an n-p-n structure. Thus, a buried structure that fills two roles, that is, (1) a role as a current block layer and (2) a role as a light confinement control layer can be realized. As a crystal growth method for a compound semiconductor layer that buries the concave part, a liquid phase growth (LPE) method, a metal organic chemical vapor deposition (MOCVD) method, a molecular beam epitaxy (MBE) method, or a plasma assisted physical deposition (PPD) method may be adopted.

Figure 8:
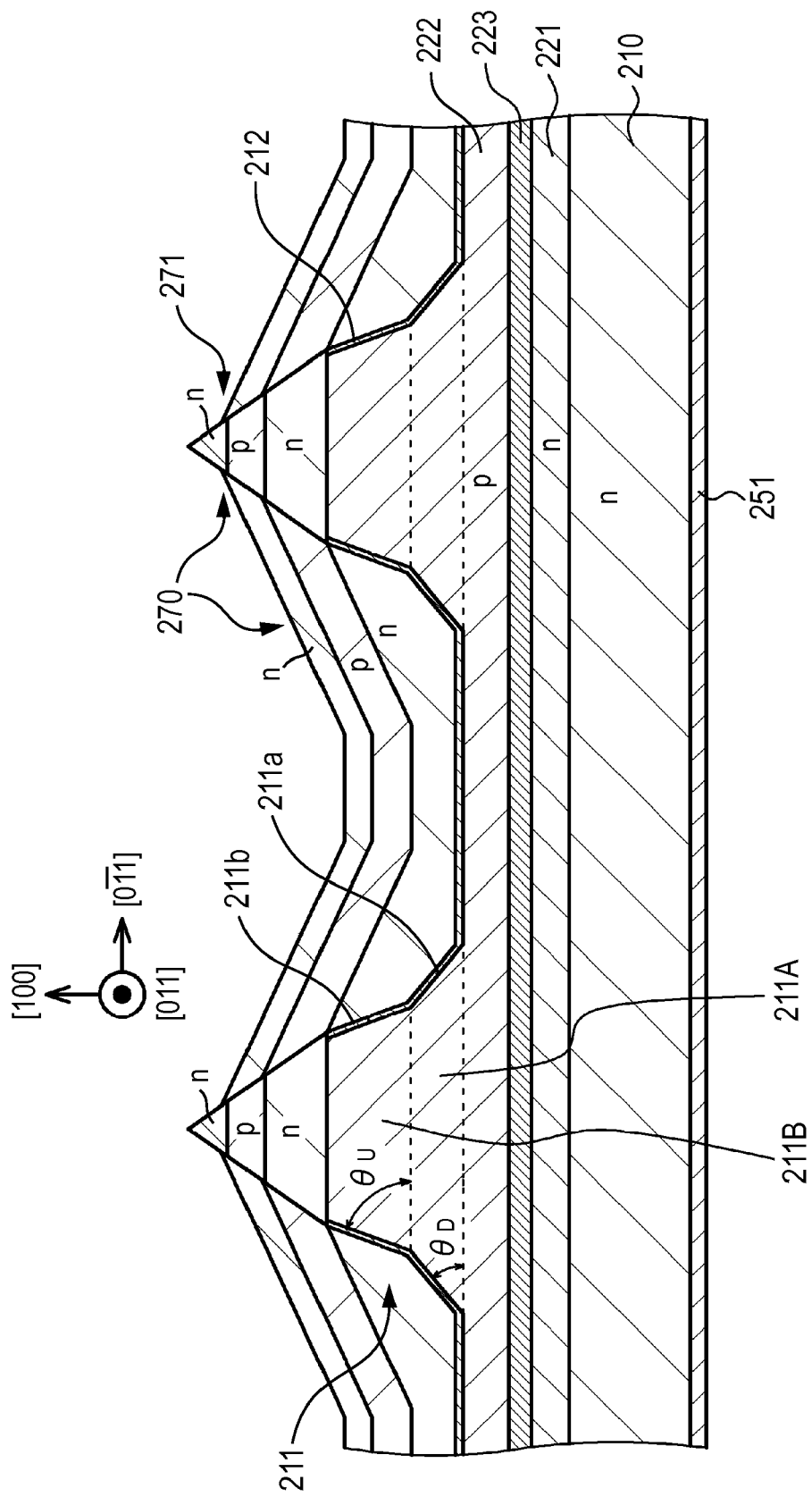
FIG. 8 is a partial sectional view illustratively showing a variant of the ISAN semiconductor layer that is the semiconductor light-emitting element in accordance with the example 2.
Figure 10:
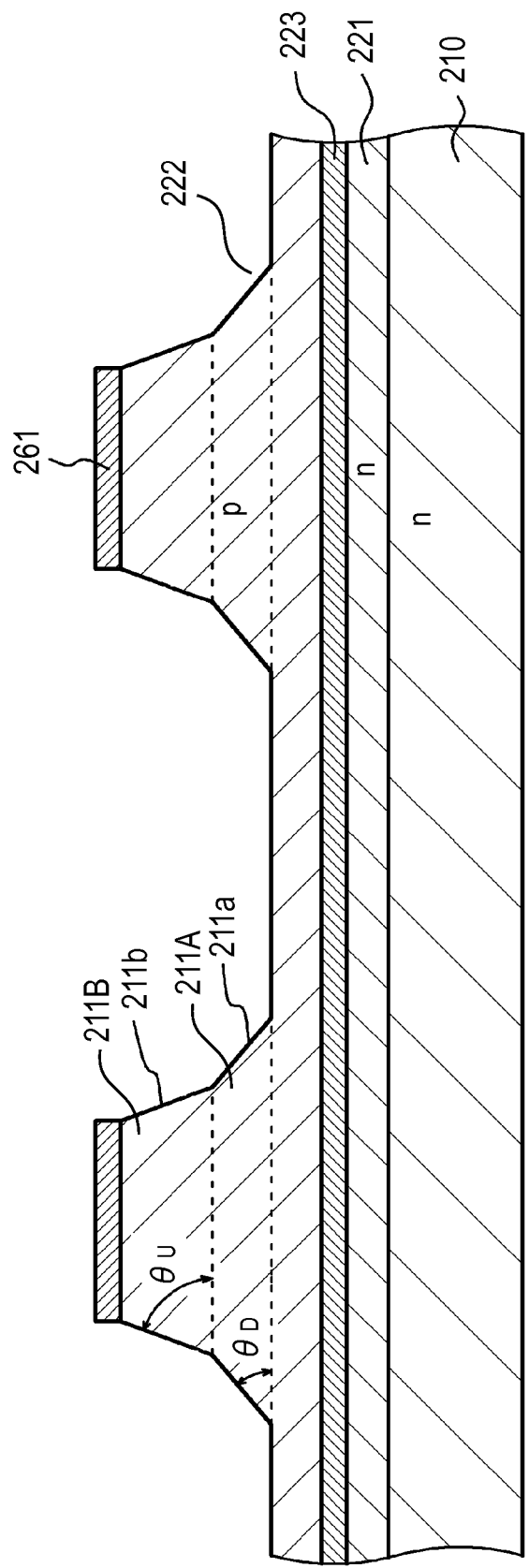
FIG. 10 is a partial sectional view illustratively showing the element fabrication substrate, which is observed at a step succeeding the step of FIG. 9B, so as to explain the semiconductor light-emitting element fabrication method in accordance with the example 2.

For buried crystal growth of burying the concave part by the junction-type compound semiconductor layer laminated structure 270, the mask layer 261 (see FIG. 10) may be used as a selective growth mask as it is. In this case, after the buried crystal growth is completed, the mask layer 261 is removed according to a normal etching method. A second electrode 252 is then formed on the convex part. If the mask layer 261 is made of a conducting material, after the buried crystal growth is completed, the mask layer may be used as the second electrode 252. Otherwise, as shown in FIG. 8, after the structure shown in FIG. 10 is formed, the mask layer 261 may be removed according to the normal etching method, and the concave part may be buried by the junction-type compound semiconductor layer laminated structure 270. FIG. 8 shows an example in which the concave part is buried by an n-p-n structure. However, even in this case, the triangular junction-type compound semiconductor layer laminated structure 271 (in the example shown in FIG. 8, a triangular n-p-n structure) is formed on the top surface of the convex part. Therefore, after the concave part is buried, the junction-type compound semiconductor layer laminated structure 271 has to be removed until the layer 211B on the top surface of the convex part is bared through etching. After the removal is completed, the second electrode 252 is formed in the same manner as the aforesaid one so that a current will flow into the convex part. In the example 2, assuming that $H_U$ denotes the thickness of the convex-part upper layer 211B, $H_D$ denotes the thickness of the convex-part lower layer 211A, and $W_U$ denotes the width of the convex-part upper layer 211B, 1.5 µm or 1 µm, 0.5 µm, and 0.5 µm are cited as typical examples of the $H_U$, $H_D$, and $W_U$ values respectively.

The light-emitting portion 220 is formed on an element fabrication substrate 210 made of n-GaAs. A first electrode 251 electrically connected to the first compound semiconductor layer 221 (specifically, the first electrode 251 formed on the back of the element fabrication substrate 210 exhibiting conductivity) is made of Ti/TiW/Pt/Au. The second electrode 252 electrically connected to the second compound semiconductor layer 222 (specifically, the second electrode 252 formed above the second compound semiconductor layer 222, or more particularly, on the contact layer (cap layer)) is made of Au/Ni/AuGe or Au/AuZn. Incidentally, an electrode structure having an Al layer, a Pd layer, or an Ag layer inserted into the interface between metallic layers, or especially, into the lowermost layer may be adopted. The composition of an alloy to be made into an n-type side electrode or a p-type side electrode may be appropriately determined based on the material made into the backing of the electrode for fear the backing may be damaged.

Table 2 lists the compositions of the compound semiconductor layers constituting the light-emitting portion 220.

TABLE 2

Second compound semiconductor layer 222:

p-$Al_{0.47}Ga_{0.53}As$:Zn,Mg,C
Active layer 223
multiple quantum well structure:

i-$Al_{0.3}Ga_{0.7}As$ (barrier layer)
i-$Al_{0.1}Ga_{0.9}As$ (well layer)
i-$Al_{0.3}Ga_{0.7}As$ (barrier layer)
First compound semiconductor layer 221:

n-$Al_{0.4}Ga_{0.6}As$:Se or Si

Incidentally, the second compound semiconductor layer 222 may have a three-layer structure of p-$Al_{0.47}Ga_{0.53}As$:Zn/ (carbon auto-doped) i-$Al_{0.3}Ga_{0.7}As$/(carbon auto-doped) i-$Al_{0.47}Ga_{0.53}As$ (with i-$Al_{0.47}Ga_{0.53}As$ on the side of the active layer), and i-$Al_{0.30}Ga_{0.70}As$ may be functioned as an etching stopper layer (and a light guide layer). The same applies to examples to be described later.

In the example 2, a current flows from the convex part 211 through the remaining part of the second compound semiconductor layer 222 and the active layer 223 to the first compound semiconductor layer 221, whereby light is emitted from the active layer 223. For effective current constriction, when $\theta_D \leq \theta_{111B} \leq \theta_U$ (where $\theta_D \neq \theta_U$) is established, $H_U/(H_U+H_D)$, $\theta_D$, and $\theta_U$ are preferably set to large values in order to shorten the base of the convex-part lower layer 211A and approach the base to the active layer 223. Preferably, $W_U$ is set to a small value. Specifically, 1.5 µm or 1 µm, 0.5 µm, and 0.5 µm are cited as typical examples of the $H_U$, $H_D$, and $W_U$ values respectively. Needless to say, since the base of the convex-part lower layer 211A should merely be shortened near the active layer 223, when the $\theta_D$ and $\theta_U$ values are changed, values different from the above ones have to be obtained through inverse calculation.

A convex-part formation method in accordance with the example 2 of forming a convex part that extends in parallel with a <110> direction of a backing having a {100} face as a top surface thereof, and a semiconductor light-emitting element in accordance with the example 2 and a fabrication method thereof will be described below.

[Step 200]

To begin with, based on a known method, a light-emitting portion 220 that includes the first compound semiconductor layer 221, active layer 223, and second compound semiconductor layer 222 whose top surface is the {100} face is formed on the principal surface of the element fabrication substrate 210 having a {100} face as a principal surface thereof.

[Step 210]

Thereafter, the convex part 211 extending in parallel with the <110> direction is formed on part of the second compound semiconductor layer 222 in the thickness direction thereof. The step 210 will be described below to fall into sub-steps 210A to 210C.

[Sub-step 210A]

Specifically, the mask layer 261 that extends in parallel with the <110> direction is formed on the second compound semiconductor layer 222 serving as the backing. Specifically, in the example 2, the mask layer 261 made of $SiO_2$ is formed on the second compound semiconductor layer 222 (backing) according to a CVD method. Thereafter, the mask layer 261 that extends in parallel with the <110> direction (more particularly, a [011] A direction) is formed on the second compound semiconductor layer, which serves as the backing, according to a lithographic technology and a dry-etching technology (see FIG. 9A).

[Sub-step 210B]

Thereafter, the mask layer 261 is used as an etching mask to etch the second compound semiconductor layer 222 according to a wet-etching method that employs an etching solution. Even in the example 2, citric acid/hydrogen peroxide water containing citric acid, pure water, and hydrogen peroxide water at a volume ratio of 3 to 3 to 2 is adopted as the etching solution. The etching solution is set to the temperature ranging from 6° to 9° C. and wet etching is carried out. As a result, as shown in FIG. 9B, the convex-part upper layer 211B whose sectional shape on a cutting plane corresponding to a {110} face is an isosceles trapezoid whose base is longer than the upper side and whose side surface 211b has an inclination of $\theta_U$ is formed.

[Sub-step 210C]

Thereafter, the temperature of the etching solution is changed. The mask layer 261 and the side surface 211b of the convex-part upper layer 211B are used as an etching mask to further etch the second compound semiconductor layer 222, which serves as a backing, according to a wet-etching method. Specifically, the citric acid/hydrogen peroxide water having the aforesaid composition is used to perform wet etching with the etching solution set to the temperature ranging from 2° C. to 5° C. Incidentally, the side surface 211b of the convex-part upper layer 211B obtained at sub-step 210B is a crystal face effective in stabilizing wet etching. Therefore, the mask layer 261 and the side surface 211b of the convex-part upper layer 211B can be used as the etching mask to perform wet etching. At sub-step 210C, the side surface 211b of the convex-part upper layer 211B will not be etched. Thus, the convex-part lower layer 211A whose sectional shape on a cutting plane corresponding to a {110} face is an isosceles trapezoid, the base of which is longer than the upper side thereof, and the side surface 211a of which has an inclination of $\theta_D$ (where $\theta_D \neq \theta_U$) can be formed (see FIG. 10). Since the temperature of the etching solution employed at sub-step 210B is higher than the temperature thereof employed at sub-step 210C, $\theta_D < \theta_{111B} < \theta_U$ is established. Thus, the double trapezoidal convex part 211 extending in a [011]A direction and having a desired top-surface width and a desired overall height can be formed. The width direction of the convex part 211 is parallel to a [0-11]B direction.

[Step 220]

Thereafter, the insulating film 212 made of $SiO_2$ is formed on the entire surface of the second compound semiconductor layer, and then removed from the top surface of the convex-part upper layer 211B. The second electrode 252 is formed on the bared top surface of the convex-part upper layer 211B according to a vacuum evaporation method. After the element fabrication substrate 210 has the back side thereof wrapped by an appropriate thickness, the first electrode 251 is formed according to the vacuum evaporation method.

[Step 230]

Thereafter, semiconductor light-emitting elements are separated from one another. Thus, the semiconductor light-emitting element in accordance with the present example is fabricated. The semiconductor light-emitting elements may be separated from one another one by one. Otherwise, the semiconductor light-emitting elements may be grouped in multiple elements (for example, in fours, eights, sixteens, thirty-twos, or sixty-fours), and the groups may be separated from one another.

Example 3

The example 3 relates to a convex part formed on a backing according to the second embodiment of the present invention, a semiconductor light-emitting element in accordance with the third embodiment of the present invention, a variant of a convex-part formation method in accordance with the embodiment of the present invention, and a variant of a semiconductor light-emitting element fabrication method in accordance with the second embodiment of the present invention. In the example 2, $\theta_D < \theta_{111B} < \theta_U$ is established. In the example 3, as shown in an illustrative partial sectional view of FIG. 11, $\theta_U < \theta_{111B} < \theta_D$ is established. The semiconductor light-emitting element of the example 3 is, similarly to that of the example 2, formed with an ISAN semiconductor laser. Assuming that the components of the semiconductor light-emitting element of the example 3 are substantially identical to those of the semiconductor light-emitting element of the example 2, the two lowest digits of each of reference numerals assigned to the components of the semiconductor light-emitting element of the example 3 are the same as the two lowest digits of each of the reference numerals assigned to the components of the semiconductor light-emitting element of the example 2.

A convex part 311 formed on a backing according to the example 3 is a convex part that is formed on the backing (second compound semiconductor layer 322) having a {100} face as a top surface thereof, and that is extended in parallel with a <110> direction of the backing (second compound semiconductor layer 322). The convex part 311 has a two-layer structure including a convex-part lower layer 311A and a convex-part upper layer 311B. The sectional shape of the convex-part upper layer 311B cut on a {110} face is an isosceles trapezoid whose base is longer than the upper side thereof. The sectional shape of the convex-part lower layer 311A cut on the {110} face is an isosceles trapezoid whose base is longer than the upper side thereof. The base of the sectional shape of the convex-part upper layer 311B cut on the {110} face corresponds to the upper side of the sectional shape of the convex-part lower layer 311A cut on the {110} face.

The semiconductor light-emitting element of the example 3 includes a light-emitting portion 320 formed with a first compound semiconductor layer 321, an active layer 323, and a second compound semiconductor layer 322 whose top surface is a {100} face, and has a convex part 311, which extends in parallel with a <110> direction, formed on the second compound semiconductor layer 322. The convex part 311 has the two-layer structure including the convex-part lower layer 311A and convex-part upper layer 311B. The sectional shape of the convex-part upper layer 311B cut on a {110} face is an isosceles trapezoid whose base is longer than the upper side thereof. The sectional shape of the convex-part lower layer 311A cut on the {110} face is an isosceles trapezoid whose base is longer than the upper side thereof. The base of the sectional shape of the convex-part upper layer 311B cut on the {110} face corresponds to the upper side of the sectional shape of the convex-part lower layer 311A cut on the {110} face.

The foregoing construction or structure is identical to that of the example 2. In the example 3, assuming that $\theta_U$ denotes the inclination of the side surface 311b of the convex-part upper layer 311B, $\theta_D$ denotes the inclination of the side surface 311a of the convex-part lower layer 311A, and $\theta_{111B}$ denotes the inclination of the flank of the convex part corresponding to a (111)B face, $\theta_D \neq \theta_U$, or more particularly, $\theta_U \leq \theta_{111B} \leq \theta_D$ (where $\theta_D \neq \theta_U$) is satisfied. More particularly, $\theta_U < \theta_{111B} < \theta_D$ is satisfied. Still more particularly, in the example 3, $\theta_{111B}$ equals 54.7°, $\theta_U$ equals 50°, and $\theta_D$ equals 60°.

Figure 11:
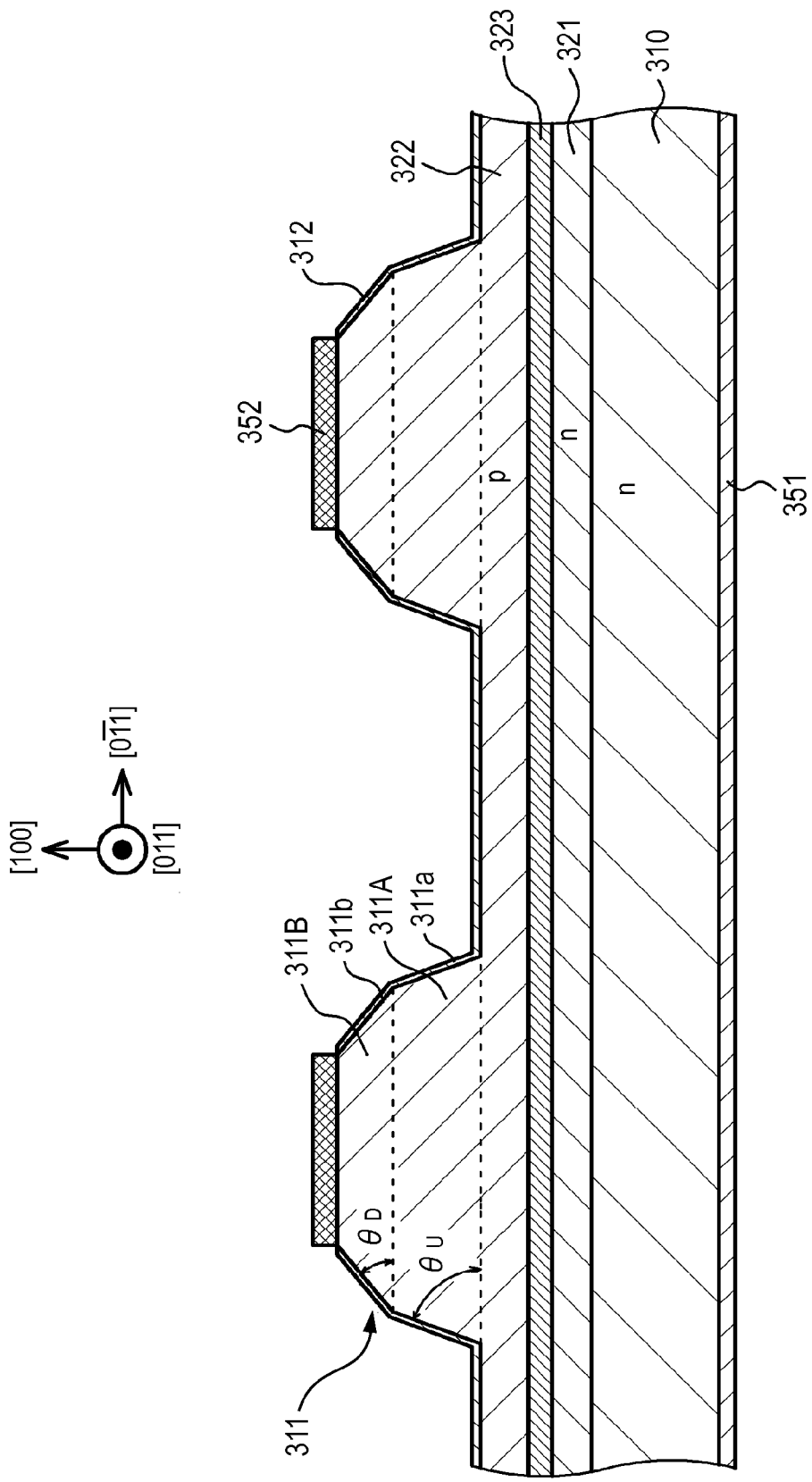
FIG. 11 is a partial sectional view illustratively showing an ISAN semiconductor laser that is a semiconductor light-emitting element in accordance with an example 3.

As described previously, the design concept for the case of the ISAN semiconductor laser is different from that for the case of the SDH semiconductor laser. The roles to be filled by the side surfaces are completely different, and no strict restriction is imposed on such a condition as $H_U/(H_U+H_U)$ or $(H_U+H_U)/W_U$. However, a design for effectively inducing current constriction is pivotal. Specifically, shortening the base of the convex-part lower layer 311A and approaching the base to the active layer 323 may be a pivotal point for controlling a diffusing current. For example, FIG. 11 shows the ISAN semiconductor laser in which an entire concave part (an entire surface including the side surface 311b and side surface 311a) is insulated by an insulating layer 312 for the purpose of current constriction. In order to realize a structure that exerts a higher effect than the effect of light confinement control provided by the above structure, instead of covering the concave part with the insulating layer 312, the concave part is, as shown in an illustrative partial sectional view of FIG. 12, buried by a junction-type compound semiconductor layer laminated structure 370 (in the example shown in FIG. 12, an n-p-n structure) whose lattice constants readily match with those of the backing of the concave part and whose refractive index is lower than that of the material made into the active layer 323. Thus, a buried structure that fills two roles, that is, (1) a role as a current block layer and (2) a role as a light confinement control layer can be realized.

Figure 12:
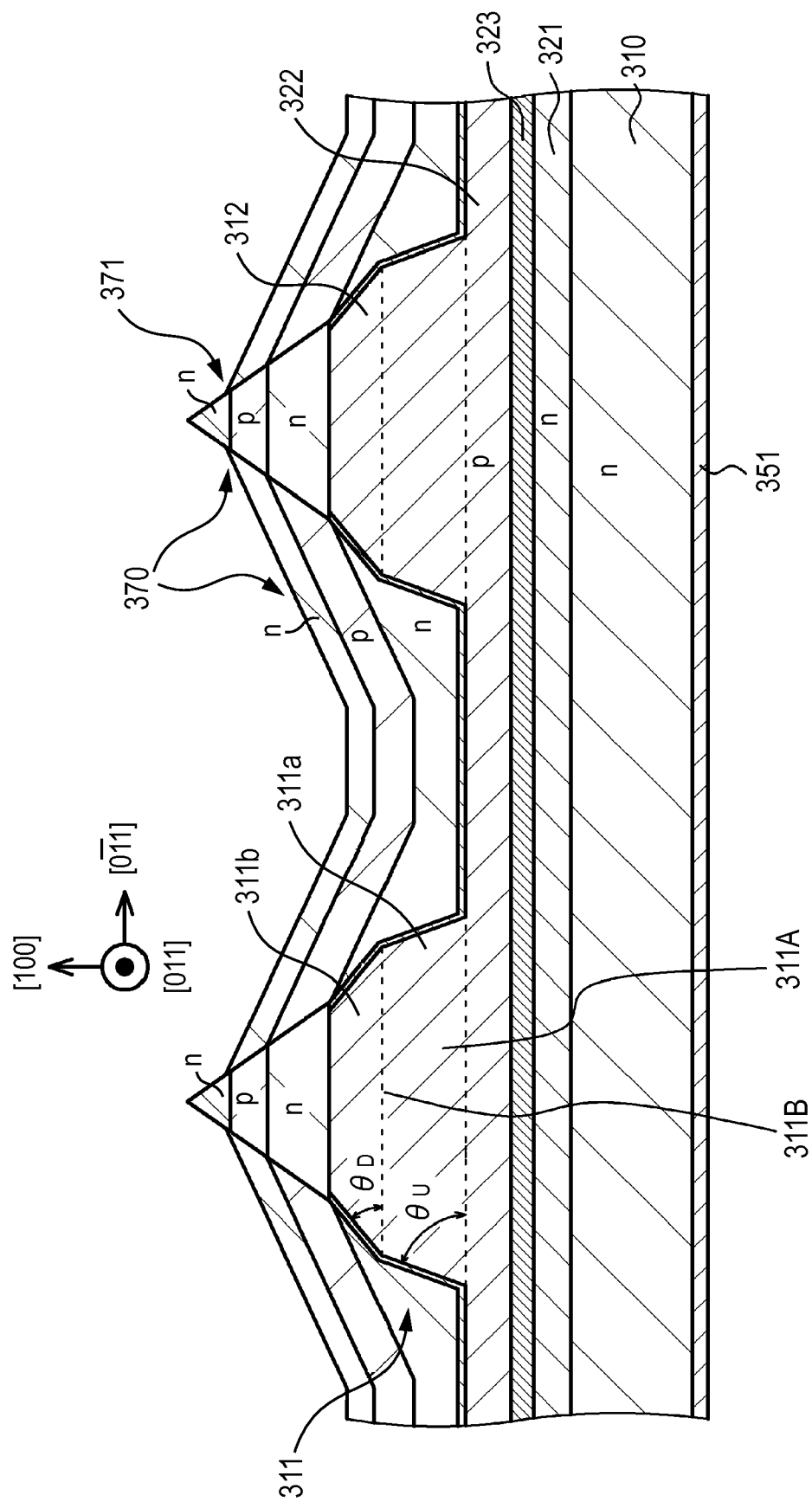
FIG. 12 is a partial sectional view illustratively showing a variant of the ISAN semiconductor laser that is the semiconductor light-emitting element in accordance with the example 3.

For buried crystal growth intended to bury the concave part with the junction-type compound semiconductor layer laminated structure 370, the mask layer may be used as a selective growth mask as it is. In this case, after the buried crystal growth is completed, the mask layer is removed according to a normal etching method. Thereafter, a second electrode 352 is formed on the convex part. If the mask layer is made of a conducting material, after the buried crystal growth is completed, the mask layer may be used as the second electrode 352 as it is. Otherwise, as shown in FIG. 12, after the structure shown in FIG. 11 is formed (the insulating film 312 and second electrode 352 are not formed), the mask layer may be removed according to the normal etching method, and the concave part may be buried by the junction-type compound semiconductor layer laminated structure 370. FIG. 12 shows an example in which the concave part is buried by an n-p-n structure. However, in this case, the triangular junction-type compound semiconductor layer laminated structure 371 (the triangular n-p-n structure in the example shown in FIG. 12) is formed on the top surface of the convex part. Therefore, after the concave part is buried, the junction-type compound semiconductor layer laminated structure 371 has to be removed until the layer 311B on the top surface of the convex part is bared through etching. After the removal is completed, the second electrode 352 is formed in the same manner as the aforesaid one so that a current will flow into the convex part. In the example 3, assuming that $H_U$ denotes the thickness of the convex-part upper layer 311B, $H_D$ denotes the thickness of the convex-part lower layer 311A, and $W_U$ denotes the width of the convex-part upper layer 311B, 0.5 µm, 1.5 µm or 1 µm, and 0.5 µm are cited as typical examples of the $H_U$, $H_D$, and $W_U$ values respectively.

Except the foregoing point, the construction or structure of the semiconductor light-emitting element of the example 3 is identical to the construction or structure of the semiconductor light-emitting element of the example 2. An iterative description will therefore be omitted. Similarly to the example 2, when $\theta_U \leq \theta_{111B} \leq \theta_D$ (where $\theta_D \neq \theta_U$) is established, $H_U/(H_U+H_D)$ should be set to a small value, $\theta_D$ and $\theta_U$ should be set to large values, and $W_U$ should be set to a small value, so that the base of the convex-part lower layer 311A will be shortened and approached to the active layer 323 for the purpose of effectively inducing current constriction. Specifically, 0.5 µm, 1.5 µm or 1 µm, and 0.5 µm are cited as typical examples of the $H_U$, $H_D$, and $W_U$ values respectively. Since the base of the convex-part lower layer 311A should merely be shortened in the vicinity of the active layer 323, if the $\theta_D$ and $\theta_U$ values are changed, values different from the above ones have to be, needless to say, obtained through inverse calculation.

In the example 3, the temperature of the etching solution for wet etching performed at sub-step 210B in the example 2 may range from 2° C. to 5° C. The temperature of the etching solution for wet etching performed at sub-step 210C in the example 2 may range from 6° C. to 9° C.

Example 4

The example 4 relates to a variant of a convex-part formation method in accordance with the embodiment of the present invention, a variant of a convex part formed on a backing according to the first embodiment of the present invention, a variant of a semiconductor light-emitting element in accordance with the second embodiment of the present invention, and a variant of a semiconductor light-emitting element fabrication method in accordance with the second embodiment of the present invention.

A semiconductor light-emitting element of the example 4 is a SAN semiconductor laser. Namely, as shown in an illustrative partial sectional view of FIG. 13 or FIG. 14, in the example 4, a convex part 411 is equivalent to a region in which a current is constricted. In other words, the convex part 411 is a region in which a current does not flow. For formation of the convex part 411, after a first compound semiconductor layer 421 and an active layer 423 are crystallographically grown on a substrate in advance, a junction-type compound semiconductor layer laminated structure (in FIG. 13 or FIG. 14, an n-p-n structure on the first compound semiconductor layer 421) is crystallographically grown. After a mask layer is formed, etching is performed in the same manner as it is, for example, at step 210 in the example 2.

The SAN semiconductor laser includes two convex parts 411 and a concave part sandwiched between the convex parts 411. In the example shown in FIG. 13 and FIG. 14, the concave part sandwiched between the two convex parts 411 is buried by a third compound semiconductor layer 424. A current flows through the third compound semiconductor layer 424, the remaining part of the second compound semiconductor layer 422, and the active layer 423 to the first compound semiconductor layer 421, whereby light is emitted from the active layer 423. Therefore, in the SAN semiconductor laser, when $\theta_D \leq \theta_{111B} \leq \theta_U$ (where $\theta_D \neq \theta_U$) is established, $H_D/(H_U+H_D)$, $\theta_D$, and $\theta_U$ should preferably be set to large values so that the pitch between the two convex parts 411 will be diminished and the base of the convex-part lower layer 411A will be extended and approached to the active layer 423. This is intended to effectively achieve current constriction. Specifically, the external shape of a convex part identical to that in the ISAN semiconductor laser presented as the example 2 or 3 may be adopted.

In the case of the SAN semiconductor laser, the convex part 411 serves as a current block layer. Therefore, if there are limitations in diminishing the pitch between the two convex parts 411 sandwiching the concave part that is a current injection region, the base of the convex-part lower layer 411A should be extended so that current constriction in the concave part will be effectively achieved. Therefore, slopes whose inclinations $\theta_D$ and $\theta_U$ are small are appropriately selected and etched as deeply as possible. Otherwise, a slope whose inclination is extremely small may be used to finally form a bottom, or a structure in which a percentage at which the slope whose inclination is extremely small occupies the entire flank of the convex part 411 may be adopted. In either case, as far as the SAN semiconductor laser is concerned, the junction-type compound semiconductor layer laminated structure should merely be designed as a multilayer structure reflecting a sufficient frequency of accumulation. Thus, the bottom of the concave part sandwiched between the two convex parts 411 having the capability of a current block layer can be minimized through etching identical to that performed at step 210 in the example 2. This is advantageous because a current constrictive structure that is more greatly optimized than that in the case of the ISAN semiconductor laser can be formed.

Figure 13:
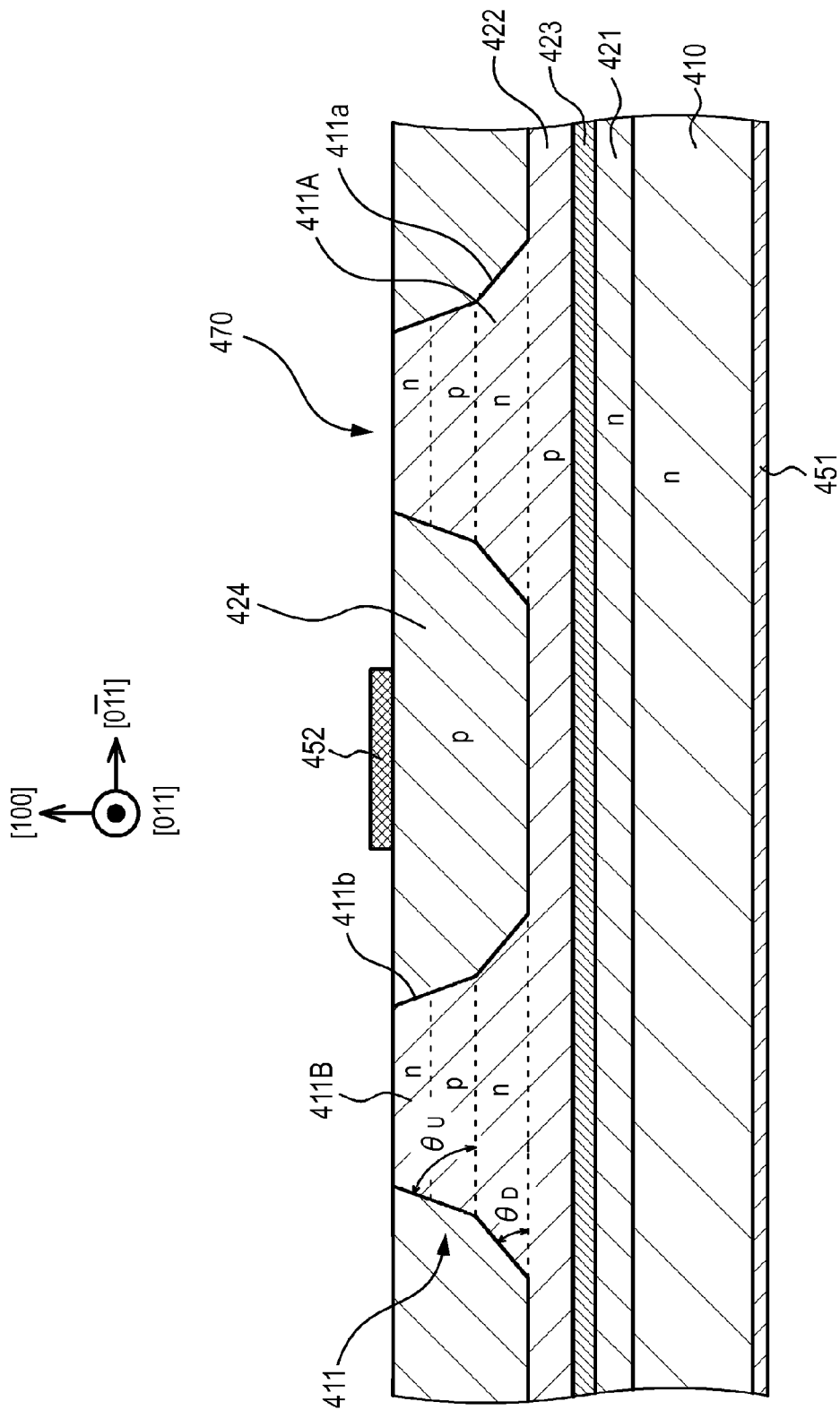
FIG. 13 is a partial sectional view illustratively showing a SAN semiconductor laser that is a semiconductor light-emitting element in accordance with an example 4.
Figure 14:
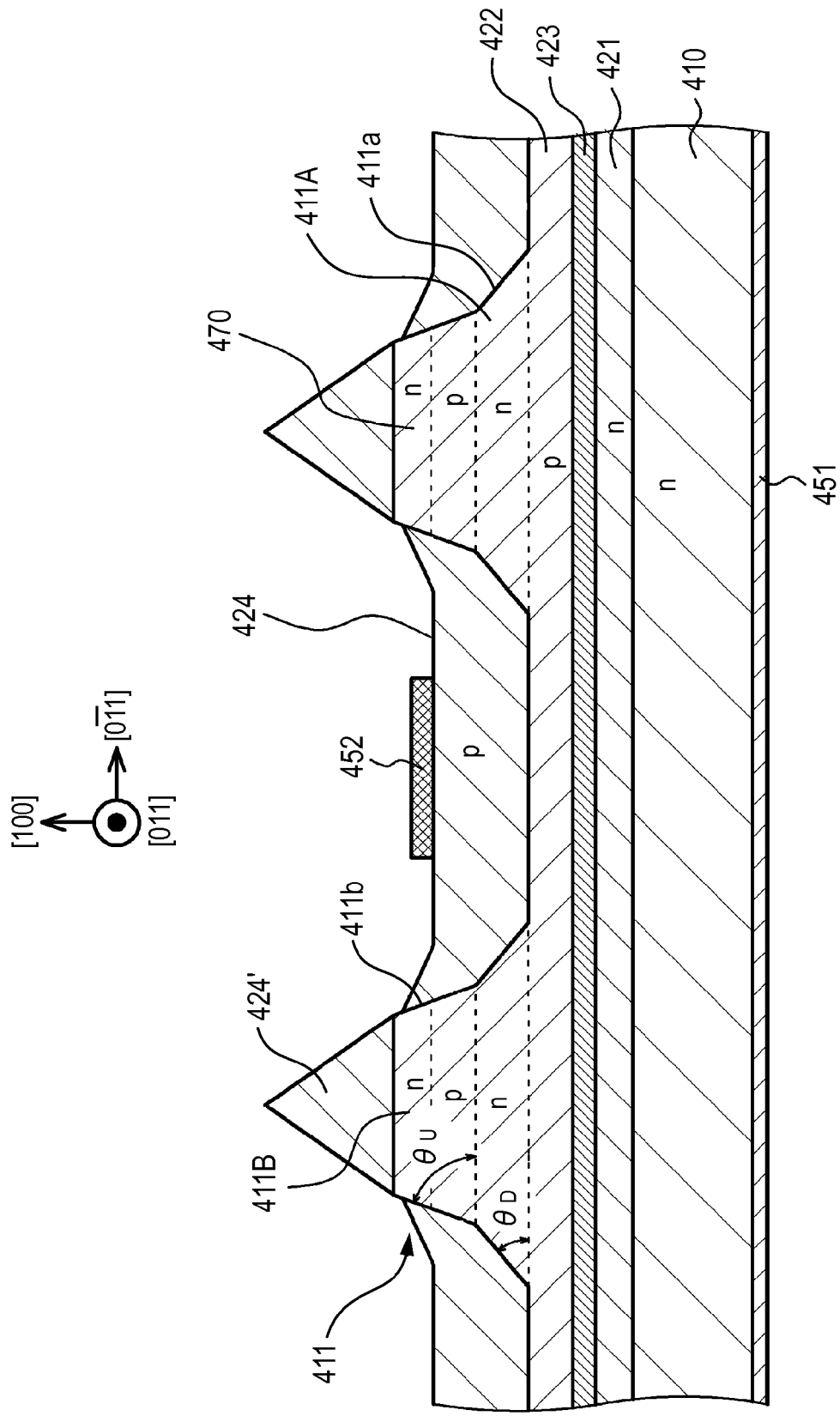
FIG. 14 is a partial sectional view illustratively showing a variant of the SAN semiconductor laser that is the semiconductor light-emitting element in accordance with the example 4.

In the example 4, the external shape of the convex part 411 obtained through etching may be identical to that of the convex part 211 in the example 2. A difference of the semiconductor light-emitting element of the example 4 from the semiconductor light-emitting element of the example 2 lies in a point that the p-type third compound semiconductor layer 424 is interposed between the convex parts 411 and in a point that the second electrode 452 is formed on the p-type third compound semiconductor layer 424. Further, after the junction-type compound semiconductor layer laminated structure 470 (see FIG. 13 and FIG. 14) having a current blocking structure is formed in advance, the junction-type compound semiconductor layer laminated structure 470 is etched according to an etching method in accordance with the embodiment of the present invention in order to form the convex part 411 having a shape analogous to or identical to the shape of the convex part 211. A current injection layer (p-type third compound semiconductor layer 424) is buried in the concave part. In FIG. 13, the p-type third compound semiconductor layer 424 that buries the concave part may be a high-density p-type low-refractive index compound semiconductor layer capable of being accumulated on a backing layer that is the second compound semiconductor layer 422. As long as buried growth can be achieved, a crystal growth method may be the LPE method, MOCVD method, or PPD method. In the example shown in FIG. 13, the MOCVD method is used to bury the current injection concave part. When the concave part is buried according to the LPE method, the concave part is flatly buried. When the MOCVD method is used to bury and grow the current injection concave part, if the mask layer is removed, a {111} B non-growth face similar to that produced during fabrication of the SDH semiconductor laser appears on the top surface of the convex part 411 having the current blocking capability. Therefore, a triangular layer 424' is formed. After the current injection concave part is buried and grown, the triangular layer 424' may be removed through normal etching. Thereafter, the second electrode (transparent electrode layer) 452 may be accumulated on the third compound semiconductor layer 424. The triangular layer 434' may not be removed but may be left intact, and the second electrode (transparent electrode layer) 452 may be formed on the third compound semiconductor layer 424. In the case of a light-emitting diode, the concave part is neither buried nor grown. Crystal growth may be induced in advance so that the second electrode can be formed on the concave part resulting from etching. Thus, after the concave part is formed according to the etching method in accordance with the embodiment of the present invention, the second electrode (transparent electrode layer) may be formed on the concave part. Herein, if the shape or components of the semiconductor light-emitting element of the example 4 are substantially identical to the shape or components of the semiconductor light-emitting element of the example 2, the two lowest digits of reference numerals assigned to the components of the semiconductor light-emitting element of the example 4 are identical to the two lowest digits of the reference numerals assigned to the components of the semiconductor light-emitting element of the example 2.

Since the design concept for even the case of the SAN semiconductor laser is different from that for the case of the SDH semiconductor laser, roles to be filled by side surfaces are completely different. No strict restriction is especially imposed on such a condition as $H_U/(H_U+H_D)$ or $(H_U+H_D)/W_U$. However, when a current constrictive structure is designed with care taken of a difference from a current constrictive structure in the ISAN semiconductor laser, the pitch between convex parts is designed to be small. Secondly, the percentage at which a slope whose inclination is small and which is included in the flank of a convex part occupies the entire flank of the convex part is increased in order to narrow a concave part. In the example 4, assuming that $H_U$ denotes the thickness of the convex-part upper layer 411B, $H_D$ denotes the thickness of the convex-part lower layer 411A, and $W_U$ denotes the width of the convex-part upper layer 411B, for example, 1.5 μm or 1 μm, 0.5 μm, and 0.5 μm or 0.5 μm, 1.5 μm or 1 μm, and 0.5 μm are cited as typical examples of the $H_U$, $H_D$, and $W_U$ values respectively.

Example 5

An example 5 relates to a variant of a convex-part formation method in accordance with the embodiment of the present invention, a variant of a convex part formed on a backing according to the second embodiment of the present invention, a variant of a semiconductor light-emitting element in accordance with the third embodiment of the present invention, and a variant of a semiconductor light-emitting element fabrication method in accordance with the second embodiment of the present invention.

Figure 15:
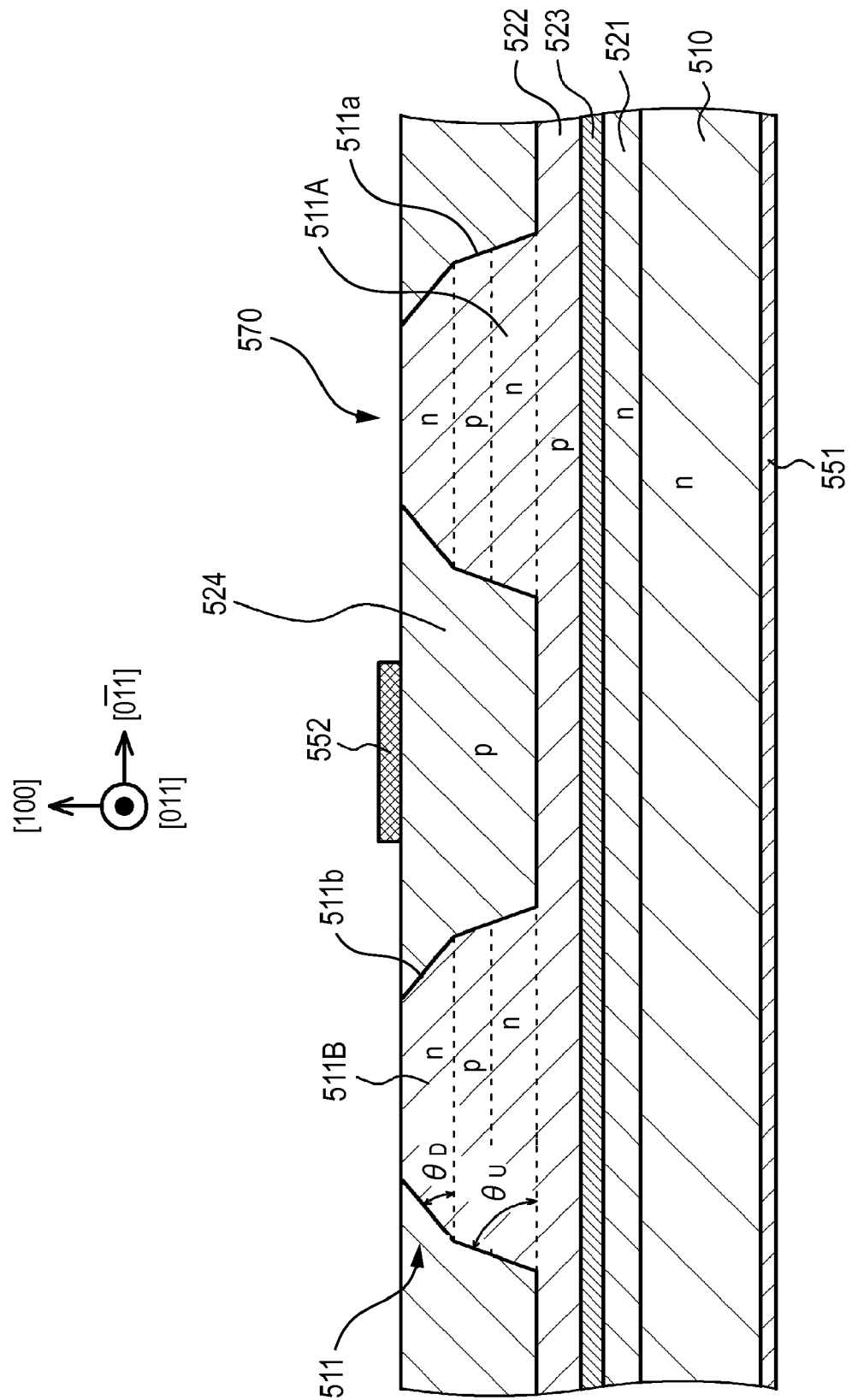
FIG. 15 is a partial sectional view illustratively showing a SAN semiconductor laser that is a semiconductor light-emitting element in accordance with an example 5.
Figure 16:
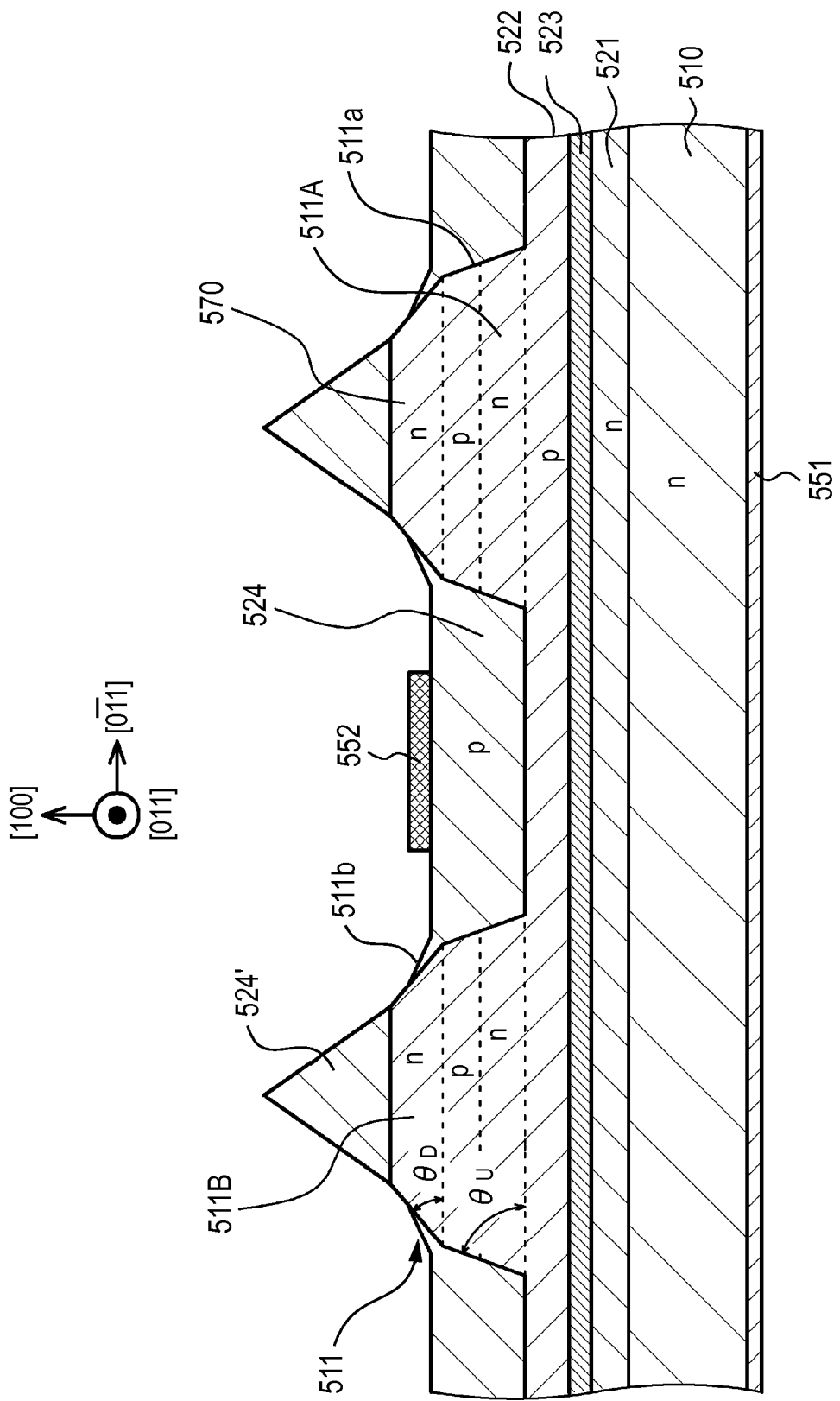
FIG. 16 is a partial sectional view illustratively showing a variant of the SAN semiconductor laser that is the semiconductor light-emitting element in accordance with the example 5.

A semiconductor light-emitting element of the example 5 is, similarly to that of the example 4, a SAN semiconductor laser. Namely, as shown in illustrative partial sectional views of FIG. 15 and FIG. 16, even in the example 5, a convex part 511 is equivalent to a region in which a current is constricted, that is, a region in which a current does not flow. When a current flows from a third compound semiconductor layer 524 formed between the convex parts 511 through the remaining part of a second compound semiconductor layer 522 and an active layer 523 to a first compound semiconductor layer 521, light is emitted from the active layer 523.

In the example 5, the external shape of the convex part 511 attained through etching may be identical to that of the convex part 311 of the example 3. A semiconductor light-emitting element of the example 5 is different from the semiconductor light-emitting element of the example 3 in a point that a p-type third compound semiconductor layer 524 is formed between the convex parts 511 and a point that a second electrode 552 is formed on the p-type third compound semiconductor layer 524. Further, a junction-type compound semiconductor layer laminated structure 570 (see FIG. 15 and FIG. 16) having a current blocking structure is formed in advance, and then etched according to an etching method in accordance with the embodiment of the present invention in order to form the convex part 511 whose shape is analogous or identical to the shape of the convex part 311. A current injection layer (p-type third compound semiconductor layer 524) is buried in a concave part. If the components of the semiconductor light-emitting element of the example 5 are substantially identical to those of the semiconductor light-emitting element of the example 3, the two lowest digits of reference numerals assigned to the components of the semiconductor light-emitting element of the example 5 are identical to those of the reference numerals assigned to the components of the semiconductor light-emitting element of the example 2.

A difference of the construction or structure of the semiconductor light-emitting element of the example 5 from the construction or structure of the semiconductor light-emitting element of the example 4 is that the relationship between the inclinations of the slopes of the upper and lower layers of the convex part 411 of the example 4 is a reverse of the relationship between the inclinations of the slopes of the upper and lower layers of the convex part 511 of the example 5. A detailed design method for designing a concave part interposed between the two convex parts 511, and notes are identical to those relating to the example 4. An iterative description will be omitted.

Example 6

An example 6 relates to a semiconductor light-emitting element fabrication method in accordance with the third embodiment of the present invention. In a description to be made below, expressions "upper" and "lower" apply, in principle, to a position far away from an element fabrication substrate and a position near the element fabrication substrate respectively with the element fabrication substrate as a reference.

Figure 18:
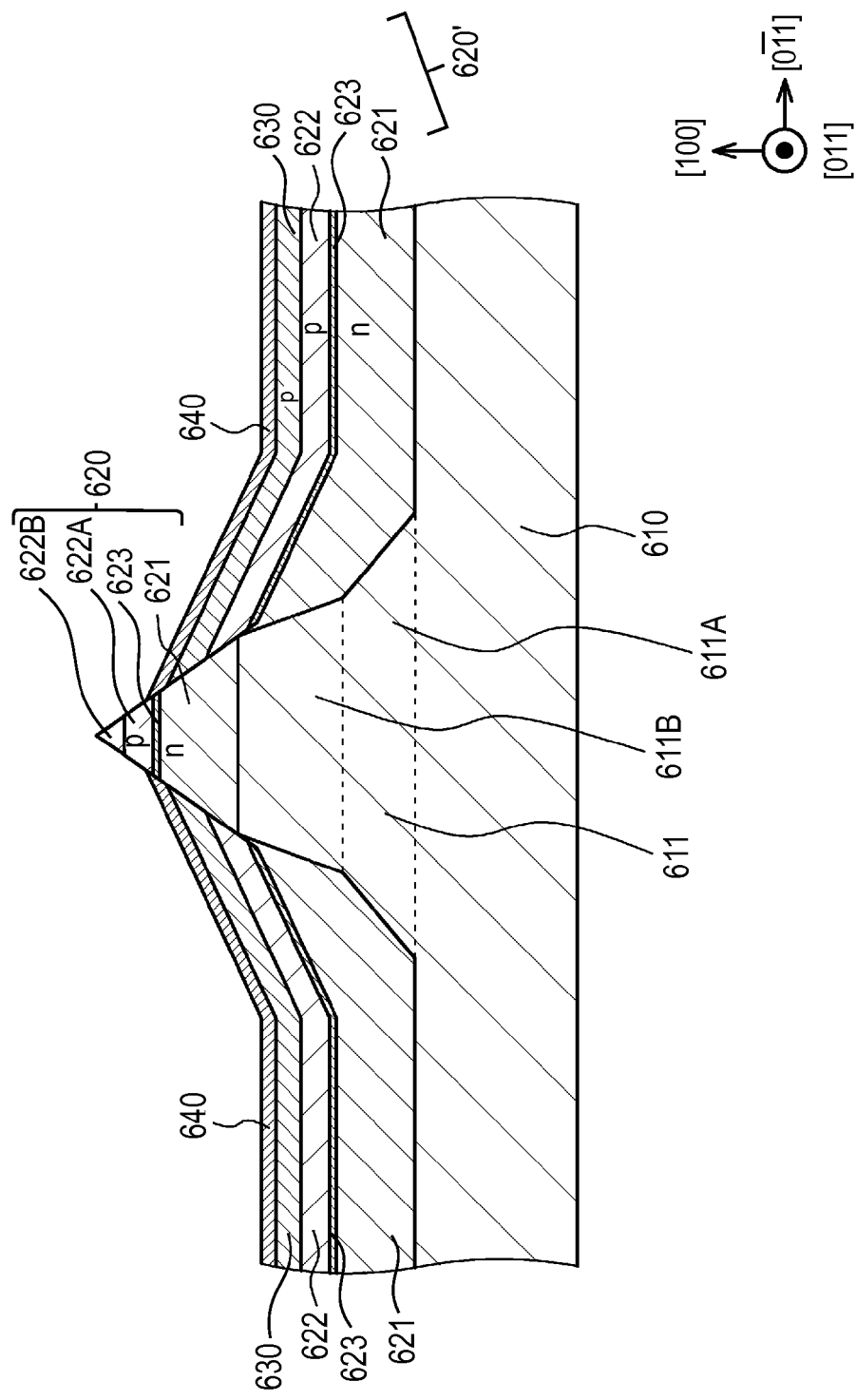
FIG. 18 is a partial sectional view illustratively showing an element fabrication substrate so as to explain a semiconductor light-emitting element fabrication method in accordance with the example 6.

A semiconductor light-emitting element to be obtained according to the semiconductor light-emitting element fabrication method of the example 6 is a semiconductor layer, or more particularly, an SDH semiconductor laser. As seen from an illustrative partial sectional view of FIG. 18 showing a semiconductor laser from which an element fabrication substrate 610 has not been removed, intermediate substances of the semiconductor light-emitting element produced at intermediate steps of the semiconductor light-emitting element fabrication method of the example 6 are as follows:

(a) a convex part (projection) 611 that is formed on the principal surface of an element fabrication substrate 610 having a {100} face as the principal surface thereof, and extended in parallel with a <110> direction of the element fabrication substrate 610 (more particularly, for example, a direction) (the same applies to a description to be made below);

(b) a light-emitting portion 620 that has a first compound semiconductor layer 621 exhibiting a first conductivity type (in the example 6, n-type conductivity), an active layer 623, and a second compound semiconductor layer 622 exhibiting a second conductivity type (in the example 6, p-type conductivity) sequentially accumulated on the top surface of the convex part 611; and (c) a laminated structure 620' that is formed on part of the principal surface of the element fabrication substrate 610, on which the convex part is not formed (may be called a concave-part surface or bared surface of the element fabrication substrate 610), and that has the first compound semiconductor layer 621 exhibiting the first conductivity (n-type conductivity), the active layer 623, and the second compound semiconductor layer 622 exhibiting the second conductivity type (p-type conductivity) sequentially accumulated; and a current block layer 640 that is formed on the laminated structure 620' and shields at least the side surface of the active layer 623 included in the light-emitting portion 620.

The convex part 611 has a two-layer structure including a convex-part lower layer 611A and a convex-part upper layer 611B.

Figure 17:
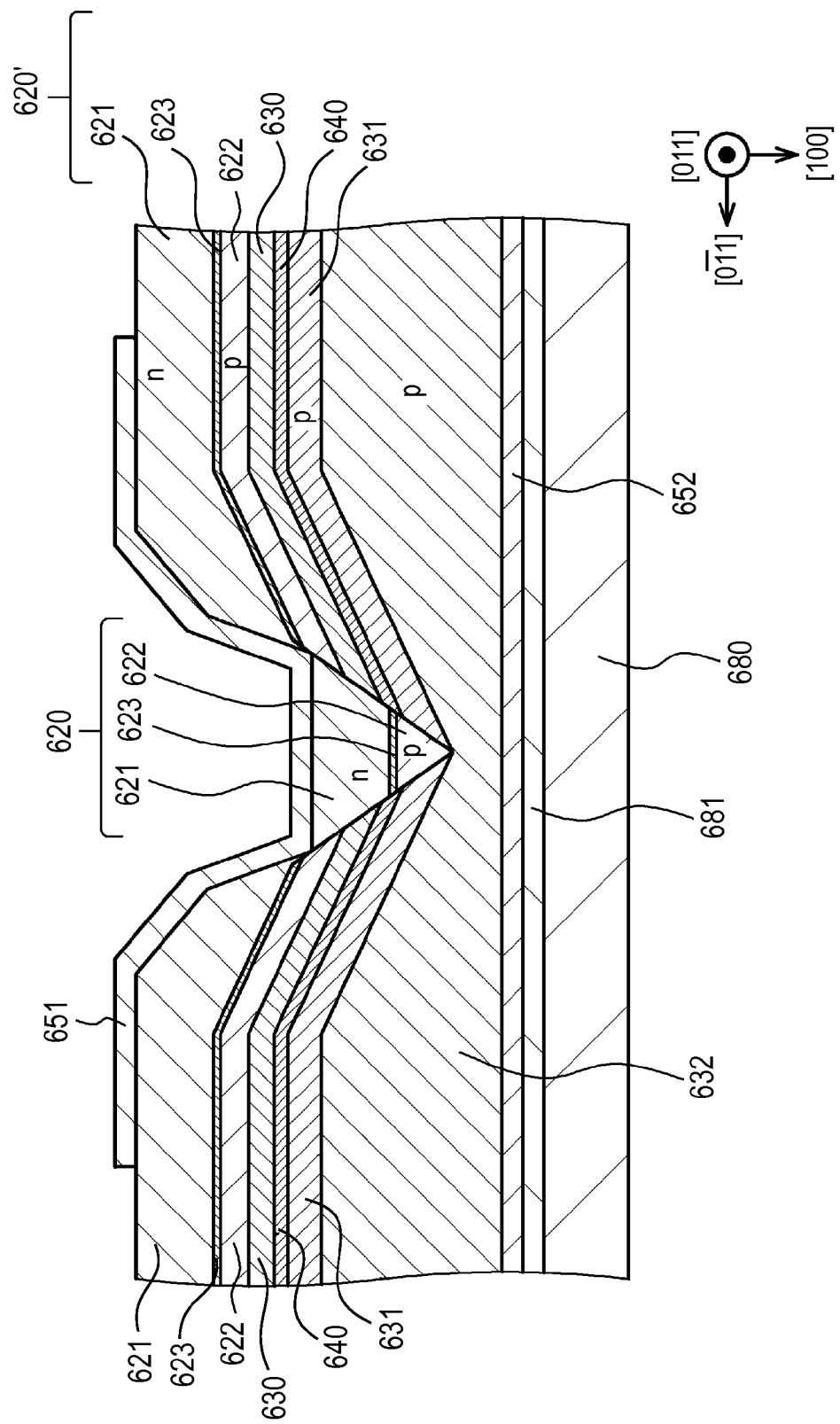
FIG. 17 is a partial sectional view illustratively showing an SDH semiconductor laser that is a semiconductor light-emitting element in accordance with an example 6.

The semiconductor light-emitting element produced according to the semiconductor light-emitting element fabrication method of the example 6 includes, as shown in an illustrative partial sectional view of FIG. 17:

(b') the light-emitting portion 620 that has the first compound semiconductor layer 621 exhibiting the first conductivity type (in the example 6, n-type conductivity), the active layer 623, and the second compound semiconductor layer 622 exhibiting the second conductivity type (in the example 6, p-type conductivity) sequentially accumulated;

(c') the laminated structure 620' that has the first compound semiconductor layer 621 exhibiting the first conductivity type (n-type conductivity), the active layer 623, and the second compound semiconductor layer 622 exhibiting the second conductivity type (in the example 6, p-type conductivity) sequentially accumulated, and a current block layer 640 that is formed on the laminated structure 620' and shields at least the side surface of the active layer 623 included in the light-emitting portion 620;

(d') a contact layer 632 that covers the entire surface of the current block layer;

(e') a second electrode 652 formed on the contact layer 632;

(f') a supporting substrate 680 bonded to the second electrode 652 with a metallic layer 681 between them; and (g') a first electrode 651 electrically connected to the first compound semiconductor layer 621.

The convex part 611 produced by following intermediate steps of the semiconductor light-emitting element fabrication method of the example 6 is, similarly to the one shown in the illustrative partial sectional view of FIGS. 3A to 3C, formed on the element fabrication substrate 610 having the {100} face (more particularly, a (100) face) (the same applies to a description to be made below) as the top surface thereof. Specifically, the convex part 611 formed on the element fabrication substrate 610 is a convex part that is formed on the principal surface of the element fabrication substrate 610 having the {100} face as the principal surface thereof, and that is extended in parallel with the <110> direction of the element fabrication substrate 610. The convex part 611 has a two-layer structure including a convex-part lower layer 611A and a convex-part upper layer 611B.

The sectional shape of the convex-part upper layer 611B cut on the {110} face (more particularly, a (011) face) (the same applies to a description to be made below) is an isosceles trapezoid whose base is longer than the upper side thereof. The sectional shape of the convex-part lower layer 611A cut on the {110} face is an isosceles trapezoid whose base is longer than the upper side thereof. The base of the sectional shape of the convex-part upper layer 611B cut on the {110} face corresponds to the upper side of the sectional shape of the convex-part lower layer 611A cut on the {110} face.

The relationship among the inclination $\theta_U$ of the side surface 611b of the convex-part upper layer 611B, the inclination $\theta_D$ of the side surface 611a of the convex-part lower layer 611A, and the inclination $\theta_{111B}$ of the flank of the convex part corresponding to a (111) B face, and the concrete values of the inclinations are identical to those described in relation to the example 1. The relationship among the thickness $H_U$ of the convex-part upper layer 611B, the thickness $H_D$ of the convex-part lower layer 611A, and the width $W_U$ of the convex-part upper layer 611B, and the concrete values of the thicknesses and width are identical to those described in relation to the example 1.

On the top surface of the convex-part upper layer 611B, similarly to that in the example 1, the first compound semiconductor layer 621, the active layer 623, and a second compound semiconductor layer 622A are sequentially formed. Further, a second semiconductor layer 622B is formed on the second compound semiconductor layer 622A in order to thus form an apex.

On the concave-part surface of the element fabrication substrate 610 (the (100) face in the illustrated example), the laminated structure 620' having the same structure as the light-emitting portion 620, a current block layer position adjustment layer 630 (substantially, a continuation of the second compound semiconductor layer 622), a current block layer 640, and a buried layer (buried clad layer) 631 are sequentially formed. The entire surface of the buried layer is covered with a contact layer (cap layer) 632 made of GaAs exhibiting the second conductivity. In the example 6, the element fabrication substrate 610 including the convex part 611 is made of n-GaAs. Further, the first electrode 651 electrically connected to the first compound semiconductor layer 621 (more specifically, the first electrode 751 formed on the first compound semiconductor layer 621) is made of Ti/TiW/Pt/Au, and the second electrode 652 electrically connected to the second compound semiconductor layer 622 (the second electrode 652 formed above the second compound semiconductor layer 622, or more specifically, formed on the contact layer (cap layer) 632) is made of Au/Ni/AuGe or Au/AuZn.

The compositions of compound semiconductor layers constituting the light-emitting portion 620 or laminated structure 620' are identical to those listed in Table 1. A compound semiconductor layer included in part of the current block layer 640 has the same structure as that shown in FIG. 2B.

The active layer 623 formed on the convex part 611 has the lateral direction (side surface) thereof surrounded by the current block layer 640 whose refractive index is lower than that of the active layer 623, and has the up-and-down directions thereof surrounded by the first compound semiconductor layer 621 and second compound semiconductor layers 622A and 622B respectively whose refractive indices are lower than that of the active layer 623. Therefore, the up-and-down directions and lateral direction of the active layer 623 are enclosed with a full light-confinement structure. In addition, a so-called thyristor structure that is a p-n-p-n structure (p-type buried layer 631—n-type current block layer 640—p-type current block layer position adjustment layer 630—n-type first compound semiconductor layer 621) is formed near the side surface of the active layer 623 above the concave-part surface of the element fabrication substrate 610. Therefore, a current is concentrated on the active layer 623. Eventually, a low threshold current is attained.

The semiconductor light-emitting element fabrication method of the example 6 will be described below.

[Step 600]

To begin with, the convex part 611 extending in parallel with the <110> direction of the element fabrication substrate 610 is formed on the principal surface of the element fabrication substrate 610 having the {100} face as the principal surface thereof. This step corresponds to sub-steps 100A to 100C in the example 1.

[Step 610]

Thereafter, similarly to step 110 in the example 1, after the mask layer 661 is removed according to a wet etching method, the light-emitting portion 620 that has the first compound semiconductor layer 621 exhibiting the first conductivity type, the active layer 623, and the second compound semiconductor layer 622 exhibiting the second conductivity type sequentially accumulated is formed on the top surface of the convex part 611. Concurrently, the laminated structure 620' that has the first compound semiconductor layer 621 exhibiting the first conductivity type, the active layer 623, and the second compound semiconductor layer 622 exhibiting the second conductivity type sequentially accumulated is formed on part of the principal surface of the element fabrication substrate 621 (concave-part surface or bared surface) on which the convex part 611 is not formed.

[Step 620]

Thereafter, similarly to step 120 in the example 1, the current block layer 640 that shields at least the side surface of the active layer 623 included in the light-emitting portion 620 is formed on the laminated structure 620'.

[Step 630]

Thereafter, the buried layer 631 and contact layer (cap layer) 632 are sequentially formed on the entire surface of the current block layer according to the MOCVD method. Incidentally, when MOCVD is continued, the buried layer 631 made of a compound semiconductor that crystallographically grows above the concave-part surface of the element fabrication substrate 610 gradually completely buries the light-emitting portion 620 whose self-growth is suspended. Thereafter, the contact layer 632 is subjected to flattening processing. The second electrode 652 is then formed on the flattened contact layer 632 according to a vacuum evaporation method.

Figure 19:
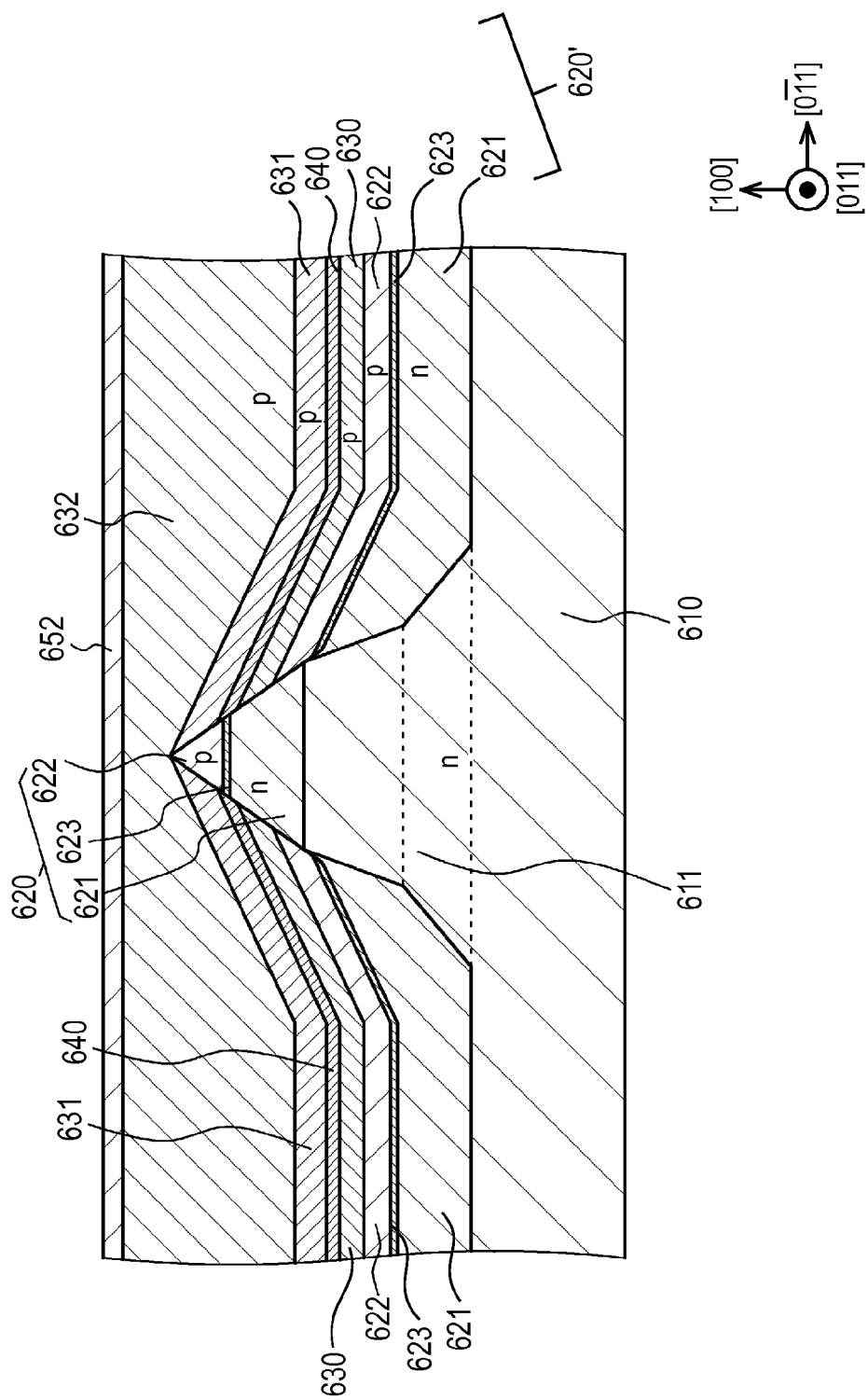
FIG. 19 is a partial sectional view illustratively showing an element fabrication substrate to be observed at a step succeeding the step of FIG. 18 in the process of fabrication of the SDH semiconductor laser that is the semiconductor light-emitting element in accordance with the example 6.

Eventually, the structure shown in FIG. 19 ensues. The second electrode 652 may be patterned if necessary.

[Step 640]

Thereafter, the element fabrication substrate 610 is bonded to the supporting substrate 680 with the second electrode 652 between them. Specifically, the metallic layer 681 formed on the surface of the supporting substrate 680 is closely attached to the second electrode 652. The metallic layer 681 and second electrode 652 are joined according to a metal-metal bonding method. More specifically, the metallic layer 681 and second electrode 652 are uniformly bonded to each other according to a method of thermally compressing the metallic layer 681 and second electrode 652 by applying pressure, which ranges from about 1 atm to about 10 atm, to the metallic layer 681 and second electrode 652.

Alternatively, an adhesive member containing B, Al, Ga, In, Sn, or Ag may be interposed between the surfaces to be bonded to each other.

[Step 650]

Thereafter, the element fabrication substrate 610 is removed. Specifically, an ammonia solution and hydrogen peroxide water, a sulfate solution and hydrogen peroxide water, a hydrochloric acid solution and hydrogen peroxide water, or a phosphoric acid solution and hydrogen peroxide water are employed. The mixing ratio of the solution to hydrogen peroxide water is changed in order to adjust oxidation-reduction reaction according to the content of any of various impurities. Thus, the element fabrication substrate 610 can be etched.

[Step 660]

Thereafter, the first electrode 651 electrically connected to the first compound semiconductor layer 621 is formed. Specifically, the first electrode 651 is formed at an appropriate position on the first compound semiconductor layer 621 according to a vacuum evaporation method. Thus, the semiconductor light-emitting element of the example 6 having the structure shown in FIG. 17 is fabricated. Incidentally, semiconductor light-emitting elements may be separated from one another. Otherwise, the semiconductor light-emitting elements may be grouped in units of multiple elements (for example in fours, eights, or sixteens), and the groups may be separated from one another. Preferably, formation of the first electrode 651 on the concave part, which is shaped like an inverted trapezoid, should be avoided to the greatest possible extent for fear the position of the first electrode 651 or the material made into the first electrode 651 may interfere with light fetching. Otherwise, the first electrode 651 is made of a transparent conducting material. Thus, light absorption by the first electrode 651 is reduced to the greatest possible extent.

In the example 6, the convex part 611 is formed in order to form the light-emitting portion 620. Incidentally, the convex part 611 has a two-layer structure including the convex-part upper layer 611B and convex-part lower layer 611A. The width $W_U$ of the top surface of the convex-part upper layer 611B, the height $H_U$ of the convex-part upper layer 611B, and the height $H_D$ of the convex-part lower layer 611A can be set to a combination of values selected from among wide ranges of sets of values. As described previously, the height (size) of the light-emitting portion 620 is defined by the width $W_U$ of the convex-part upper layer 611B. The aspect ratio $\{(H_U+H_D)/W_U\}$, that is, the ratio of the height $(H_U+H_D)$ from the concave-part surface of the element fabrication substrate 610 to the top surface of the convex part 611 to the width $W_U$ of the top surface of the convex part at the height can be adjusted or confined to a range of desired aspect ratios by controlling wet etching to be performed on the element fabrication substrate 610. In other words, the aspect ratio of the convex part 611

(for example, a quotient of the height by the width) associated with the desired width of the active layer 623 falls within a certain range of values. Therefore, the aspect ratio of the convex part has to be confined to the range. However, the freedom in designing the aspect ratio is high. Therefore, once the aspect ratio is optimized, occurrence of a problem that the current block layer 640 may not be able to be formed on the side surface of the active layer 623 can be suppressed. In the past, a problem that since the width or height of convex part varies within an element fabrication substrate, the current block layer is not formed on the side surface of the active layer included in the light-emitting portion formed on the top surface of the convex part located in a certain region on the element fabrication substrate has occurred in relation to the aspect ratio of a concavo-convex substrate formed by etching the element fabrication substrate 610 (etching whose control fluctuates). However, in the example 6, the desired aspect ratio of the convex part 611 associated with the desired width of the active layer 623 can be attained by controlling wet etching to be performed on the element fabrication substrate 610. The intra-surface uniformity in the concavo-convex structure of the element fabrication substrate can be drastically improved. Further, even when the formation pitch for the convex part 611 is diminished in order to attain high-density integration, light generated by the active layer 623 is not absorbed by the element fabrication substrate 610. In addition, the aspect ratio of the convex part 611 can be controlled to fall within the desired range of values. Therefore, occurrence of the problem that the current block layer 640 is not formed on the surface of the active layer 623 can be suppressed. Eventually, high-density integration of semiconductor light-emitting elements can be achieved.

In the example 6, since the element fabrication substrate 610 is removed, light generated from the active layer 623 will not be absorbed by the element fabrication substrate 610. As a result, a problem that light-emission efficiency is degraded can be avoided, and high-density integration of semiconductor light-emitting elements can be achieved. Further, since the element fabrication substrate 610 is removed, a series resistance value in a semiconductor light-emitting element can be minimized.

Example 7

An example 7 is a variant of the example 6. In the example 7, after a convex part is formed, before a light-emitting portion and a laminated structure are formed, an etching stopper layer is formed on the entire surface of an element fabrication substrate.

To be more specific, in a semiconductor light-emitting element fabrication method of the example 7, a step equivalent to step 600 in the example 6 is executed. At a step equivalent to step 610, the mask layer 661 is removed according to a wet etching method. Thereafter, an etching stopper layer 691 made of, for example, Al$_{0.3}$Ga$_{0.7}$ is formed on the entire surface of the element fabrication substrate.

Thereafter, the light-emitting portion 620 that has the first compound semiconductor layer 621 exhibiting the first conductivity type, the active layer 623, and the second compound semiconductor layer exhibiting the second conductivity type sequentially accumulated is formed on the top surface of the convex part 611 on the etching stopper layer 691. Concurrently, the laminated structure 620' that has the first compound semiconductor layer 621 exhibiting the first conductivity type, the active layer 623, and the second compound semiconductor layer exhibiting the second conductivity type sequentially accumulated is formed on the etching stopper layer 691 on part of the principal surface of the element fabrication substrate 610 (concave-part surface or bared surface) on which the convex part 611 is not formed.

Figure 20:
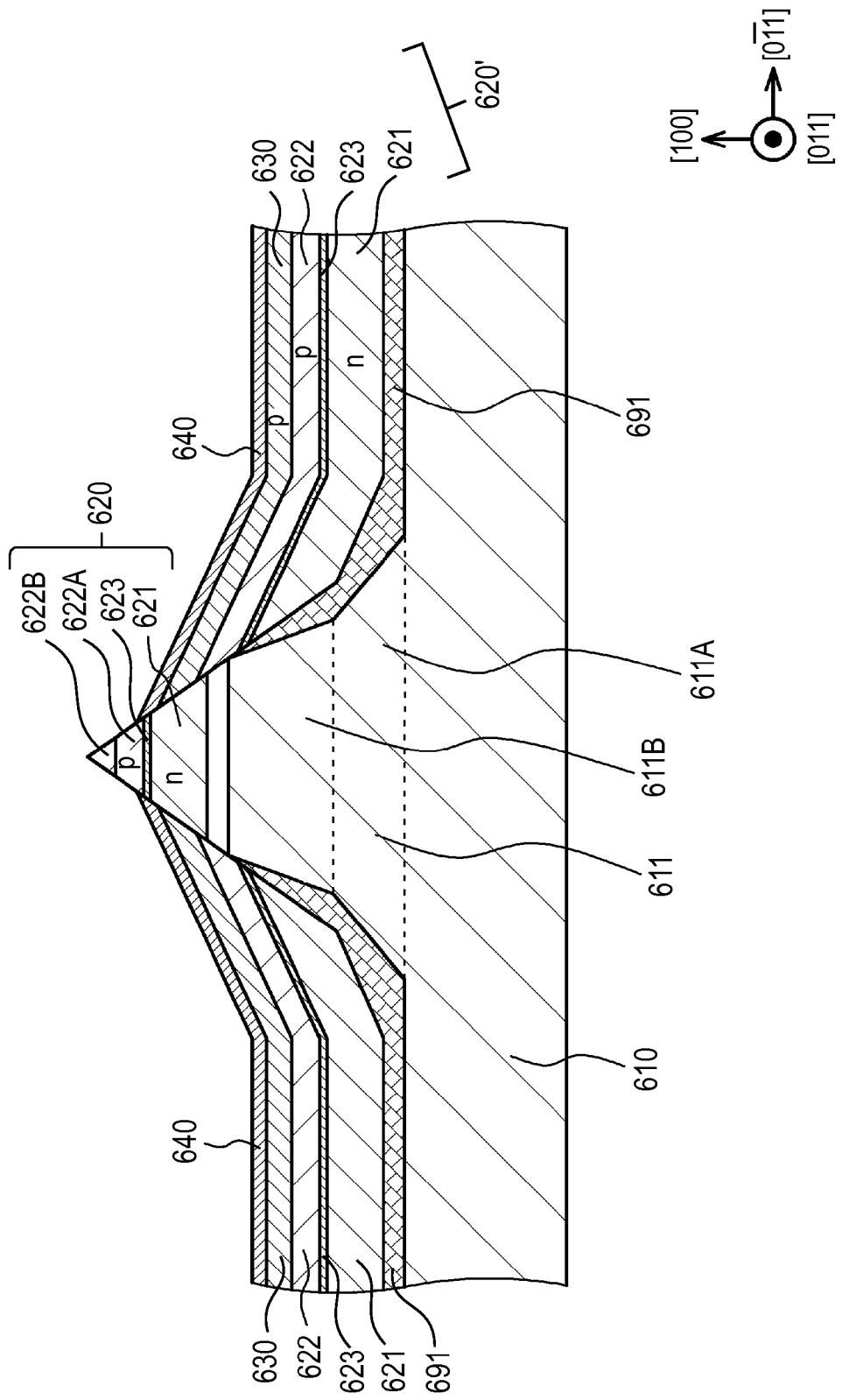
FIG. 20 is a partial sectional view illustratively showing an element fabrication substrate at the time of completion of the same step as step 620 in the example 6 in the process of fabrication of an SDH semiconductor laser that is a semiconductor light-emitting element in accordance with an example 7.
Figure 21A:
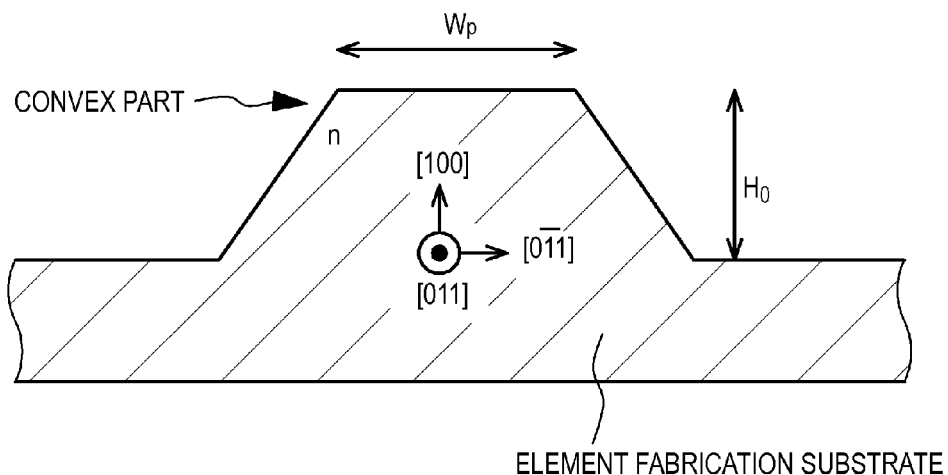
FIG. 21A and FIG. 21B are partial sectional views illustratively showing a light-emitting element fabrication substrate so as to explain a problem underlying a semiconductor light-emitting element in accordance with a related art.
Figure 21B:
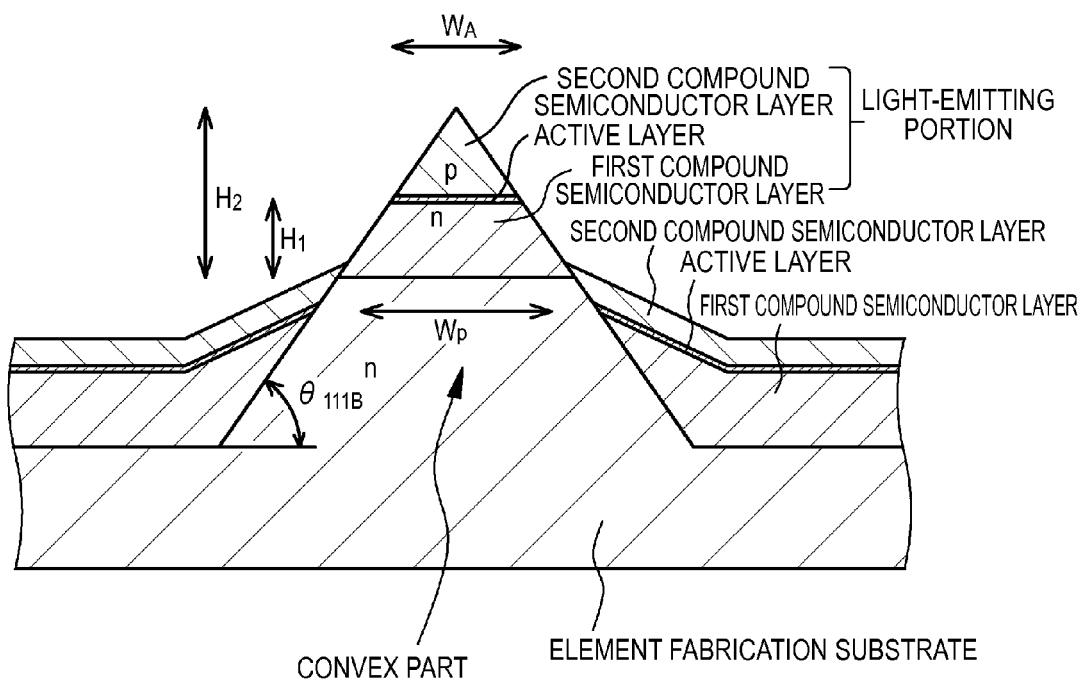
Figure 22A:
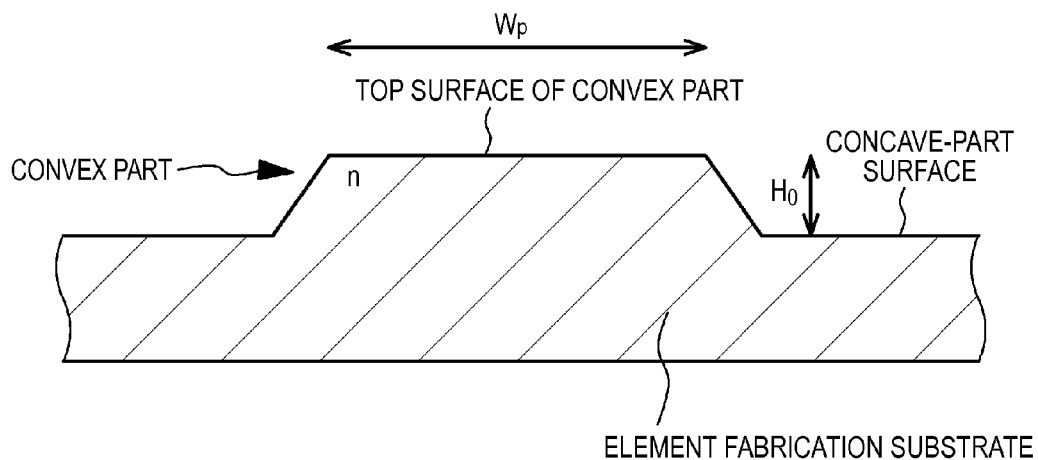
FIG. 22A and FIG. 22B are partial sectional views illustratively showing a light-emitting element fabrication substrate so as to explain another problem underlying the semiconductor light-emitting element in accordance with the related art.
Figure 22B:
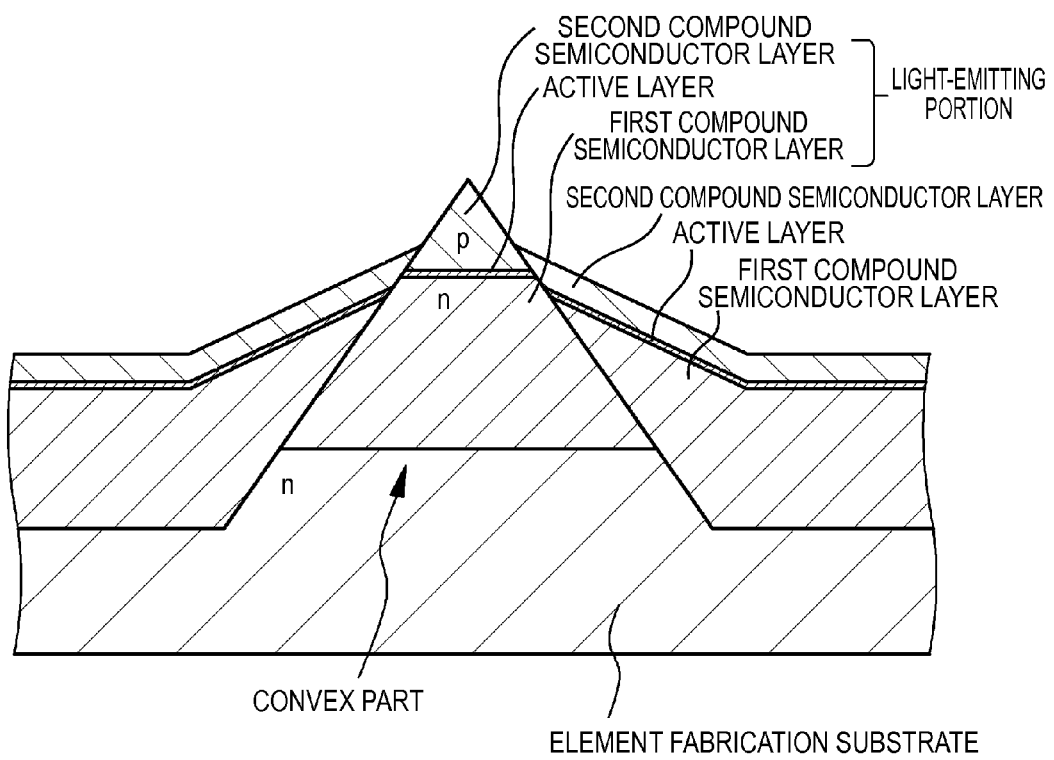
Figure 23A:
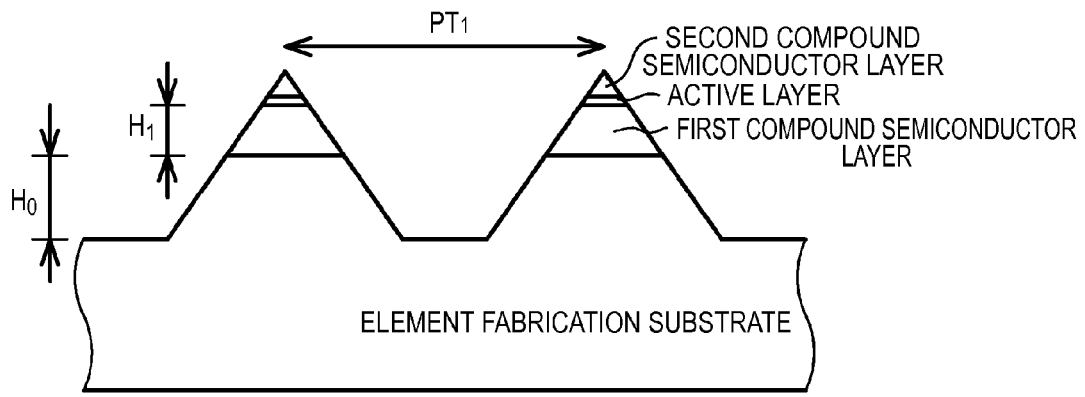
FIG. 23A to FIG. 23C are conceptual diagrams showing the light-emitting element fabrication substrate so as to present the problems underlying the semiconductor light-emitting element in accordance with the related art.
Figure 23B:
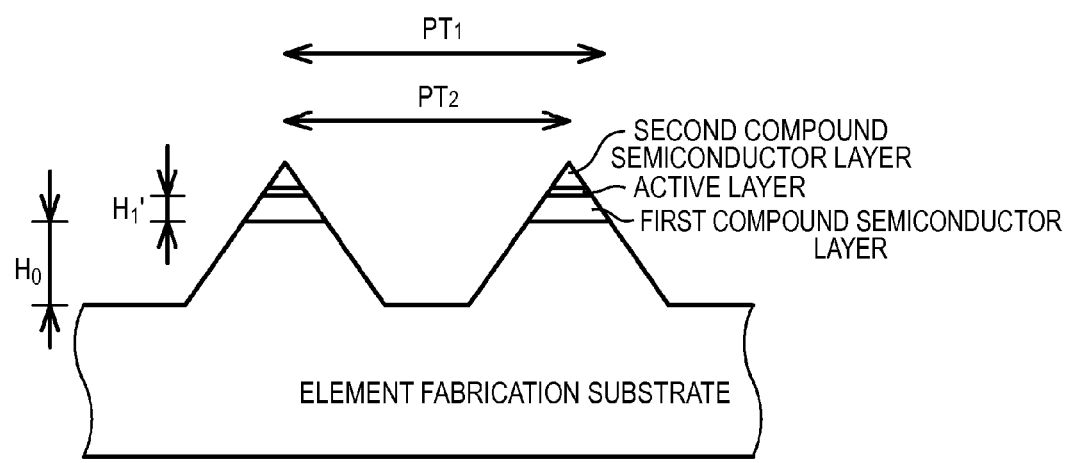
Figure 23C:
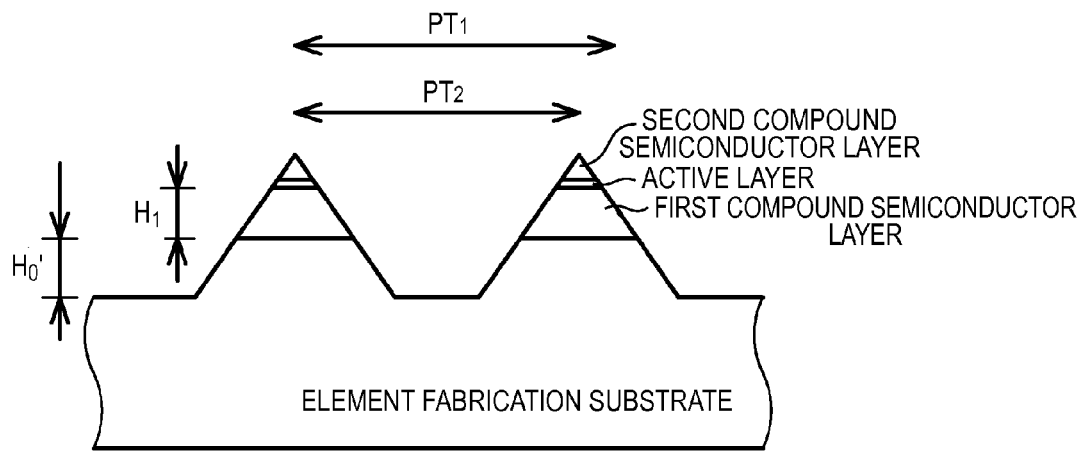

FIG. 20 is an illustrative partial sectional view showing the element fabrication substrate observed at the time when a step equivalent to step 620 in the example 6 is completed.

Figure 24:
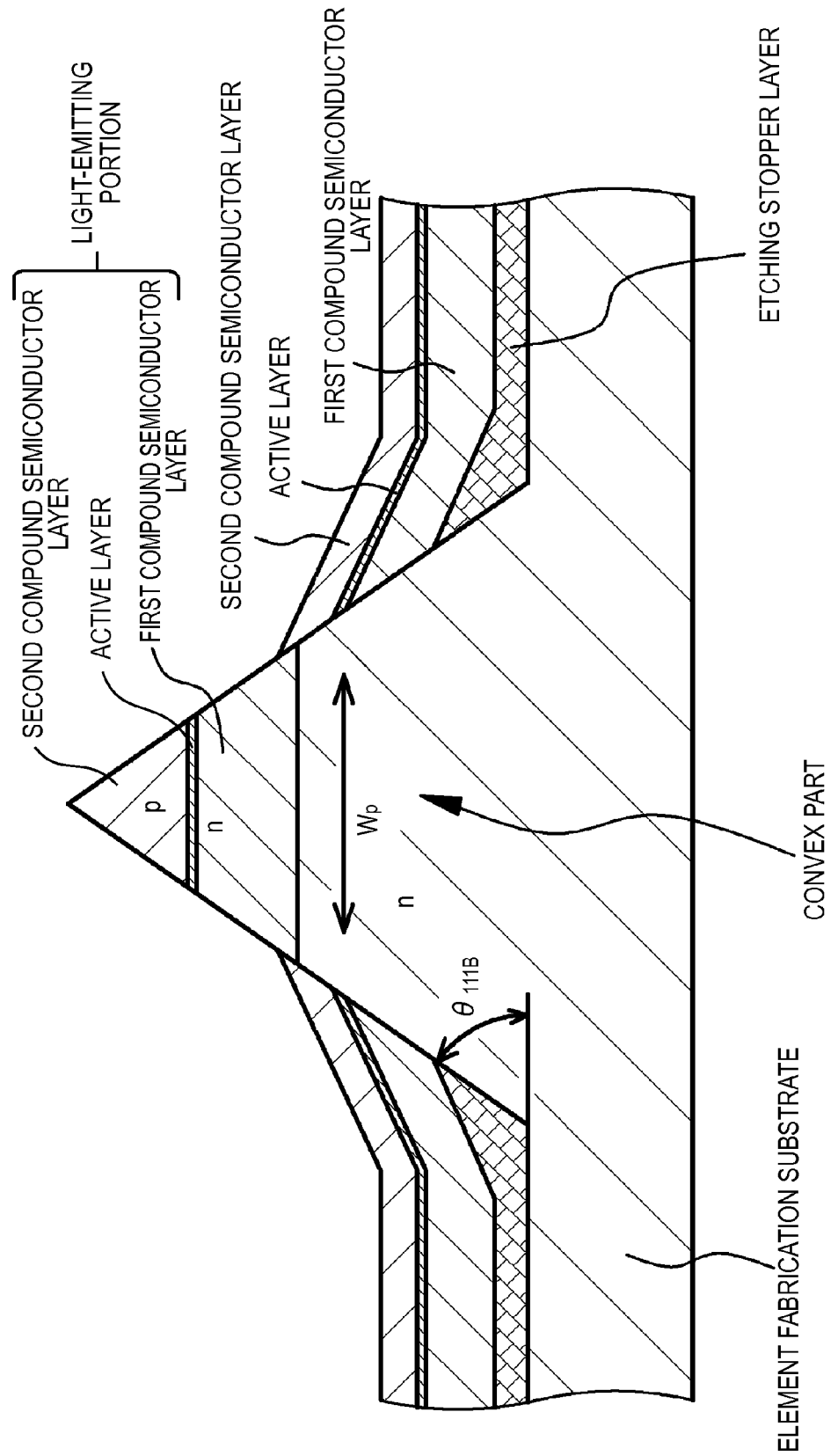
FIG. 24 is a partial sectional view illustratively showing an element fabrication substrate so as to explain a problem underlying a semiconductor light-emitting element fabrication method in accordance with the related art for a semiconductor light-emitting element including an etching stopper layer.

According to the related art, the side surface of the convex part is constructed with a {111} B face that is a non-growth face. Therefore, assuming that, for example, a compound semiconductor layer made of an As material represented by Al$_{0.3}$Ga$_{0.7}$ is adopted as the etching stopper layer, since the material does not crystallographically grow on the {111} B face, the two side surfaces of the convex part are partially not covered with the compound semiconductor layer. This means that the compound semiconductor layer does not fill the role of the etching stopper layer (see an illustrative partial sectional view of FIG. 24 showing the element fabrication substrate). In the example 7, as shown in FIG. 20, the side surfaces 611*a* and 611*b* of the convex part 611 are not constructed with the {111} B faces but are two stable etched surfaces of the convex-part upper layer 611B and convex-part lower layer 611A respectively. The side surfaces are not constructed with non-growth faces but are constructed with crystal growth faces. Therefore, the etching stopper layer 691 is formed even on the side surfaces 611*a* and 611*b* of the convex part 611. As a result, the two side surfaces of the convex part 611 are reliably shielded with the etching stopper layer 691.

Depending on the timing of switching crystal growth of the etching stopper layer 691 to crystal growth of the first compound semiconductor layer 621, the shape of the etching stopper layer 691 shielding the side surfaces of the convex part varies. In any case, the shape of the etching stopper layer 691 shielding the side surfaces 611*a* and 611*b* of the convex part 611 is, needless to say, determined at a step shown in FIG. 4A or FIG. 4B, or an intermediate step between the steps shown in FIG. 4A and FIG. 4B. When the active layer 621 contains Sb or Bi, if at least AlSb or AlBi is contained in a material to be made into the etching stopper layer, the capability of the etching stopper layer can be provided.

The present invention has been described in conjunction with the preferred examples. However, the present invention is not limited to the examples. The constructions or structures of the semiconductor light-emitting elements described as the examples, the materials to be made into the semiconductor light-emitting elements, the conditions for fabrication of the semiconductor light-emitting elements, and various numerical values are taken for instance and can be modified appropriately. In the examples, the first conductivity type refers to n-type conductivity, and the second conductivity type refers to p-type conductivity. In reverse, the first conductivity type may refer to p-type conductivity, and the second conductivity type may refer to n-type conductivity. A flare stripe structure may be adopted. In the examples 6 and 7, the element fabrication substrate is removed. Alternatively, part of the element fabrication substrate may be left intact, and the remaining part of the element fabrication substrate may be used as the contact layer. The first electrode may be formed on the remaining part of the element fabrication substrate.

The convex part formed on a backing according to the first or second embodiment of the present invention, and the convex part formation method according to the embodiment of the present invention may be adapted to a buried heterostructure laser and a fabrication method thereof, a surface-emission (laser) element and a fabrication method thereof, an LED and a fabrication method thereof, a heterojunction bipolar transistor and a fabrication method thereof, a photodiode and a fabrication method thereof, and a solar cell and a fabrication method thereof. Specifically, the convex part formation method in accordance with the present invention can be effectively adapted to formation of a concave part or a separation groove that separates elements. More specifically, when etching control relevant to a width, a depth, or a pitch is requested over a wide range on a wafer surface, the convex part formation method in accordance with the embodiment of the present invention can be effectively adapted. Any of the above kinds of elements is formed on a convex part formed on a backing according to the first or second embodiment of the present invention.

The present application contains subject matter related to that disclosed in Japanese Priority Patent Applications JP 2008-212683 and JP 2008-240629 filed in the Japan Patent Office on Aug. 21, 2008 and Sep. 19, 2008, respectively, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor light-emitting element fabrication method comprising the steps of:
   (A) forming a convex part, which extends in parallel with a <110> direction of an element fabrication substrate, on the principal surface of the element fabrication substrate having a (100) face as the principal surface thereof;
   (B) forming a light-emitting portion, which has a first compound semiconductor layer exhibiting a first conductivity type, an active layer, and a second compound semiconductor layer exhibiting a second conductivity type sequentially accumulated, on the top surface of the convex part, and concurrently forming a laminated structure, which has the first compound semiconductor layer exhibiting the first conductivity type, the active layer, and the second compound semiconductor layer exhibiting the second conductivity sequentially accumulated, on part of the principal surface of the element fabrication substrate on which the convex part is not formed; and
   (C) forming a current block layer, which shields at least the side surface of the active layer included in the light-emitting portion, on the laminated structure, wherein the step A includes the sub-steps of
   (a) forming a mask layer, which extends in parallel with the <110> direction, on the principal surface of the element fabrication substrate,
   (b) etching the principal surface of the element fabrication substrate according to a wet etching method, which employs an etching solution, using the mask layer as an etching mask so as to form a convex-part upper layer whose sectional shape on a cutting plane corresponding to a {110} face is an isosceles trapezoid, the base of which is longer than the upper side thereof, and the side surface of which has an inclination of $\theta_U$, and
   (c) further etching the principal surface of the element fabrication substrate according to the wet etching method at a different temperature of the etching solution and using the mask layer and the side surface of the convex-part upper layer as an etching mask so as to form a convex-part lower layer whose sectional shape on a cutting plane corresponding to the {110} face is an isosceles trapezoid, the base of which is longer than the upper side thereof, and the side surface of which has an inclination of $\theta_D$ (where $\theta_D \neq \theta_U$).

2. The semiconductor light-emitting element fabrication method according to claim 1, wherein:
   the base of the sectional shape of the convex-part upper layer cut on the {110} face corresponds to the upper side of the sectional shape of the convex-part lower layer cut on the {110} face; and
   assuming that $\theta_{111B}$ denotes the inclination of the flank of the convex part which is a (111) B face, $\theta_D \leq \theta_{111B} \leq \theta_U$ (where $\theta_D \neq \theta_U$) is satisfied.

3. The semiconductor light-emitting element fabrication method according to claim 2, wherein the temperature of the etching solution employed at the step (b) is higher than the temperature of the etching solution employed at the step (c).

4. The semiconductor light-emitting element fabrication method according to claim 1, wherein assuming that $H_U$ denotes the thickness of the convex-part upper layer and $H_D$ denotes the thickness of the convex-part lower layer, $H_U/(H_U+H_D) \geq 0.5$ is satisfied.

5. The semiconductor light-emitting element fabrication method according to claim 1, wherein assuming that $H_U$ denotes the thickness of the convex-part upper layer, $H_D$ denotes the thickness of the convex-part lower layer, and $W_U$ denotes the width of the convex-part upper layer, $(H_U+H_D)/W_U \geq 0.4$ is satisfied.

6. A semiconductor light-emitting element fabrication method for a semiconductor light-emitting element, which includes a light-emitting portion formed with a first compound semiconductor layer, an active layer, and a second compound semiconductor layer whose top surface is a {100} face, comprising a step of forming a convex part, which extends in parallel with a <110> direction, on part of the second compound semiconductor layer in a thickness direction thereof, wherein a convex part formation step includes the sub-steps of:
   (a) forming a mask layer, which extends in parallel with the <110> direction, on the top surface of the second compound semiconductor layer;
   (b) etching part of the second compound semiconductor layer in the thickness direction thereof according to a wet etching method, which employs an etching solution, using the mask layer as an etching mask so as to form a convex-part upper layer whose sectional shape on a cutting plane corresponding to a {110} face is an isosceles trapezoid, the base of which is longer than the upper side thereof, and the side surface of which has an inclination of $\theta_U$; and
   (c) etching part of the second compound semiconductor layer in the thickness direction thereof according to the wet etching method at a different temperature of the etching solution and using the mask layer and the side surface of the convex-part upper layer as an etching mask so as to form a convex-part lower layer whose sectional shape on the cutting plane corresponding to the {110} face is an isosceles trapezoid, the base of which is longer than the upper side thereof, and the side surface of which has an inclination of $\theta_D$ (where $\theta_D \neq \theta_U$).

7. The semiconductor light-emitting element fabrication method according to claim 6, wherein:
   the base of the sectional shape of the convex-part upper layer cut on the {110} face corresponds to the upper side of the sectional shape of the convex-part lower layer cut on the {110} face; and
   assuming that $\theta_{111B}$ denotes the inclination of the flank of the convex part which is a (111) B face, $\theta_D \leq \theta_{111B} \leq \theta_U$ (where $\theta_D \neq \theta_U$) is satisfied.

8. The semiconductor light-emitting element fabrication method according to claim 7, wherein the temperature of the etching solution employed at the step (b) is higher than the temperature of the etching solution employed at the step (c).

9. The semiconductor light-emitting element fabrication method according to claim 6, wherein:
the base of the sectional shape of the convex-part upper layer cut on the {110} face corresponds to the upper side of the sectional shape of the convex-part lower layer cut on the {110} face; and
assuming that $\theta_{111B}$ denotes the inclination of the flank of the convex part which is a (111) B face, $\theta_U \leq \theta_{111B} \leq \theta_D$ (where $\theta_D \neq \theta_U$) is satisfied.

10. The semiconductor light-emitting element fabrication method according to claim 9, wherein the temperature of the etching solution employed at the step (b) is higher than the temperature of the etching solution employed at the step (c).

11. A semiconductor light-emitting element fabrication method comprising the steps of:
(A) forming a convex part, which extends in parallel with a <110> direction of an element fabrication substrate, on the principal surface of the element fabrication substrate having a {100} face as the principal surface thereof;
(B) forming a light-emitting portion, which has a first compound semiconductor layer exhibiting a first conductivity type, an active layer, and a second compound semiconductor layer exhibiting a second conductivity type sequentially accumulated, on the top surface of the convex part, and concurrently forming a laminated structure, which has the first compound semiconductor layer exhibiting the first conductivity type, the active layer, and the second compound semiconductor layer exhibiting the second conductivity type sequentially accumulated, on part of the principal surface of the element fabrication substrate on which the convex part is not formed;
(C) forming a current block layer, which shields at least the side surface of the active layer included in the light-emitting portion, on the laminated structure;
(D) forming a contact layer on the entire surface of the current block layer, and forming a second electrode on the contact layer;
(E) bonding the element fabrication substrate to a supporting substrate with the second electrode between them, and removing the element fabrication substrate; and
(F) forming a first electrode electrically connected to the first compound semiconductor layer, wherein the step (A) includes the sub-steps of
(a) forming a mask layer, which extends in parallel with the <110> direction, on the principal surface of the element fabrication substrate,
(b) etching the principal surface of the element fabrication substrate according to a wet etching method, which employs an etching solution, using the mask layer as an etching mask so as to form a convex-part upper layer whose sectional shape on a cutting plane corresponding to a {110} face is an isosceles trapezoid, the base of which is longer than the upper side thereof, and the side surface of which has an inclination of $\theta_U$, and
(c) further etching the principal surface of the element fabrication substrate according to the wet etching method at a different temperature of the etching solution and using the mask layer and the side surface of the convex-part upper layer as an etching mask so as to form a convex-part lower layer whose sectional shape on the cutting plane corresponding to the {110} face is an isosceles trapezoid, the base of which is longer than the upper side thereof, and the side surface of which has an inclination of $\theta_D$ (where $\theta_D \neq \theta_U$).

12. The semiconductor light-emitting element fabrication method according to claim 11, wherein:
the base of the sectional shape of the convex-part upper layer cut on the {110} face corresponds to the upper side of the sectional shape of the convex-part lower layer cut on the {110} face; and
assuming that $\theta_{111B}$ denotes the inclination of the flank of the convex part which is a (111) B face, $\theta_D \leq \theta_{111B} \leq \theta_U$ (where $\theta_D \neq \theta_U$) is satisfied.

13. The semiconductor light-emitting element fabrication method according to claim 11, wherein assuming that $H_U$ denotes the thickness of the convex-part upper layer and $H_D$ denotes the thickness of the convex-part lower layer, $H_U/(H_U+H_D) \geq 0.5$ is satisfied.

14. The semiconductor light-emitting element fabrication method according to claim 11, wherein assuming that $H_U$ denotes the thickness of the convex-part upper layer, $H_D$ denotes the thickness of the convex-part lower layer, and $W_U$ denotes the width of the convex-part upper layer, $(H_U+H_D)/W_U \geq 0.4$ is satisfied.

15. The semiconductor light-emitting element fabrication method according to claim 11, wherein an etching stopper layer is formed on the entire surface of the element fabrication substrate at a step succeeding the step (A).

* * * * *